US012419123B2

(12) United States Patent
Tang et al.

(10) Patent No.: US 12,419,123 B2
(45) Date of Patent: Sep. 16, 2025

(54) IMAGE SENSOR, CAMERA ASSEMBLY, AND MOBILE TERMINAL

(71) Applicant: GUANGDONG OPPO MOBILE TELECOMMUNICATIONS CORP., LTD., Dongguan (CN)

(72) Inventors: Cheng Tang, Dongguan (CN); Gong Zhang, Dongguan (CN); Haiyu Zhang, Dongguan (CN); Xin Yang, Dongguan (CN); Rui Xu, Dongguan (CN); He Lan, Dongguan (CN); Jianbo Sun, Dongguan (CN); Xiaotao Li, Dongguan (CN); Wentao Wang, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 491 days.

(21) Appl. No.: 17/575,298

(22) Filed: Jan. 13, 2022

(65) Prior Publication Data

US 2022/0139981 A1    May 5, 2022

Related U.S. Application Data

(63) Continuation of application No. PCT/CN2019/109516, filed on Sep. 30, 2019.

(51) Int. Cl.
*H10F 39/00* (2025.01)
*H04N 23/10* (2023.01)
(Continued)

(52) U.S. Cl.
CPC ......... *H10F 39/8053* (2025.01); *H04N 23/10* (2023.01); *H04N 25/58* (2023.01);
(Continued)

(58) Field of Classification Search
CPC ............... H10F 39/8053; H10F 39/182; H10F 39/8063; H10F 39/807; H10F 39/806;
(Continued)

(56) References Cited

U.S. PATENT DOCUMENTS 6,714,243 B1    3/2004 Mathur et al.
8,866,944 B2   10/2014 Tu et al.
(Continued)

FOREIGN PATENT DOCUMENTS

CN    1574377 A     2/2005
CN    101068313 A   11/2007
(Continued)

OTHER PUBLICATIONS

Extended European Search Report dated Sep. 2, 2022 received in European Patent Application No. EP19948034.4.
(Continued)

*Primary Examiner* — Jonathan Han
(74) *Attorney, Agent, or Firm* — Sheppard, Mullin, Richter &Hampton LLP

(57) ABSTRACT

Provided are an image sensor (10), a camera assembly (40), and a mobile terminal (90). The image sensor (10) includes panchromatic pixels and color pixels. The color pixels have a narrower spectral response than the panchromatic pixels, and the color pixels have a larger conversion gain than the panchromatic pixels.

20 Claims, 31 Drawing Sheets

(51) Int. Cl.
*H04N 25/58* (2023.01)
*H04N 25/71* (2023.01)
*H04N 25/75* (2023.01)
*H04N 25/771* (2023.01)
*H10F 39/18* (2025.01)

(52) U.S. Cl.
CPC ............ *H04N 25/71* (2023.01); *H04N 25/75* (2023.01); *H04N 25/771* (2023.01); *H10F 39/182* (2025.01); *H10F 39/8063* (2025.01)

(58) Field of Classification Search
CPC ........ H04N 23/10; H04N 25/58; H04N 25/71; H04N 25/75; H04N 25/771; H04N 25/133; H04N 25/534; H04N 25/585; H04N 25/59
See application file for complete search history.

(56) References Cited

U.S. PATENT DOCUMENTS

| | | | |
|---|---|---|---|
| 8,994,870 | B2 | 3/2015 | Imamura |
| 9,219,893 | B2 | 12/2015 | Tu et al. |
| 2003/0168679 | A1 | 9/2003 | Nakai et al. |
| 2007/0024879 | A1 | 2/2007 | Hamilton, Jr. et al. |
| 2007/0076269 | A1 | 4/2007 | Kido et al. |
| 2008/0128598 | A1 | 6/2008 | Kanai et al. |
| 2009/0021629 | A1 | 1/2009 | Yamada |
| 2009/0195681 | A1* | 8/2009 | Compton ............ H04N 25/766 348/308 |
| 2009/0295973 | A1 | 12/2009 | Oshikubo et al. |
| 2010/0033611 | A1 | 2/2010 | Lee et al. |
| 2010/0265370 | A1 | 10/2010 | Kumar et al. |
| 2011/0063467 | A1 | 3/2011 | Tanaka |
| 2011/0102651 | A1 | 5/2011 | Tay |
| 2011/0242350 | A1 | 10/2011 | Sawayama et al. |
| 2011/0285886 | A1 | 11/2011 | Kato et al. |
| 2012/0200728 | A1 | 8/2012 | Kobayashi et al. |
| 2012/0307104 | A1* | 12/2012 | Kanai .................. H04N 25/135 348/E9.002 |
| 2014/0063300 | A1 | 3/2014 | Lin et al. |
| 2014/0084135 | A1 | 3/2014 | Chen et al. |
| 2015/0041939 | A1 | 2/2015 | Kim |
| 2015/0054997 | A1 | 2/2015 | Hynecek |
| 2015/0350582 | A1 | 12/2015 | Korobov et al. |
| 2016/0071896 | A1 | 3/2016 | Kawabata et al. |
| 2016/0073065 | A1 | 3/2016 | Lee et al. |
| 2016/0080706 | A1* | 3/2016 | Kaiser .................... H04N 23/11 348/280 |
| 2016/0086990 | A1 | 3/2016 | Liu et al. |
| 2016/0198131 | A1 | 7/2016 | Wang et al. |
| 2016/0276394 | A1 | 9/2016 | Chou et al. |
| 2018/0006078 | A1 | 1/2018 | Fereyre et al. |
| 2018/0269245 | A1 | 9/2018 | Mlinar et al. |
| 2018/0269249 | A1 | 9/2018 | Tsai et al. |
| 2018/0367745 | A1 | 12/2018 | Sugiyama |
| 2019/0041559 | A1 | 2/2019 | Higashitani et al. |
| 2021/0074758 | A1 | 3/2021 | Takahashi et al. |
| 2021/0235027 | A1 | 7/2021 | Meynants |
| 2022/0130882 | A1 | 4/2022 | Tang et al. |
| 2022/0139974 | A1 | 5/2022 | Tang et al. |
| 2022/0139981 | A1 | 5/2022 | Tang et al. |
| 2022/0336508 | A1 | 10/2022 | Tang et al. |

FOREIGN PATENT DOCUMENTS

| | | |
|---|---|---|
| CN | 101233762 A | 7/2008 |
| CN | 101233763 A | 7/2008 |
| CN | 101248659 A | 8/2008 |
| CN | 101753863 A | 6/2010 |
| CN | 102593138 A | 7/2012 |
| CN | 103137638 A | 6/2013 |
| CN | 103403869 A | 11/2013 |
| CN | 104135633 A | 11/2014 |
| CN | 105027558 A | 11/2015 |
| CN | 105990384 A | 10/2016 |
| CN | 107706200 A | 2/2018 |
| CN | 108091665 A | 5/2018 |
| CN | 108398847 A | 8/2018 |
| CN | 109003995 A | 12/2018 |
| CN | 109087926 A | 12/2018 |
| CN | 109661727 A | 4/2019 |
| CN | 109728008 A | 5/2019 |
| CN | 209183547 U | 7/2019 |
| CN | 110190075 A | 8/2019 |
| CN | 110649056 A | 1/2020 |
| CN | 110649057 A | 1/2020 |
| EP | 2375448 A2 | 10/2011 |
| JP | 2009081169 A | 4/2009 |
| JP | 2011155306 A | 8/2011 |
| KR | 20040060508 A | 7/2004 |

OTHER PUBLICATIONS

Communication pursuant to Article 94(3) EPC for European application 19948034.4 mailed May 2, 2024.
Notice of Allowance for U.S. Appl. No. 17/696,774 mailed May 2, 2024.
Corrected Notice of Allowability for U.S. Appl. No. 17/696,774 mailed May 22, 2024.
Non-Final Rejection for U.S. Appl. No. 17/573,561 mailed Jun. 24, 2024.
Extended European Search Report for European Patent Application No. 20871224.0 mailed on Sep. 2, 2022.
Extended European Search Report for European Patent Application No. EP19947867.8 mailed on May 13, 2022.
Communication pursuant to Article 94(3) EPC for European application 19947867.8 mailed Jul. 25, 2023.
The First Office Action from corresponding Chinese Application No. 201910941638.8 dated Oct. 28, 2020.
The Grant Notice from corresponding Chinese Application No. 201910941638.8, dated Nov. 25, 2020.
International Search Report and Written Opinion for International Application No. PCT/CN2020/114483 mailed on Dec. 14, 2020.
International Search Report and Written Opinion for International Application No. PCT/CN2019/109517 mailed on Jun. 30, 2020.
Partial supplementary European search report for European Patent Application No. EP19948199.5 mailed on Aug. 22, 2022.
Extended European Search Report for European Patent Application No. EP19948199.5 mailed on Jan. 30, 2023.
Communication pursuant to Article 94(3) EPC for European application No. EP19948199.5 mailed Jan. 29, 2024.
International Search Report and Written Opinion for International Application No. PCT/CN2019/109518 mailed on Jun. 30, 2020.
Communication pursuant to Article 94(3) EPC for European application 20871224.0 mailed Apr. 22, 2024.
Non-Final Rejection for U.S. Appl. No. 17/696,774 mailed Dec. 13, 2023.
Non-Final Rejection for U.S. Appl. No. 17/572,948 mailed Aug. 8, 2024.
Corrected Notice of Allowability for U.S. Appl. No. 17/696,774 mailed Oct. 4, 2024.
International Search Report and Written Opinion dated Jun. 30, 2020 in International Application No. PCT/CN2019/109516. English translation attached.
Partial supplementary European search report dated Apr. 25, 2022 received in European Patent Application No. EP 19948034.4.
EPO, Communication pursuant to Article 94(3) EPC for EP Application No. 19948199.5 mailed on Dec. 4, 2024.
USPTO, Final Rejection for U.S. Appl. No. 17/573,561 mailed on Nov. 20, 2024.
CNIPA, First Office Action for CN Application No. 201980097816.1 mailed on May 9, 2025.
CNIPA, First Office Action for CN Application No. 201980097805.3 mailed on May 9, 2025.

(56) References Cited

OTHER PUBLICATIONS

CNIPA, First Office Action for CN Application No. 201980097818.0 mailed on Jul. 11, 2025.

\* cited by examiner

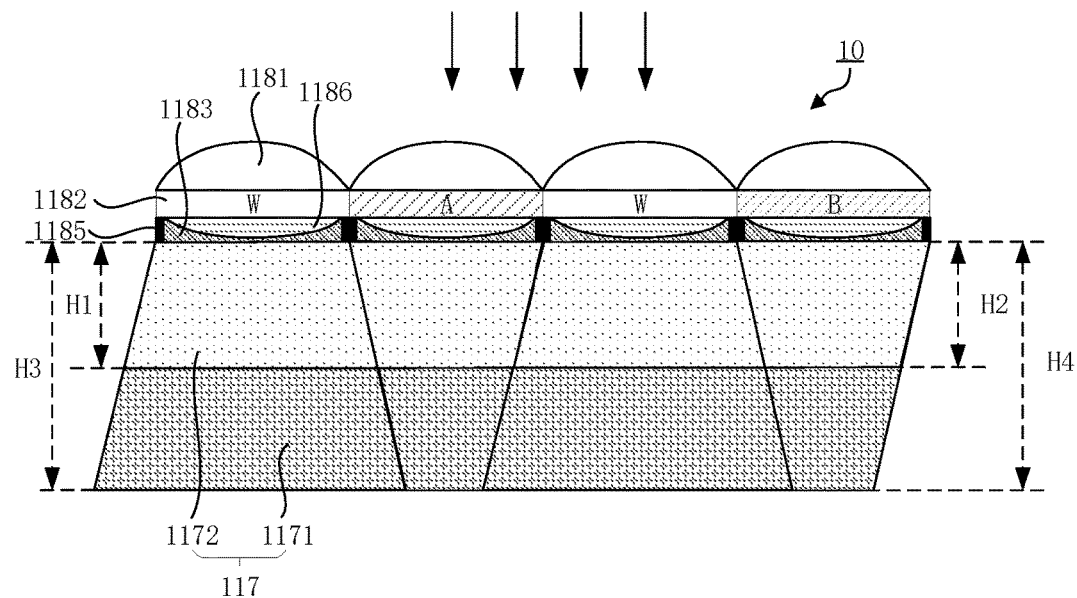
FIG. 11A
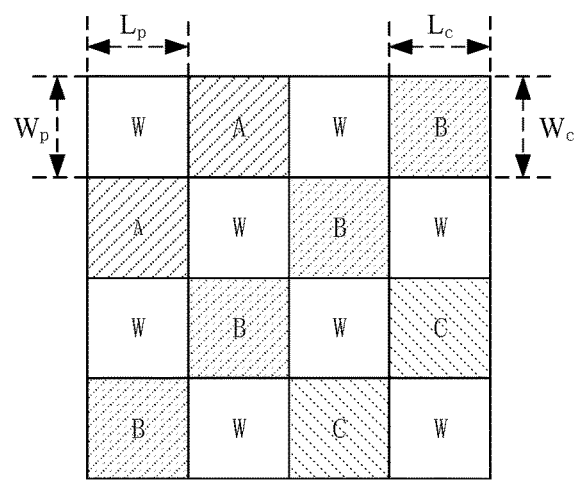 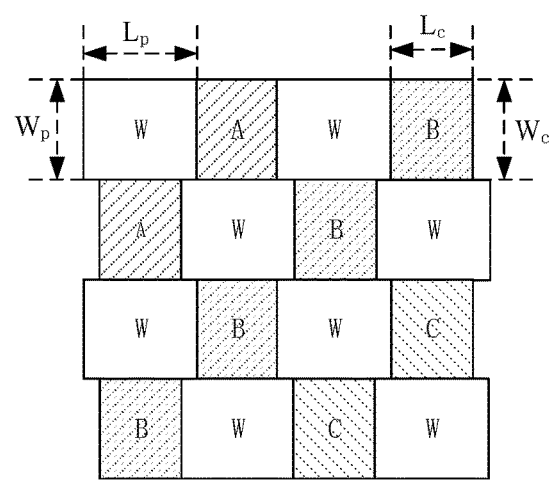
FIG. 11B FIG. 11C

IMAGE SENSOR, CAMERA ASSEMBLY, AND MOBILE TERMINAL

CROSS-REFERENCE TO RELATED APPLICATIONS

This application is a continuation of International Application No. PCT/CN2019/109516, filed on Sep. 30, 2019, the disclosures of which is hereby incorporated by reference in its entirety.

FIELD

The present disclosure relates to the field of image technologies, and more particularly, to an image sensor, a camera assembly, and a mobile terminal.

BACKGROUND

A mobile terminal such as a mobile phone is often equipped with a camera to take pictures. An image sensor is provided in the camera. For capturing a color image, color pixels are usually provided in the image sensor and arranged in a form of a Bayer array. To improve imaging quality of the image sensor in dark environments, the image sensor known in related art is further provided with white pixels having higher sensitivity than the color pixels.

SUMMARY

The present disclosure provides an image sensor, a camera assembly, and a mobile terminal.

In an aspect of the present disclosure, an image sensor is provided. The image sensor includes panchromatic pixels and color pixels. The color pixels have a narrower spectral response and a greater conversion gain than the panchromatic pixels.

In another aspect, the present disclosure provides a camera assembly. The camera assembly includes an image sensor. The image sensor includes panchromatic pixels and color pixels. The color pixels have a narrower spectral response and a greater conversion gain than the panchromatic pixels.

In another respect, the present disclosure provides a mobile terminal. The mobile terminal includes a housing and an image sensor mounted in the housing. The image sensor includes panchromatic pixels and color pixels. The color pixels have a narrower spectral response and a greater conversion gain than the panchromatic pixels.

Additional aspects and benefits of the embodiments of the present disclosure will be partly given in the following description, partly become apparent from the following description, or be learned through the practice of the present disclosure.

BRIEF DESCRIPTION OF DRAWINGS

The above and/or additional aspects and advantages of the present disclosure can become apparent and understandable from the description of embodiments in conjunction with the following drawings:

FIG. 11A is a partial sectional view of a pixel array according to yet another embodiment of the present disclosure.

FIG. 11B is a schematic diagram illustrating an arrangement of filters in the pixel array of FIG. 11A.

FIG. 11C is a schematic diagram illustrating an arrangement of photoelectric conversion elements in the pixel array of FIG. 11A.

DESCRIPTION OF EMBODIMENTS

Figure 1:
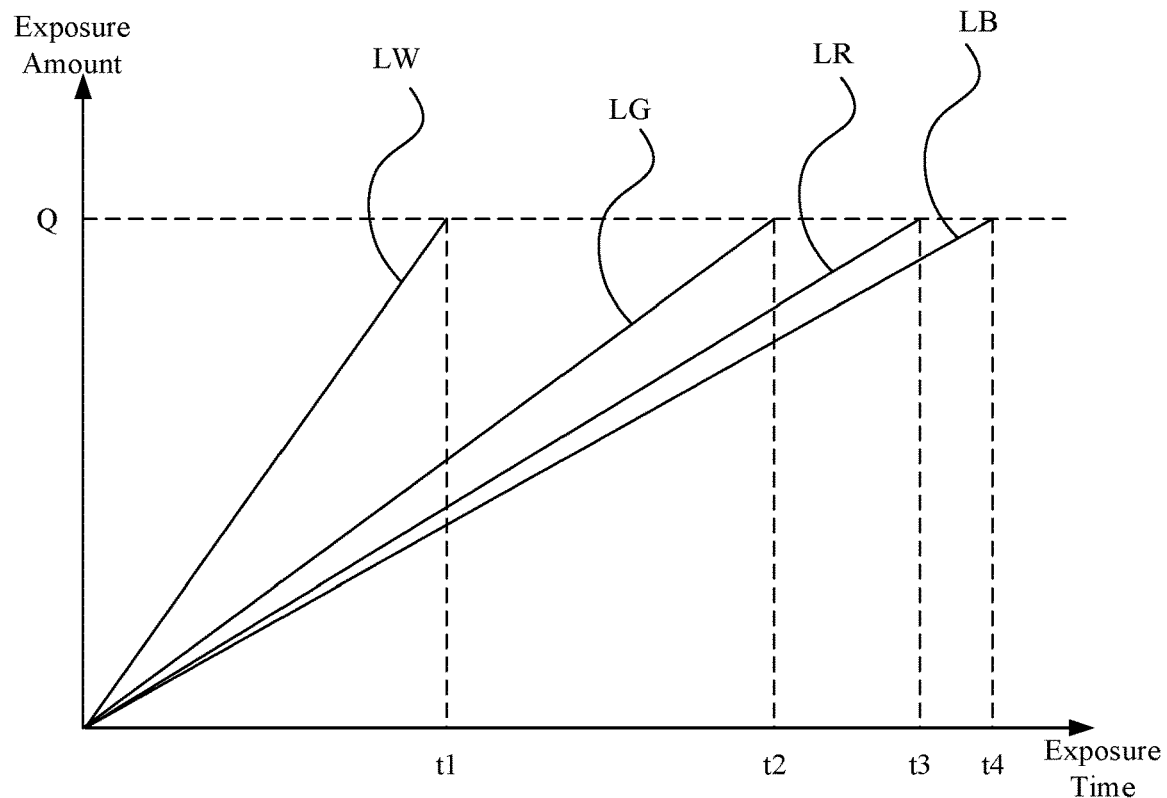
FIG. 1 is a schematic diagram of exposure saturation time of different color channels.

Embodiments of the present disclosure are described in detail below and the embodiments are illustrated in the drawings, throughout which the same or similar numerals represent the same or similar elements or elements with the same or similar functions. The embodiments described below with reference to the drawings are exemplary and are intended to explain the present disclosure only, but are not construed as limitations on the present disclosure.

Figure 4A:
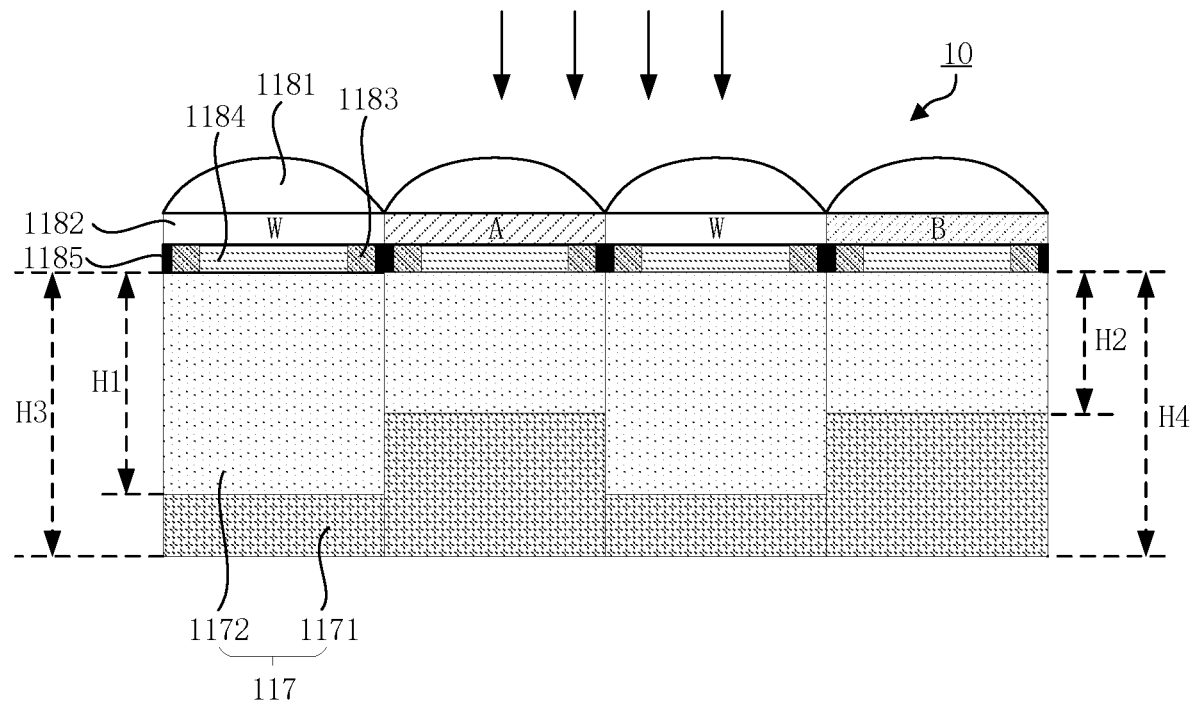
FIG. 4A is a partial sectional view of a pixel array in an embodiment of the present disclosure.

Referring to FIG. 4A, the present disclosure provides an image sensor 10 including panchromatic pixels and color pixels. The color pixels have a narrower spectral response and a greater conversion gain (CG) than the panchromatic pixels.

Figure 33:
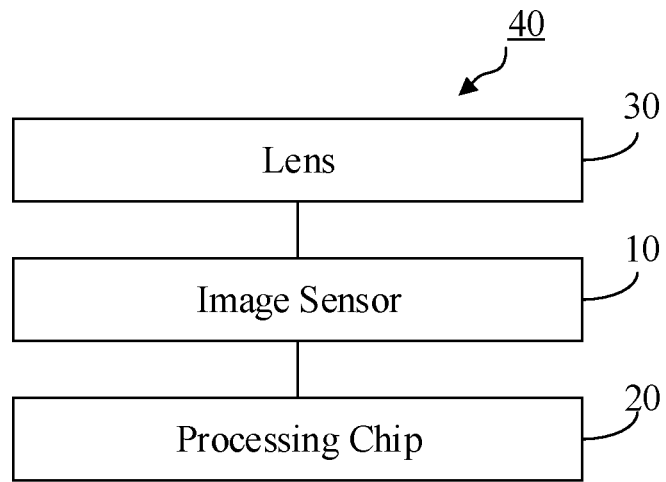
FIG. 33 is a schematic diagram of a camera assembly in an embodiment of the present disclosure.

Referring to FIG. 4A and FIG. 33, the present disclosure provides a camera assembly 40. The camera assembly 40 includes a lens 30 and an image sensor 10. The image sensor 10 receives light transmitting through the lens 30 to obtain an original image. The image sensor 10 includes panchromatic pixels and color pixels. The color pixels have a narrower spectral response and a greater conversion gain than the panchromatic pixels.

Figure 47:
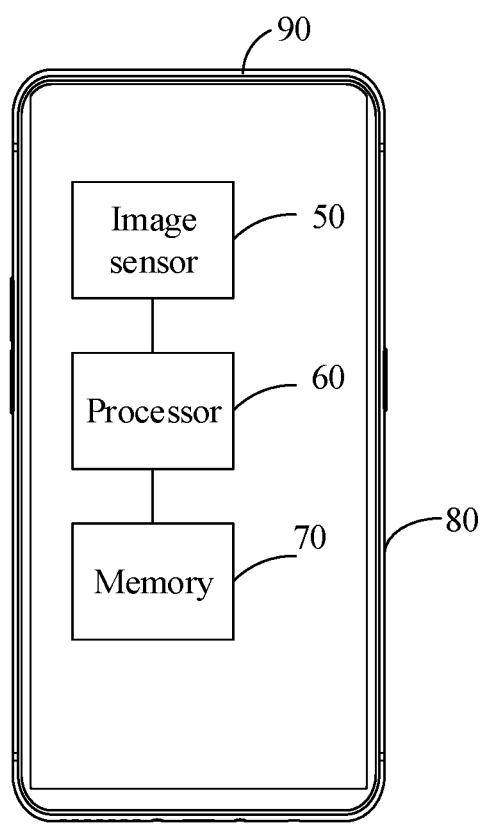
FIG. 47 is a schematic diagram of a mobile terminal in an embodiment of the present disclosure.

Please referring to FIG. 4A and FIG. 47, the present disclosure provides a mobile terminal 90. The mobile terminal 90 includes a housing 80 and an image sensor 50. The image sensor 50 is mounted in the housing 80. The image sensor 50 includes panchromatic pixels and color pixels. The color pixels have a narrower spectral response and a greater conversion gain than the panchromatic pixels.

The embodiments of the present disclosure are further explained in conjunction with the drawings below.

In a color image sensor, pixels of different colors receive different exposure amounts per unit time, and the pixels of a certain color may have not yet been exposed to a desired state when the pixels some colors are saturated. For example, a relatively good signal-to-noise ratio and a relatively good accuracy may be achieved at 60% to 90% of the saturated exposure amount, which is not limited in the embodiments of the present disclosure.

As an example, four types of red, green, blue, and panchromatic pixels (RGBW) are explained with reference to FIG. 1. In FIG. 1, the abscissa axis indicates an exposure time, the vertical axis indicates an exposure amount, Q is a saturated exposure amount, LW is an exposure curve of the panchromatic pixel W, LG is an exposure curve of the green pixel G, LR is an exposure curve of the red pixel R, and LB is an exposure curve of the blue pixel.

In view of FIG. 1, a slope of the exposure curve LW of the panchromatic pixel W is the greatest, i.e., the panchromatic pixel W can obtain more exposure amount in unit time, and the panchromatic pixel W reaches the saturated exposure amount at t1; a slope of the exposure curve LG of the green pixel G takes second place and the green pixel reaches the saturated exposure amount at t2; a slope of the exposure curve LR of the red pixel R takes third place and the red pixel R reaches the saturated exposure amount at t3; and a slope of the exposure curve LB of the blue pixel B take fourth place and the blue pixel reaches the saturated exposure amount at t4. At t1, the panchromatic pixel W reaches the saturated exposure amount, while the R, G, and B pixels have not yet exposed to reach their desired states.

In related art, the exposure time of the four pixels RGBW are controlled together. For example, the pixels in each row have the same exposure times and are connected to and controlled by the same exposure control line. For example, further referring to FIG. 1, in a time period from 0 to t1, the four pixels RGBW can normally operate; but in this time period, the relatively short exposure time and relatively small exposure amount of the pixels RGB result in phenomena such as a relatively low brightness, a relatively low signal-to-noise ratio or unvivid color when an imaged is displayed. In the period from t1 to t4, the W pixel, due to saturation, is overexposed and cannot operate normally, and data involving the exposure amount can no longer truly reflect a target.

For the above reasons, in an aspect, the present disclosure provides an image sensor, in which a conversion gain of the color pixel is increased to be greater than a conversion gain of the panchromatic pixel, overcoming the problem of the excessively small exposure amount of the color pixel when the panchromatic pixel reaches the saturated exposure, and balancing the exposures of the panchromatic pixel W and the color pixels (including, but not limited to, RGB). In this way, the quality of the captured image can be improved.

It should be noted that the exposure curves in FIG. 1 are only illustrative, the slopes and relative relations of the curves may vary depending on different response bands of pixels, and they are not limited in the present disclosure. For example, when the response band of the red pixel R is relatively narrower, the slope of the exposure curve of the red pixel R may be smaller than the slope of the exposure curve of the blue pixel B.

Figure 2:
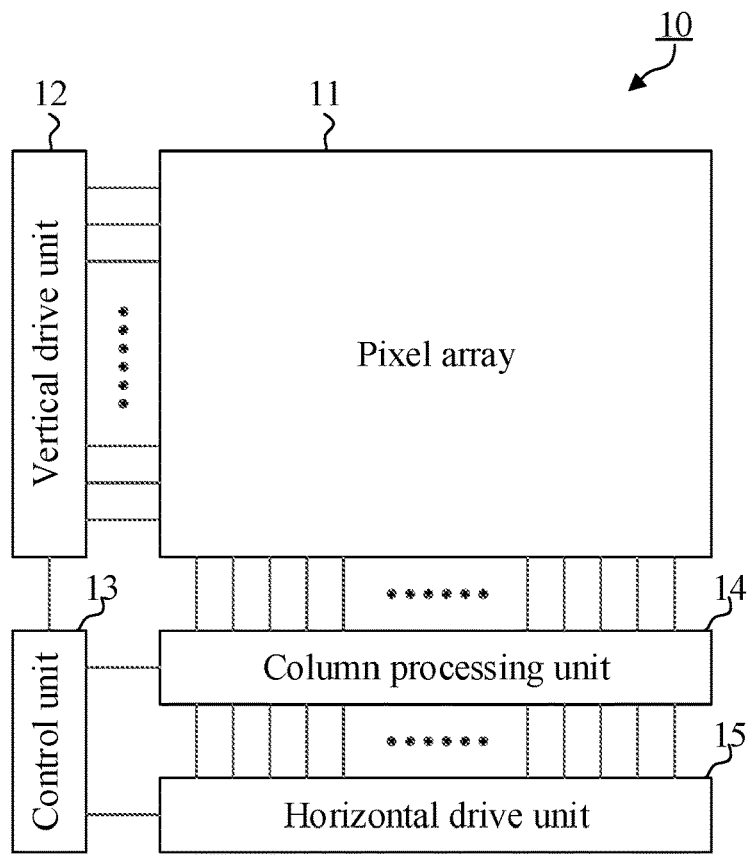
FIG. 2 is a schematic diagram of an image sensor in an embodiment of the present disclosure.

A basic structure of an image sensor 10 is described below. FIG. 2 is a schematic diagram of an image sensor 10 in an embodiment of the present disclosure. Referring to FIG. 2, the image sensor 10 includes a pixel array 11, a vertical drive unit 12, a control unit 13, a column processing unit 14, and a horizontal drive unit 15.

For example, the image sensor 10 can adopt a complementary metal oxide semiconductor (CMOS) photosensitive element or a charge-coupled device (CCD) photosensitive element.

Figure 3A:
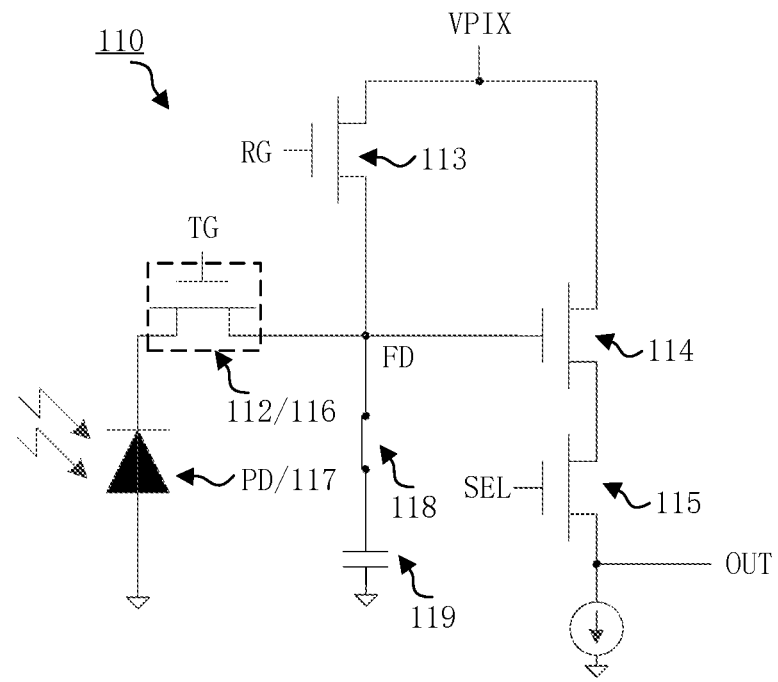
FIG. 3A is a schematic diagram of an operating mode of a pixel circuit in an embodiment of the present disclosure.

For example, the pixel array 11 includes a plurality of pixels arranged in a two-dimensional array (not illustrated in FIG. 2). Each pixel includes a photoelectric conversion element 117 (as illustrated in FIG. 3A). Each pixel converts light into an electric charge based on an intensity of the light incident on the pixel.

For example, the vertical drive unit 12 includes a shift register and an address decoder. The vertical drive unit 12 has the functions of read-out scan and reset scan. The read-out scan refers to sequentially scanning unit pixel row by row and reading a signal from the unit pixel. For example, a signal outputted from each pixel in a selected and scanned row of pixels is transmitted to the column processing unit 14. The reset scan is configured to reset an electric charge, and photo-charge of the photoelectric conversion element 117 is discarded, so that a new accumulation of photo-charge can begin.

For example, signal processing performed by the column processing unit 14 is correlation double sampling (CDS) processing. In the CDS processing, a reset level and a signal level outputted from each pixel in a selected row of pixels are read out, and a level difference between the reset level and the signal level is calculated. Thus, the signals of the pixels in a row are obtained. The column processing unit 14 can have an analog/digital (A/D) conversion function for converting an analog pixel signal to a digital format.

For example, the horizontal drive unit 15 includes a shift register and an address decoder. The horizontal drive unit 15 sequentially scans the pixel array 11 column by column. Based on a selection scan operation performed by the horizontal drive unit 15, each column of pixels is processed by the column processing unit 14 and outputted sequentially.

For example, the control unit 13 configures timing signals based on an operating mode, and control the vertical drive unit 12, the column processing unit 14 and the horizontal drive unit 15 to cooperatively operate by using a variety of timing signals.

Figure 3B:
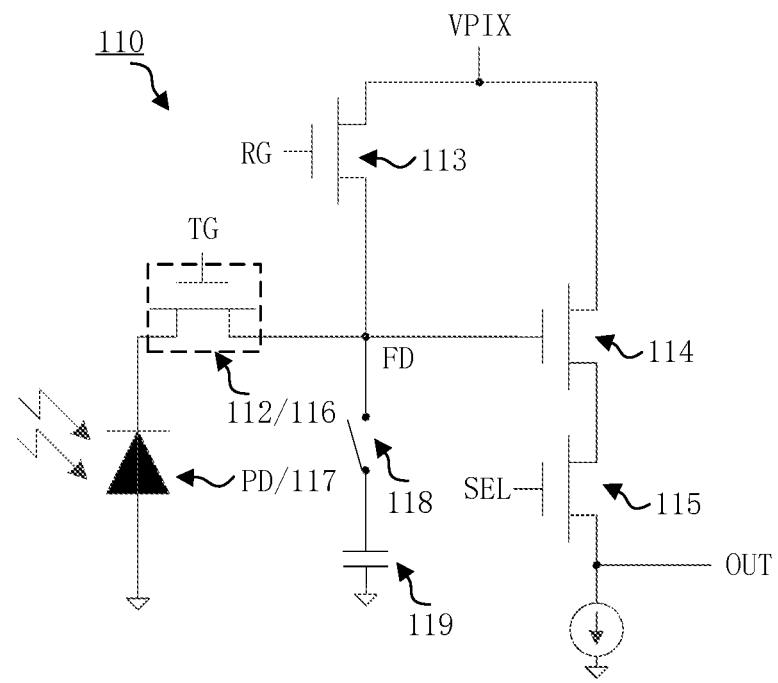
FIG. 3B is a schematic diagram of another operating mode of the pixel circuit in FIG. 3A.

FIG. 3A and FIG. 3B are schematic diagrams illustrating two operating modes of a pixel circuit 110 in an embodiment of the present disclosure. The pixel circuit 110 in FIG. 3A and FIG. 3B is applied in each pixel of FIG. 2. An operating principle of the pixel circuit 110 is explained in conjunction with FIG. 2, FIG. 3A and FIG. 3B below.

As illustrated in FIG. 3A, the pixel circuit 110 includes a photoelectric conversion element 117 (e.g., a photodiode PD), an exposure control circuit 116 (e.g., a transfer transistor 112), a reset circuit (e.g., a reset transistor 113), an amplification circuit (e.g., an amplifier transistor 114), a selection circuit (e.g., a select transistor 115), a switch circuit 118, and an additional capacitance 119. In the embodiment of the present disclosure, for example, the transfer transistor 112, the reset transistor 113, the amplifier transistor 114, and the select transistor 115 are Metal-Oxide-Semiconductor Field-Effect Transistors (MOSFETs), which are not limited herein.

For example, referring to FIG. 2 and FIG. 3A, a gate TG of the transfer transistor 112 is connected to the vertical drive unit 12 through an exposure control line (not shown); a gate RG of the reset transistor 113 is connected to the vertical drive unit 12 through a reset control line (not shown); and a gate SEL of the select transistor 114 is connected to the vertical drive unit 12 through a selection line (not shown). The exposure control circuit 116 (e.g., the transfer transistor 112) in each pixel circuit 110 is electrically connected to the photoelectric conversion element 117 and configured to transfer an accumulated electric potential after light is incident on the photoelectric conversion element 117. For example, the photoelectric conversion element 117 includes the photodiode PD, and for example, an anode of the photodiode PD is grounded. The photodiode PD converts received light into an electric charge. A cathode of the photodiode PD is connected to a floating diffusion unit FD through the exposure control circuit 116 (e.g., the transfer transistor 112). The floating diffusion unit FD is connected to a gate of the amplifier transistor 114 and a source of the reset transistor 113.

For example, the exposure control circuit 116 is the transfer transistor 112, and a control terminal TG of the exposure control circuit 116 is the gate of the transfer transistor 112. When a pulse of an effective level (e.g., a VPIX level) is transmitted to the gate of the transfer transistor 112 through an exposure control line (not shown), the transfer transistor 112 is switched on. The transfer transistor 112 transmits electric charges photoelectrically converted by the photodiode PD to the floating diffusion unit FD.

For example, the floating diffusion unit FD is connected to the additional capacitor 119 through the switching circuit 118, and a conversion gain of a pixel can be adjusted by adjusting a switching state of switch circuit 118. Specifically, as illustrated in FIG. 3A, when the switch circuit 118 is connected, the electric charges photoelectrically converted by the photodiode are transmitted to the floating diffusion unit FD and the additional capacitor 119, a total capacitance value of a floating active region is increased and a conversion gain is reduced. As illustrated in FIG. 3B, when the switch circuit 118 is disconnected, the electric charges photoelectrically converted by the photodiode are transmitted to the floating diffusion unit FD, the total capacitance value of the floating active region is decreased and the conversion gain is increased. In an example, the switch circuit 118 and the additional capacitor 119 can be provided in both the panchromatic pixel and the color pixel to flexibly adjust the conversion gains of the panchromatic pixel and the color pixel according to actual needs. For example, when an ambient brightness is relatively great, the switch circuit 118 in the panchromatic pixel is connected, and the switch circuit 118 in the color pixel is disconnected, such that the color pixel has a greater conversion gain than the panchromatic pixel, the exposure amount of the color pixel is increased, and the exposure amounts of the panchromatic pixel and the color pixel are relatively balanced. When the ambient brightness is relatively small, the switch circuit 118 in the panchromatic pixel and the switch circuit 118 in the color pixel can be both connected, and in this case, the conversion gains of the panchromatic pixel and the color pixel are increased, and both the panchromatic pixel and the color pixel can be sufficiently exposed. In another example, the switch circuit 118 and the additional capacitor 119 can be provided only in the panchromatic pixel. In this case, during the operation of the image sensor 10, the switch circuit 118 of the panchromatic pixel is connected, such that the total capacitance value of the floating active region of the panchromatic pixel is increased, and the conversion gain of the panchromatic pixel is decreased, thereby balancing the exposure amounts of the panchromatic pixel and the color pixel. In another example, the additional capacitor 119 can be provided only in the panchromatic pixel. In this case, during the operation of the image sensor 10, the total capacitance value of the floating active region of the panchromatic pixel is increased, and the conversion gain of the panchromatic pixel is decreased, so that the exposure amounts of the panchromatic pixel and the color pixel are relatively balanced. When the switch circuit 118 and the additional capacitor 119 are provided only in the panchromatic pixel and when the additional capacitor 119 is only provided only in the panchromatic pixel, a circuit design of the pixel array 11 can simplified.

For example, a capacitance value of the additional capacitor 119 in the panchromatic pixel can be greater than a capacitance value of the additional capacitor 119 in the color pixel, so that the color pixel has a greater conversion gain than the panchromatic pixel; or the number of the additional capacitors 119 in the panchromatic pixel can be greater than the number of the additional capacitors 119 in the color pixel, so that the color pixel has a greater conversion gain than the panchromatic pixel.

For example, a drain of the reset transistor 113 is connected to a pixel power supply VPIX. The source of the reset transistor 113 is connected to the floating diffusion unit FD. Before the electric charges are transferred from the photodiode PD to the floating diffusion unit FD, a pulse of an effective reset level is transmitted to the gate of the reset transistor 113 through the reset line, and the reset transistor 113 is switched on. If the switch circuit 118 is disconnected, then the reset transistor 113 resets the floating diffusion unit FD to the pixel power supply VPIX; and if the switch circuit 118 is connected, the reset transistor 113 resets a circuit consisting of the floating diffusion unit FD and the additional capacitor 119 to the pixel power supply VPIX.

For example, the gate of the amplifier transistor 114 is connected to the floating diffusion unit FD. A drain of the amplifier transistor 114 is connected to the pixel power supply VPIX. After the floating diffusion unit FD is reset by the reset transistor 113, the amplifier transistor 114 outputs the reset level through an output end OUT via the select transistor 115. After the electric charges of the photodiode PD are transferred to by the transfer transistor 112, the amplifier transistor 114 outputs a signal level through the output end OUT via the select transistor 115.

For example, a drain of the select transistor 115 is connected to a source of the amplifier transistor 114. A source of the select transistor 115 is connected to the column processing unit 14 in FIG. 2 through the output end OUT. When a pulse of an effective level is transmitted to the gate of the select transistor 115 by the selection line, the select transistor 115 is switched on. A signal outputted from the amplifier transistor 114 is transmitted to the column processing unit 14 through the select transistor 115.

It should be noted that a pixel structure of the pixel circuit 110 in the embodiment of the present disclosure is not limited to the structures illustrated in FIG. 3A and FIG. 3B. For example, the pixel circuit 110 may have a pixel structure of three-transistor, where the functions of the amplifier transistor 114 and the select transistor 115 are supplied by one transistor. For example, the exposure control circuit 116 is not limited to one single transfer transistor 112, and other electronic device or structure having a control terminal and configured to control a conduction function can be used as the exposure control circuit in the embodiment of the present disclosure. The implementations of the single transfer transistor 112 is simple, low cost, and easy to control.

In order to further balance the exposure of the panchromatic pixel and color pixel, a full-well capacity of the photoelectric conversion element 117 of the panchromatic pixel can be increased. FIG. 4A to FIG. 13C are various sectional views of some pixels in the pixel array 11 in FIG. 2 taken along a light-receiving direction of an image sensor 10, as well as schematic diagrams of arrangements of photoelectric conversion elements 117 (or filters 1182) in the pixel array 11. The panchromatic pixels and the color pixels are arranged at intervals, the color pixels have a narrower spectral response than the panchromatic pixels. Both the panchromatic pixel and the color pixel include a microlens 1181, a filter 1182, an isolation layer 1183, and a photoelectric conversion element 117. The microlens 1181, the filter 1182, the isolation layer 1183, and the photoelectric conversion element 117 are arranged in sequence along the light-receiving direction of the image sensor 10. The photoelectric conversion element 117 can convert the received light into the electric charges. Specifically, the photoelectric conversion element 117 includes a substrate 1171 and an n-potential well layer 1172 formed in the substrate 1171. The n-potential well layer 1172 can convert light into electric charges. The isolation layer 1183 is arranged on a surface of the photoelectric conversion element 117, and specifically, on a surface of the substrate 1171. Since the substrate 1171 is not completely flat, it may be difficult to arrange the filter 1182 directly on the surface of the substrate 1171. The isolation layer 1183 is arranged on the surface of the substrate 1171, and a surface of the isolation layer 1183 facing away from the surface of the substrate 1171 has a relatively higher flatness, which allows the filter 1182 to be easily arranged on the surface of the isolation layer 1183. The filter 1182 is arranged on the surface of the isolation layer 1183 facing away from the substrate 1171, and the filter 1182 allows light of a specific band to pass therethrough. The microlens 1181 is arranged on a side of the filter 1182 facing away from the isolation layer 1183, and the microlens 1181 is configured to converge light, so as guide more incident light towards the photoelectric conversion element 117. A full-well capacity of the photoelectric conversion element 117 is related to a volume of the n-potential well layer of the photoelectric conversion element 117, and the greater the volume of the n-potential well layer 1172, the greater the full-well capacity of the n-potential well layer 1172. In any one of the embodiments illustrated in FIG. 4A to FIG. 13C, a volume of the n-potential well layer 1172 of the panchromatic pixel is larger than a volume of the n-potential well layer 1172 of the color pixel. In this way, the panchromatic pixel can have a greater full-well capacity than the color pixel, which increases the saturation exposure amount Q of the panchromatic pixel and prolong the time period in which the panchromatic pixel reaches the saturation, thereby avoiding the problem of premature saturation of the panchromatic pixel, balancing the exposures of the panchromatic pixel and the color pixel, and improving the quality of the captured image.

Figure 4B:
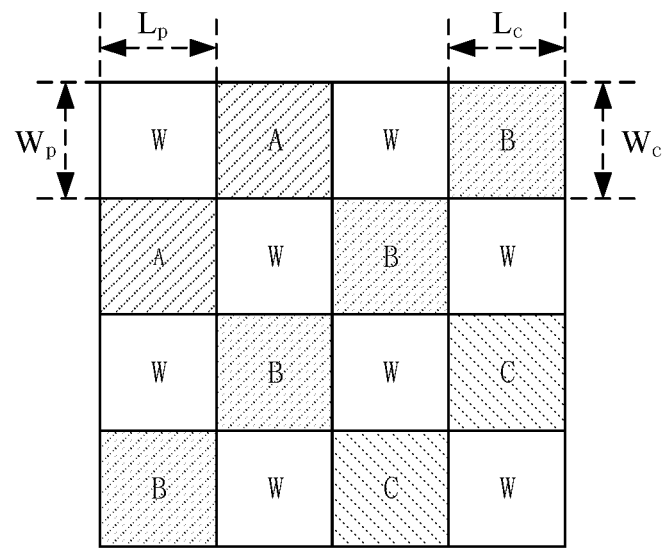
FIG. 4B is a schematic diagram illustrating an arrangement of photoelectric conversion elements (or filters) in the pixel array of FIG. 4A.

For example, FIG. 4A and FIG. 4B are respectively a sectional view of a pixel array 11 taken along a light-receiving direction and a schematic diagram of an arrangement of a plurality of photoelectric conversion elements 117 (or a plurality of filters 1182), according to an embodiment of the present disclosure. As illustrated in FIG. 4A, along the light-receiving direction, sizes of cross-sections of the isolation layer 1183 of each pixel (the same pixel) are equal; along the light-receiving direction, sizes of cross-sections of the n-potential well layer 1172 of each pixel (the same pixel) are equal; a cross-section of the n-potential well layer 1172 of the color pixel has a same size as a cross-section of the n-potential well layer 1172 of the color pixel; and a depth H1 of the n-potential well layer 1172 of the panchromatic pixel is greater than a depth H2 of the n-potential well layer 1172 of the color pixel. Thus, the volume of the n-potential well layer 1172 of the panchromatic pixel is greater than the volume of the n-potential well layer 1172 of the color pixel, and the panchromatic pixel has a greater full-well capacity than the color pixel.

It should be noted that the cross-section of the isolation layer 1183 is a cross-section of the isolation layer taken in a direction perpendicular to the light-receiving direction, and the cross-section of the n-potential well layer 1172 is a cross-section of the n-potential well layer 1172 taken in a direction perpendicular to the light-receiving direction. A shape and a size of the cross-section of the isolation layer 1183 of each pixel corresponds to a shape and a size of the cross-section of the n-potential well layer 1172 of the pixel. The cross-section can be a shape of rectangle, square, parallelogram, rhombus, pentagon, hexagon, and other shapes of polygon, which is not limited herein.

Along the light-receiving direction, the plurality of cross-sections of the n-potential well layer 1172 (or the isolation layer 1183) of the same pixel having the same size means that the plurality of cross-sections has the same area, and lengths of corresponding edges of the plurality of cross-sections are equal. The cross-section of the n-potential well layer 1172 of the panchromatic pixel having the same size as the cross-section of the n-potential well layer 1172 of the color pixel means that the cross-section of the n-potential well layer 1172 of the panchromatic pixel has the same area as the cross-section of the n-potential well layer of the color pixel. Lengths of edges of a shape formed by the cross-section of the n-potential well layer 1172 of the panchromatic pixel may be equal or unequal to lengths of corresponding edges of a shape formed by the cross-section of the n-potential well layer 1172 of the color pixel. For example, as illustrated in FIG. 4B, the cross-sections of the n-potential well layers 1172 of the panchromatic pixels and the color pixels are each in a shape of rectangle, which includes a long edge (length) and a short edge (width). The cross-section of the n-potential well layer 1172 of the panchromatic pixel has the same area as the cross-section of the n-potential well layer 1172 of the color pixel. A length Lp of the cross-section of the n-potential well layer 1172 of the panchromatic pixel is equal to a length Lc of the cross-section of the n-potential well layer 1172 of the color pixel, and a width Wp of the cross-section of the n-potential well layer 1172 of the panchromatic pixel is equal to a width Wc of the cross-section of the n-potential well layer 1172 of the color pixel. In other examples, Lp may be unequal to Lc, and Wp may be unequal to Wc, as long as the area of the cross-section of the n-potential well layer 1172 of the panchromatic pixels is equal to the area of the cross-section of the n-potential well layer 1172 of the color pixel. The cross-section of n-potential well layer 1172 (or the isolation layer 1183), the plurality of cross-sections of n-potential well layer 1172 (or the isolation layer 1183) of each pixel having the same size, and the cross-section of the n-potential well layer 1172 of the panchromatic pixel having the same size as the cross-section of the n-potential well layer 1172 of the color pixel described below can be interpreted as above.

Figure 5A:
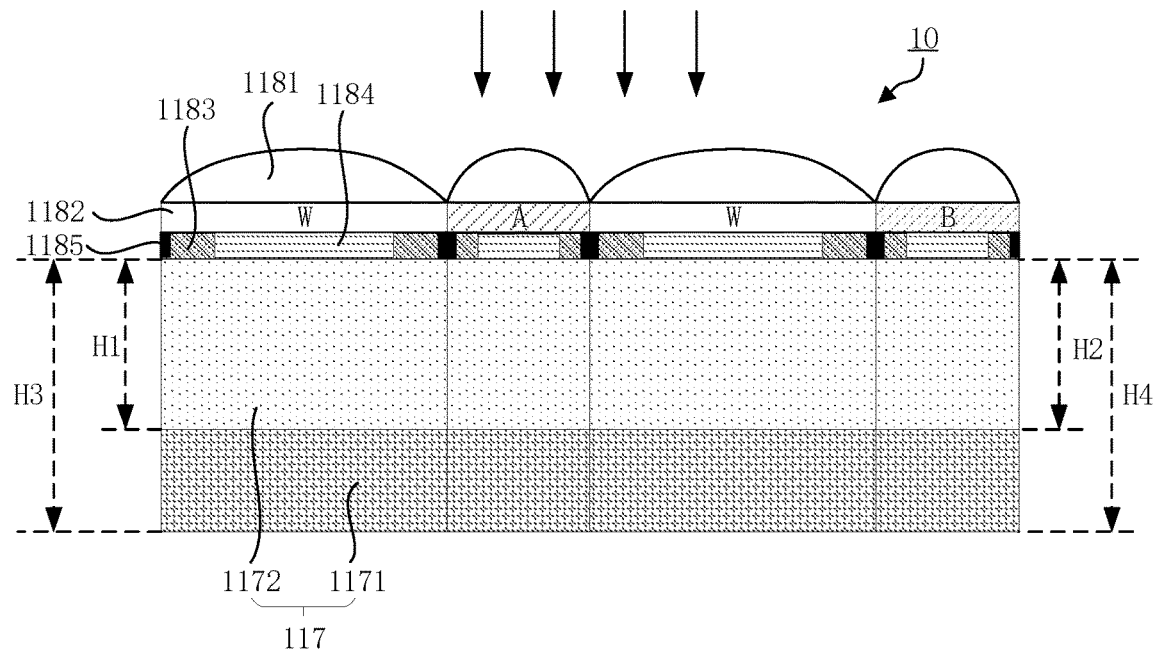
FIG. 5A is a partial sectional view of a pixel array according to another embodiment of the present disclosure.
Figure 5B:
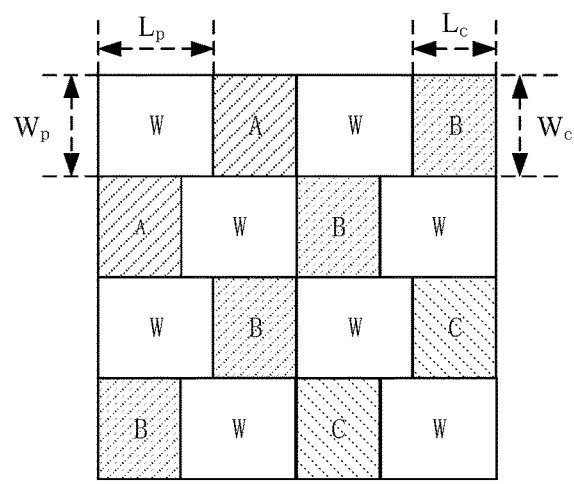
FIG. 5B is a schematic diagram illustrating an arrangement of photoelectric conversion elements (or filters) in the pixel array of FIG. 5A.
Figure 5C:
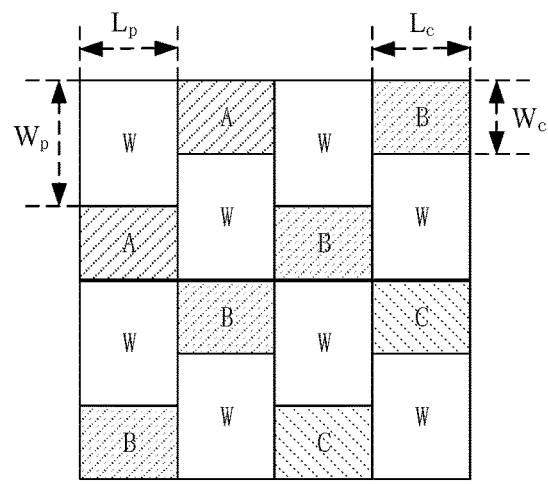
FIG. 5C is a schematic diagram illustrating another arrangement of photoelectric conversion elements (or filters) in the pixel array of FIG. 5A.

For example, FIG. 5A is a sectional view of a pixel array 11 taken along a light-receiving direction in another embodiment of the present disclosure, and FIG. 5B and FIG. 5C are schematic diagrams of two arrangements of a plurality of photoelectric conversion elements 117 (or a plurality of filters 1182) in the pixel array 11 of FIG. 5A. As illustrated in FIG. 5A, along the light-receiving direction, sizes of cross-sections of the isolation layer 1183 of each pixel (the same pixel) are equal; along the light-receiving direction, sizes of cross-sections of the n-potential well layer 1172 of each pixel (the same pixel) are equal; a cross-section of the n-potential well layer 1172 of the color pixel has a greater size than a cross-section of the n-potential well layer 1172 of the color pixel; and a depth H1 of the n-potential well layer 1172 of the panchromatic pixel is equal to a depth H2 of the n-potential well layer 1172 of the color pixel. In this case, the volume of the n-potential well layer 1172 of the panchromatic pixel is greater than the volume of the n-potential well layer 1172 of the color pixel, and the panchromatic pixel has a greater full-well capacity than the color pixel. In other embodiments, the depth H1 of the n-potential well layer 1172 of the panchromatic pixel in FIG. 5A may be greater than the depth H2 of the n-potential well layer 1172 of the color pixel.

It should be noted that the cross-section of the n-potential well layer 1172 of the color pixel having a greater size than the cross-section of the n-potential well layer 1172 of the color pixel means that the cross-section of the n-potential well layer 1172 of the panchromatic pixel has a greater area than the cross-section of the n-potential well layer 1172 of the color pixel, and some or all edges of a shape formed by the cross-section of the n-potential well layer of the panchromatic pixel may have a greater length than corresponding edges of a shape formed by the cross-section of the n-potential well layer 1172 of the color pixel. For example, as illustrated in FIG. 5B, a length Lp of the cross-section of the n-potential well layer 1172 of the panchromatic pixel is greater than a length Lc of the cross-section of the n-potential well layer 1172 of the color pixel, while a width Wp of the cross-section of the n-potential well layer 1172 of the panchromatic pixel is equal to a width Wc of the cross-section of the n-potential well layer 1172 of the color pixel. For example, as illustrated in FIG. 5C, the length Lp of the cross-section of the n-potential well layer 1172 of the panchromatic pixel is equal to the length Lc of the cross-section of the n-potential well layer 1172 of the color pixel, while the width Wp of the cross-section of the n-potential well layer 1172 of the panchromatic pixel is greater than the width Wc of the cross-section of the n-potential well layer 1172 of the color pixel. The cross-section of the n-potential well layer of the panchromatic pixel having a greater size than the cross-section of the n-potential well layer 1172 of the color pixel described below can be interpreted in the same way.

Figure 6A:
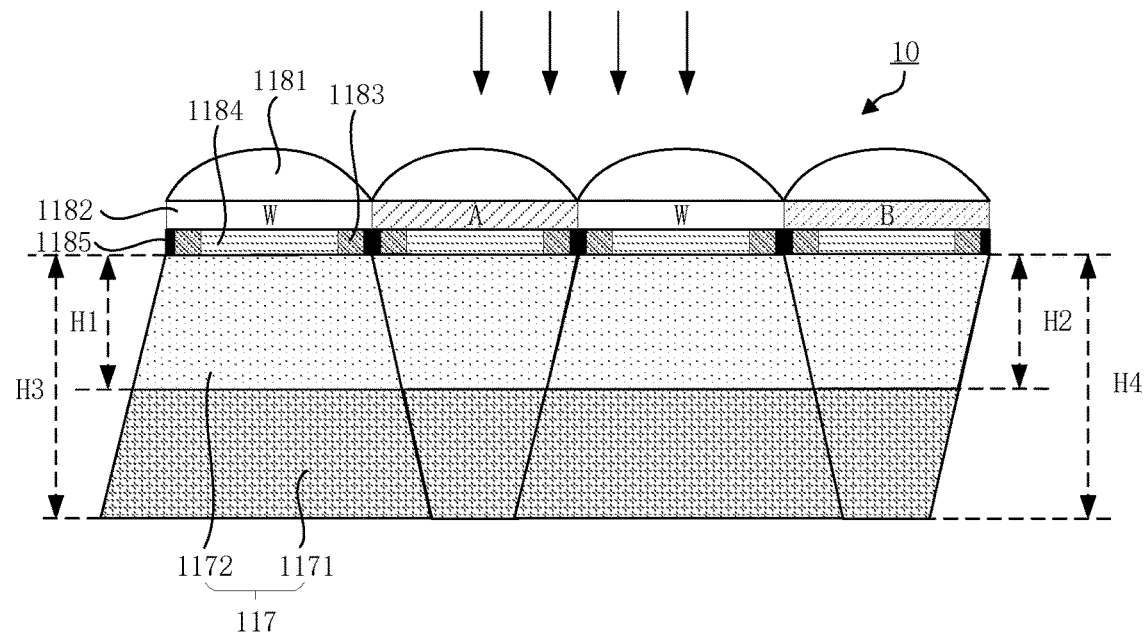
FIG. 6A is a partial sectional view of a pixel array according to yet another embodiment of the present disclosure.
Figure 6B:
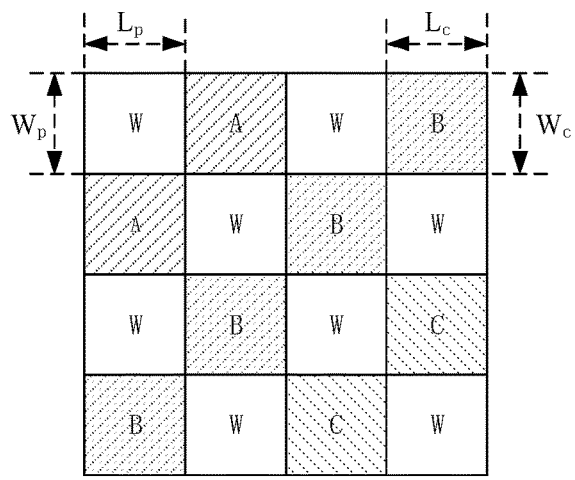
FIG. 6B is a schematic diagram illustrating an arrangement of filters in the pixel array of FIG. 6A.
Figure 6C:
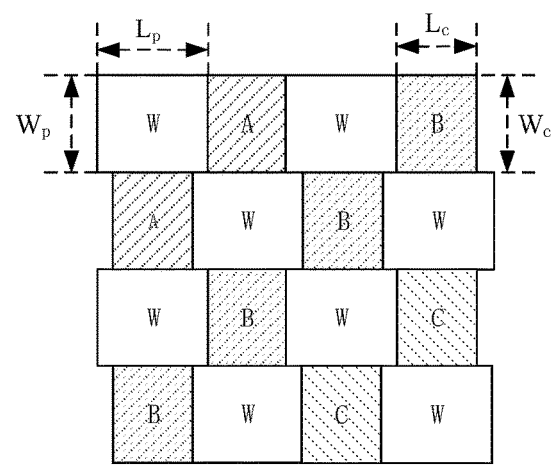
FIG. 6C is a schematic diagram illustrating an arrangement of photoelectric conversion elements in the pixel array of FIG. 6A.

For example, FIG. 6A to FIG. 6C are respectively a sectional view of a pixel array 11 taken along a light-receiving direction, a schematic diagram of an arrangement of a plurality of filters 1182, and a schematic diagram of an arrangement of a plurality of photoelectric conversion elements 117, according to yet another embodiment of the present disclosure. As illustrated in FIG. 6A, sizes of cross-sections of the isolation layer 1183 of each pixel (the same pixel) are equal; and along the light-receiving direction, the sizes of the cross-sections of the n-potential well layer 1172 of each panchromatic pixel (the same panchromatic pixel) gradually increase, while the sizes of the cross-sections of the n-potential well layer 1172 of each color pixel (the same color pixel) gradually decrease. The size of the smallest cross-section of the n-potential well layer 1172 of the panchromatic pixel is the same as the size of the largest cross-section of the n-potential well layer 1172 of the color pixel, and a depth H1 of the n-potential well layer 1172 of the panchromatic pixel is equal to a depth H2 of the n-potential well layer 1172 of the color pixel. Although the cross-section of the filter 1182 of the panchromatic pixel has the same size as the cross-section of the filter 1182 of the color pixel (same area and same lengths of corresponding edges) as illustrated in FIG. 6B, the cross-section of the n-potential well layer 1172 in the photoelectric conversion element 117 (except for the smallest cross-section with the smallest size) has a greater size than the cross-section of the n-potential well layer 1172 in the photoelectric conversion element 117 of the color pixel as illustrated in FIG. 6C. In this way, the volume of the n-potential well layer 1172 of the panchromatic pixel is greater than the volume of the n-potential well layer 1172 of the color pixel, and the panchromatic pixel has a greater full-well capacity than the color pixel.

In other embodiments, the smallest cross-section of the n-potential well layer 1172 of the panchromatic pixel in FIG. 6A may have a greater size than the largest cross-section of the n-potential well layer of the color pixel, and the depth H1 of the n-potential well layer 1172 of the panchromatic pixel may be greater than the depth H2 of the n-potential well layer 1172 of the color pixel.

Figure 7A:
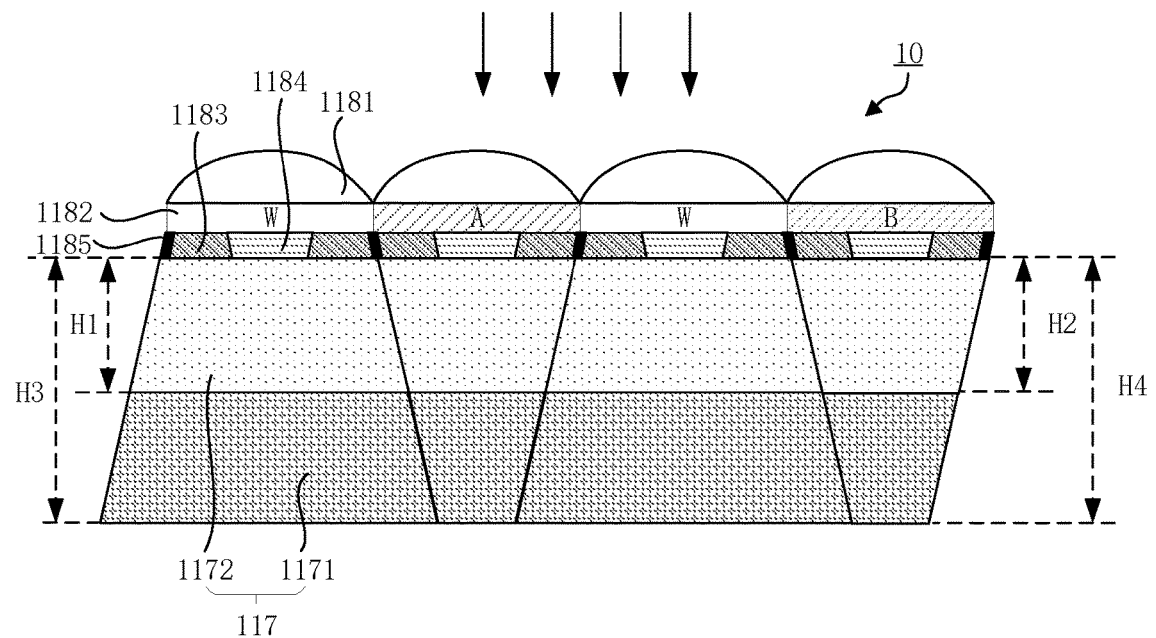
FIG. 7A is a partial sectional view of a pixel array according to yet another embodiment of the present disclosure.
Figure 7B:
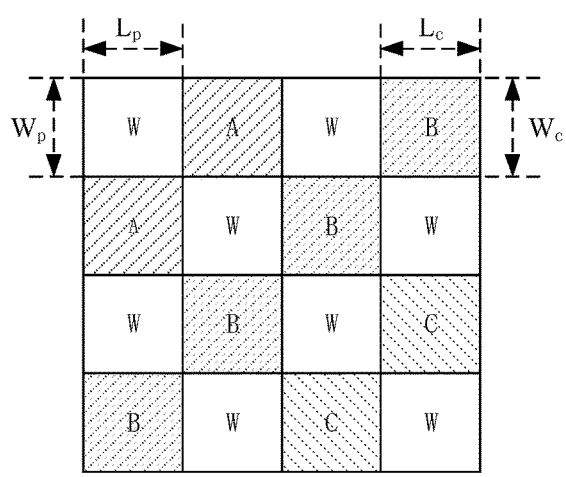
FIG. 7B is a schematic diagram illustrating an arrangement of filters in the pixel array of FIG. 7A.
Figure 7C:
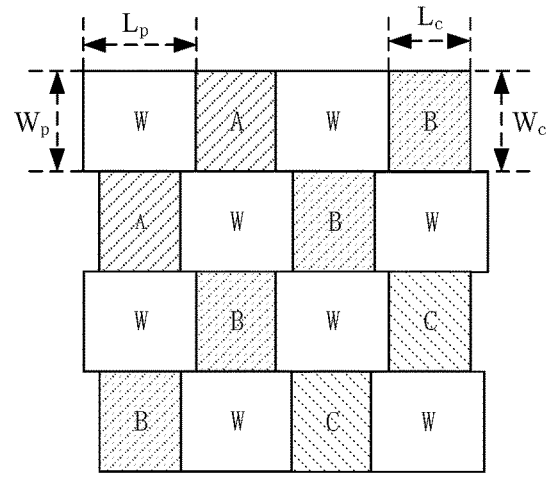
FIG. 7C is schematic diagram illustrating an arrangement of photoelectric conversion elements in the pixel array of FIG. 7A.

For example, FIG. 7A to FIG. 7C are respectively a sectional view of a pixel array 11 taken along a light-receiving direction, a schematic diagram of an arrangement of a plurality of filters 1182, and a schematic diagram of an arrangement of a plurality of photoelectric conversion elements 117, according to yet another embodiment of the present disclosure. As illustrated in FIG. 7A, along the light-receiving direction, sizes of a plurality of cross-sections of the isolation layer 1183 of each panchromatic pixel (the same panchromatic pixel) gradually increase, and sizes of a plurality of cross-sections of the isolation layer 1183 of each color pixel (the same color pixel) gradually decrease; and along the light-receiving direction, sizes of the cross-sections of the n-potential well layer 1172 of each panchromatic pixel gradually increase, and sizes of the cross-sections of the n-potential well layer 1172 of each color pixel gradually decrease, the smallest cross-section of the n-potential well layer 1172 of the panchromatic pixel has a same size as the largest cross-section of the n-potential well layer 1172 of the color pixel, and a depth H1 of the n-potential well layer 1172 of the panchromatic pixel is equal to a depth H2 of the n-potential well layer 1172 of the color pixel. Although the cross-section of the filter 1182 of the panchromatic pixel has the same size as the cross-section of the filter 1182 of the color pixel (same area and same lengths of corresponding edges) as illustrated in FIG. 7B, the cross-section of the n-potential well layer 1172 of the photoelectric conversion element 117 (except for the smallest cross-section with the smallest size) of the panchromatic pixel has a greater size than the corresponding cross-section of the n-potential well layer 1172 of the photoelectric conversion element 117 of the color pixel as illustrated in FIG. 7C. Thus, the volume of the n-potential well layer 1172 of the panchromatic pixel is greater than the volume of the n-trap layer 1172 of the color pixel, and the panchromatic pixel has a greater full-well capacity than the color pixel.

In other embodiments, the smallest cross-section of the n-potential well layer 1172 of the panchromatic pixel in FIG. 7A may have a greater size than the largest cross-section of the n-potential well layer of the color pixel, and the depth H1 of the n-potential well layer 1172 of the panchromatic pixel may be greater than the depth H2 of the n-potential well layer 1172 of the color pixel.

Figure 8A:
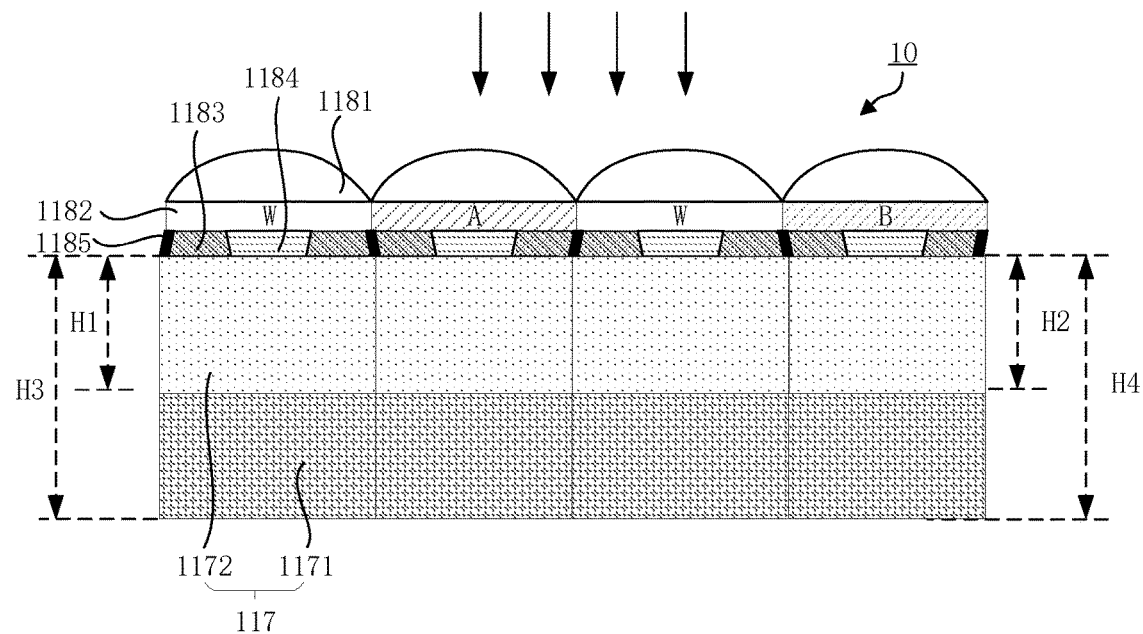
FIG. 8A is a partial sectional view of a pixel array according to yet another embodiment of the present disclosure.
Figure 8B:
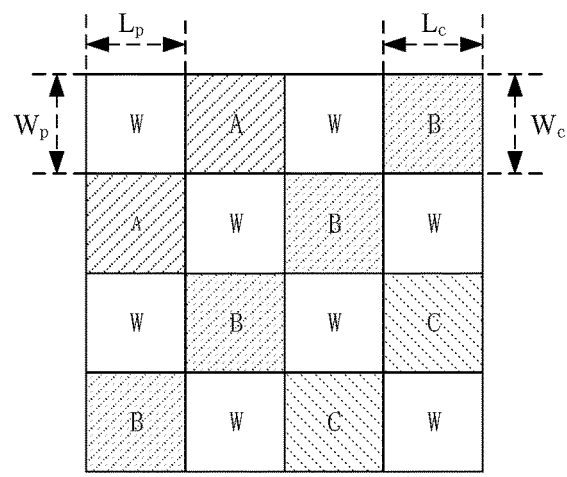
FIG. 8B is a schematic diagram illustrating an arrangement of filters in the pixel array of FIG. 8A.
Figure 8C:
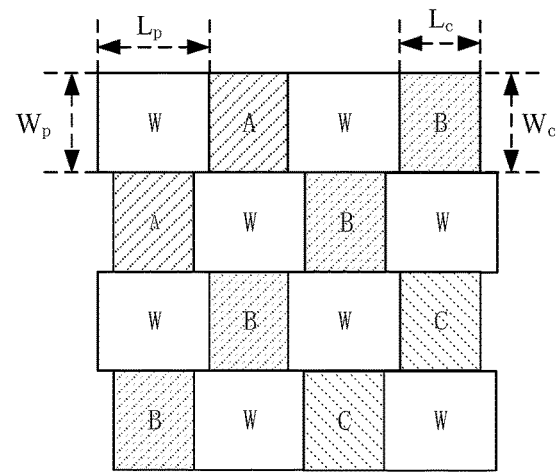
FIG. 8C is a schematic diagram illustrating an arrangement of photoelectric conversion elements in the pixel array of FIG. 8A.

For example, FIG. 8A to FIG. 8C are respectively a sectional view of a pixel array 11 taken along a light-receiving direction, a schematic diagram of an arrangement of a plurality of filters 1182, and a schematic diagram of an arrangement of a plurality of photoelectric conversion elements 117, according to yet another embodiment of the present disclosure respectively. As illustrated in FIG. 8A, along the light-receiving direction, sizes of a plurality of cross-sections of the isolation layer 1183 of each panchromatic pixel (the same panchromatic pixel) gradually increase, sizes of a plurality of cross-sections of the isolation layer 1183 of each color pixel (the same color pixel) gradually decrease, and the smallest cross-section of the isolation layer 1183 of the panchromatic pixel has a same size as the largest cross-section of the isolation layer 1183 of the color pixel; along the light-receiving direction, sizes of cross-sections of n-potential well layer 1172 of each pixel are equal; the cross-section of n-potential well layer 1172 of panchromatic pixel has a greater size than the cross-section of n-potential well layer 1172 of color pixel; and a depth H1 of the n-potential well layer 1172 of the panchromatic pixel is equal to a depth H2 of n-potential well layer 1172 of the color pixel. Although the cross-section of the filter 1182 of the panchromatic pixel has the same size as the cross-section of the filter 1182 of the color pixel (same area and same lengths of corresponding edges) as illustrated in FIG. 8B, the cross-section of the n-potential well layer 1172 of the photoelectric conversion element 117 (except for the smallest cross-section with the smallest size) of the panchromatic pixel has a greater size than the cross-section of the n-potential well layer 1172 of the photoelectric conversion element 117 of the color pixel as illustrated in FIG. 8C. Thus, the volume of the n-potential well layer 1172 of the panchromatic pixel is greater than the volume of the n-potential well layer 1172 of the color pixel, and the panchromatic pixel has a greater full-well capacity than the color pixel.

In other embodiments, the depth H1 of the n-potential well layer 1172 of the panchromatic in FIG. 8A may be greater than the depth H2 of the n-potential well layer 1172 of the color pixel H2, and the smallest cross-section of the isolation layer 1183 of the panchromatic pixel in FIG. 8A may have a greater size than the largest cross-section of the isolation layer 1183 of the color pixel.

In the pixel array 11 of any one of the embodiments illustrated in FIG. 4A to FIG. 8C, a depth H3 of the photoelectric conversion element 117 of the panchromatic pixel is equal to a depth H4 of the photoelectric conversion element 117 of the color pixel, and specifically, the depth H3 of the substrate 1171 of the panchromatic pixel is equal to the depth H4 of the substrate 1171 of the color pixel. When the depth H3 is equal to the depth H4, a surface of the substrate 1171 of the panchromatic pixel facing away from the filter 1182 is located at the same horizontal level as a surface of the substrate 1171 of the color pixel facing away from the filter 1182, thereby reducing the complexity of the design and manufacture of the read-out circuit.

Each of the pixels in any one of the embodiments illustrated in FIG. 4A to FIG. 8C includes a light-guiding layer 1184. The light-guiding layer 1184 is formed in the isolation layer 1183, and the light-guiding layer 1184 has a greater refractive index than the isolation layer 1183. For each pixel, a part of the isolation layer 1183, the light-guiding layer 1184, and the other prat of the isolation layer 1183 are arranged in sequence along a direction perpendicular to the light-receiving direction. For example, along the direction perpendicular to the light-receiving direction, a part of the isolation layer 1183 of the panchromatic pixel W, the light-guiding layer 1184 of the panchromatic pixel W, and the other prat of the isolation layer 1183 of the panchromatic pixel W are arranged in sequence; a part of the isolation layer 1183 of the color pixel A, the light-guiding layer 1184 of the color pixel A, and the other prat of the isolation layer 1183 of the color pixel A are arranged in sequence; a part of the isolation layer 1183 of the color pixel B, the light-guiding layer 1184 of the color pixel B, and the other prat of the isolation layer 1183 of the color pixel B are arranged in sequence, etc. The light-guiding layer 1184 is provided in the isolation layer 1183 to allow a total reflection of the light transmitting through the filter 1182 within a structure consisting of the isolation layer 1183 and the light-guiding layer 1184, thereby converging the light and allowing more light to enter into the corresponding photoelectric conversion element 117. The n-potential well layer 1172 of the photoelectric conversion element 117 can receive the light passing through the light-guiding layer 1184 and convert the light into electric charges.

In an example, the light-guiding layer 1184 has the same refractive index at respective locations, which can simplify the design of the light-guiding layer and reduce the difficulties in manufacturing the pixel array 11. In another example, the refractive index of the light-guide layer 1184 is gradually increased along the light-receiving direction of the image sensor 10, thereby enhancing the light-converging capability of the light-guiding layer 1184 and allowing more light to enter the photoelectric conversion element 117.

As illustrated in FIG. 4A to FIG. 6C, along the light-receiving direction, sizes of cross-sections of the isolation layer 1183 of each pixel are equal, and sizes of cross-sections of the light-guiding layer 1184 of each pixel are equal, which simplifies the manufacturing process of the light-guiding layer 1184. In other embodiments, when the sizes of the cross-sections of the isolation layer 1183 of each pixel are equal along the light-receiving direction, the light-guiding layer 1184 may has such a structure that the sizes of the plurality of cross-sections of the light-guiding layer 1184 of each pixel gradually decrease along the light-receiving direction, thereby improving the light-converging capability of the light-guiding layer 1184 and allowing more light to enter the photoelectric conversion element 117.

As illustrated in FIG. 7A and FIG. 8A, along the light-receiving direction, the sizes of the plurality of cross-sections of the isolation layer 1183 of each panchromatic pixel gradually increase, the sizes of the plurality of cross-sections of the isolation layer 1183 of each color pixel gradually decrease, and sizes of cross-sections of the light-guiding layer 1184 of each panchromatic pixel and each color pixel gradually decrease. Such a design enhances the light-converging capability of the light-guiding layer 1184, thereby allowing more light to enter the photoelectric conversion element 117. In other embodiments, when the sizes of the plurality of cross-sections of the isolation layer 1183 of each panchromatic pixel gradually increase along the light-receiving direction and the sizes of the plurality of cross-sections of the isolation layer 1183 of each color pixel gradually decrease, the light-guiding layer 1184 can have such a structure that the sizes of the cross-sections of the isolation layer 1183 of each pixel are equal along the light-receiving direction, which simplifies the manufacturing process of the light-guiding layer 1184.

A depth of the light-guiding layer 1184 is equal to a depth of the isolation layer 1183, which can enhance the light-converging capability of the light-guiding layer 1184. A thickness of the isolation layer 1183 in the present disclosure is greater than a thickness of the isolation layer in the existing image sensor, for example, greater than a predetermined thickness. In this way, a longer light path can be provided to improve the light-converging effect of the structure consisting of the light-guiding layer 1184 and the isolation layer 1183.

Each of the pixels in any one of the embodiments illustrated in FIG. 4A to FIG. 8C includes an optical isolation interlayer 1185. The optical isolation interlayer 1185 is arranged between the isolation layers 1183 of two adjacent pixels. For example, the optical isolation interlayer 1185 is arranged between the isolation layer 1183 of the panchromatic pixel W and the isolation layer 1183 of the color pixel A, and another optical isolation interlayer 1185 is arranged between the isolation layer 1183 of the panchromatic pixel W and the isolation layer 1183 of the color pixel B, etc. The optical isolation interlayer 1185 can be made of at least one material of tungsten, titanium, aluminum, or copper. The optical isolation interlayer 1185 can prevent light incident on a pixel from entering another pixel adjacent to this pixel, avoiding causing noise for other pixels.

Figure 9A:
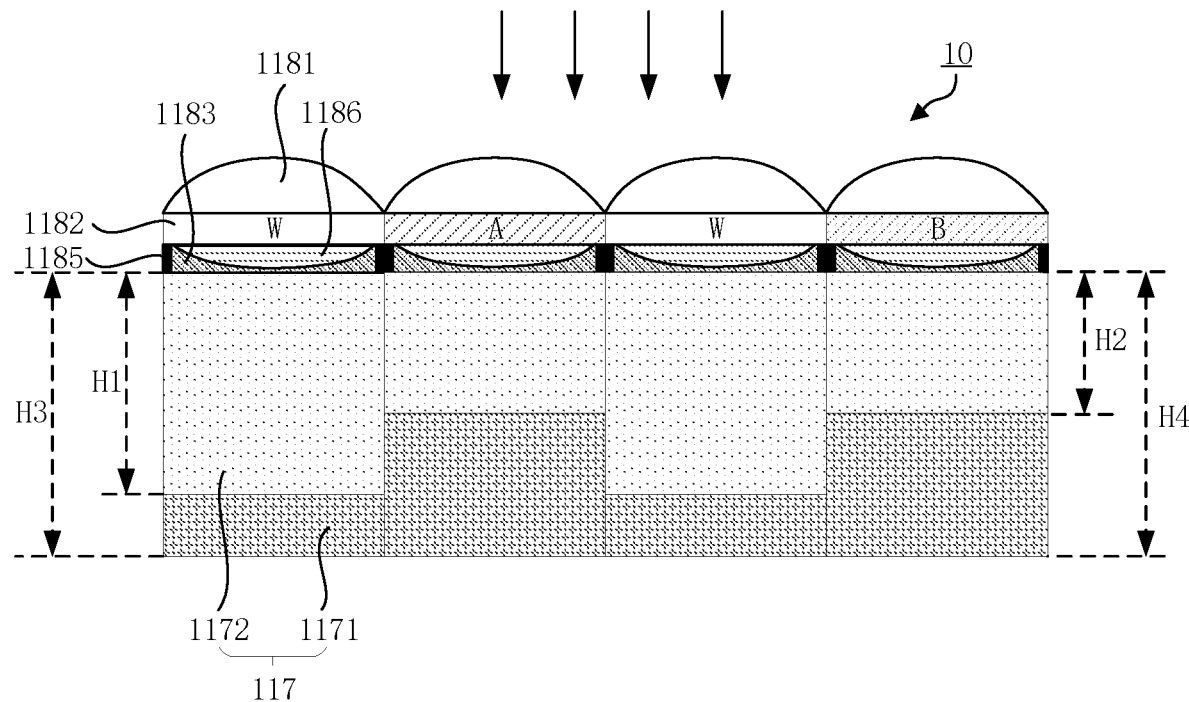
FIG. 9A is a partial sectional view of a pixel array according to yet another embodiment of the present disclosure.
Figure 9B:
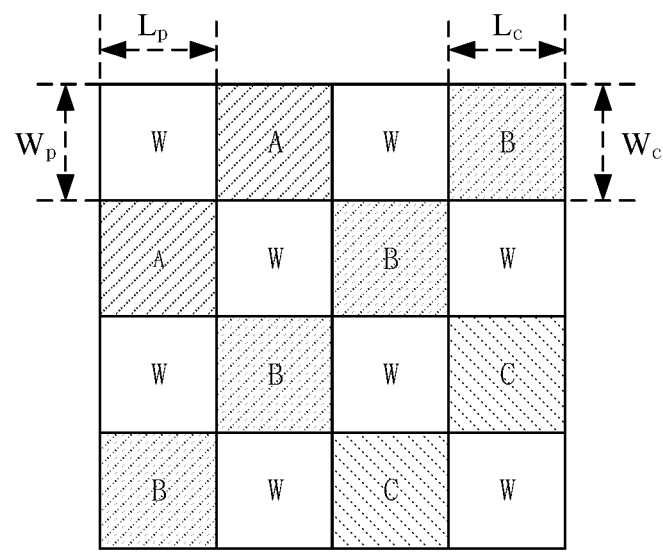
FIG. 9B is a schematic diagram illustrating an arrangement of photoelectric conversion elements (or filters) in the pixel array of FIG. 9A.
Figure 10A:
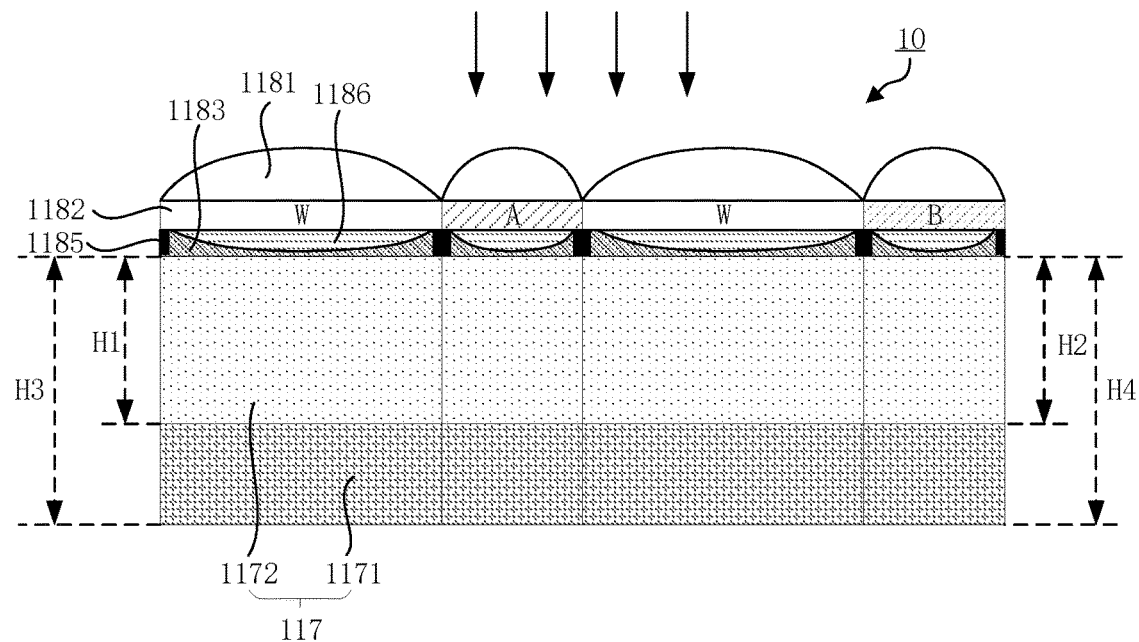
FIG. 10A is a partial sectional view of a pixel array according to yet another embodiment of the present disclosure.
Figure 10B:
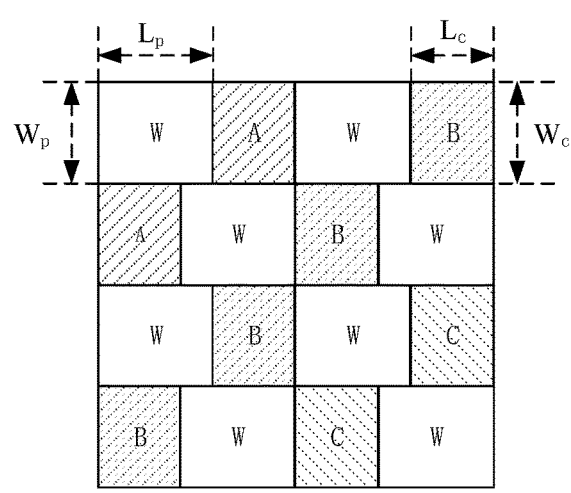
FIG. 10B is a schematic diagram illustrating an arrangement of photoelectric conversion elements (or filters) in the pixel array of FIG. 10A.
Figure 10C:
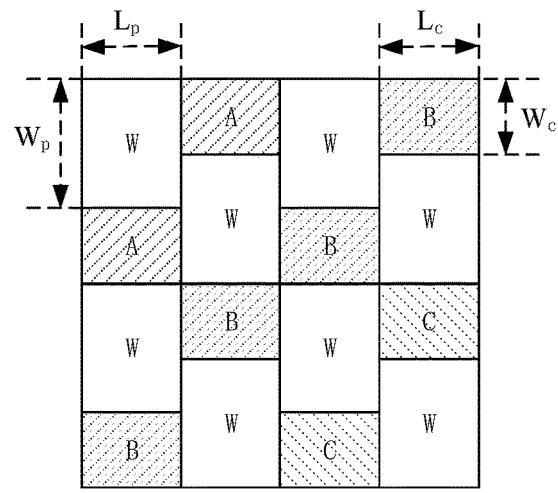
FIG. 10C is a schematic diagram illustrating another arrangement of photoelectric conversion elements (or filters) in the pixel array of FIG. 10A.
Figure 12A:
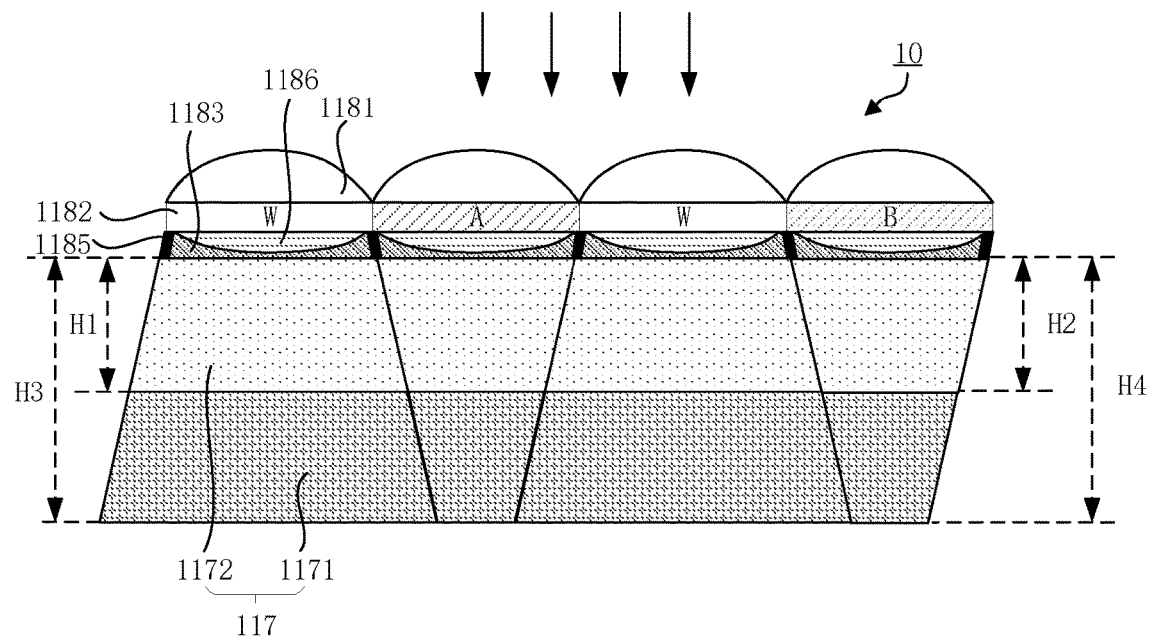
FIG. 12A is a partial sectional view of a pixel array according to yet another embodiment of the present disclosure.
Figure 12B:
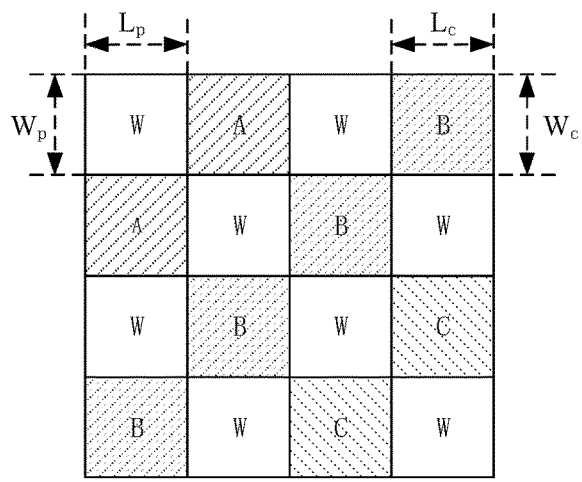
FIG. 12B is a schematic diagram illustrating an arrangement of filters in the pixel array of FIG. 12A.
Figure 12C:
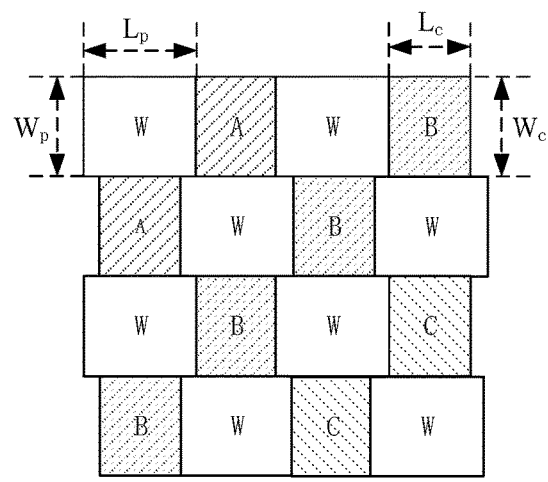
FIG. 12C is a schematic diagram illustrating an arrangement of photoelectric conversion elements in the pixel array of FIG. 12A.
Figure 13A:
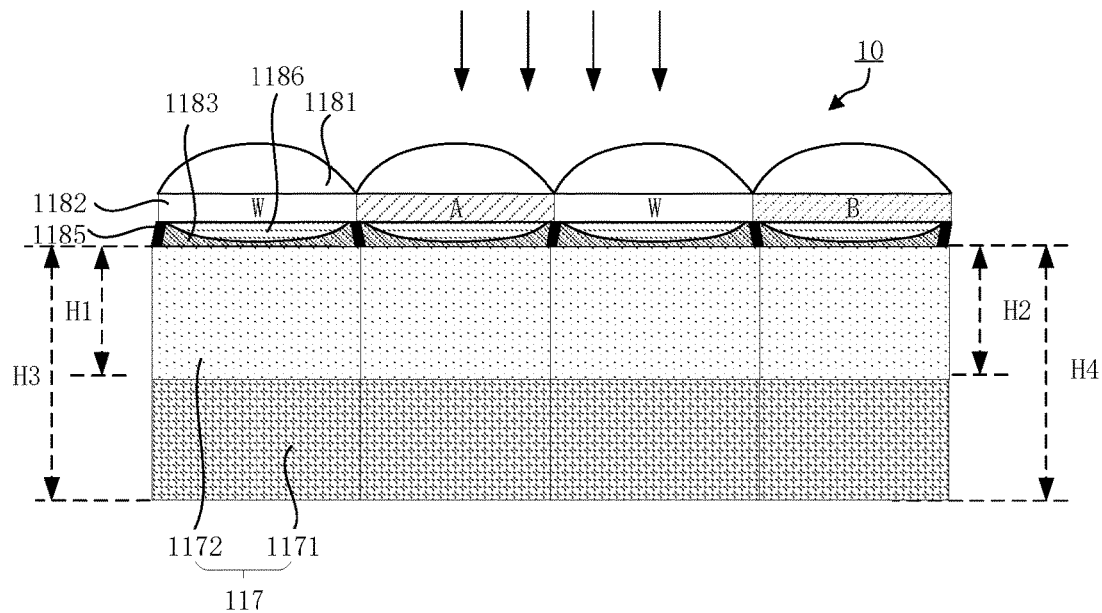
FIG. 13A is a partial sectional view of a pixel array according to yet another embodiment of the present disclosure.
Figure 13B:
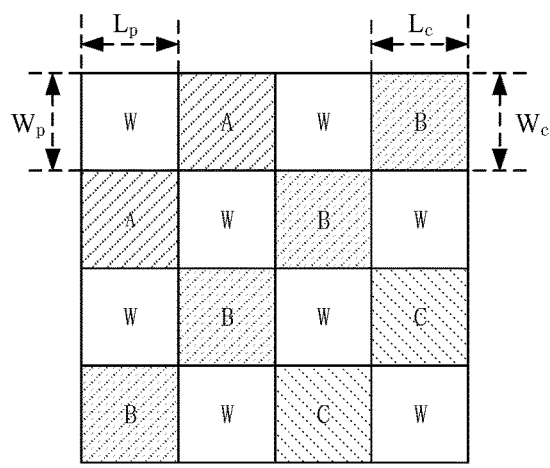
FIG. 13B is a schematic diagram illustrating an arrangement of filters in the pixel array of FIG. 13A.
Figure 13C:
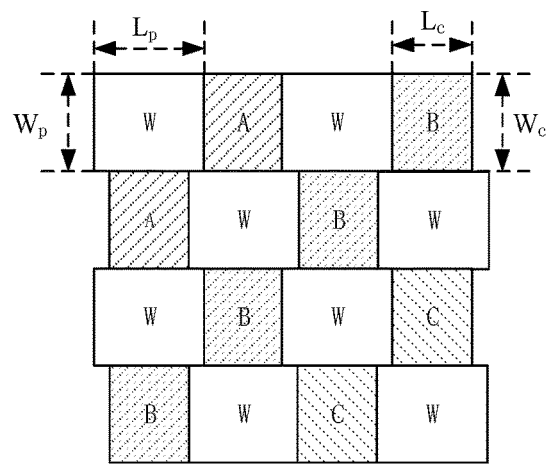
FIG. 13C is a schematic diagram illustrating an arrangement of photoelectric conversion elements in the pixel array of FIG. 13A.

The light-guiding layer 1184 of each pixel in any one of the embodiments illustrated in FIG. 4A to FIG. 8C can be replaced by a condenser lens 1186. Specifically, as illustrated in FIG. 9A to FIG. 13C, except the condenser lens 1186, the structure of the image sensor 10 in FIG. 9A is basically the same as that of the image sensor 10 in FIG. 4A, the structure of the image sensor 10 in FIG. 10A is the same as that of the image sensor 10 in FIG. 5A, the structure of the image sensor 10 in FIG. 11A is the same as that of the image sensor 10 in FIG. 6A, the structure of the image sensor 10 in FIG. 12A is the same as that of the image sensor 10 in FIG. 7A, and the structure of the image sensor 10 in FIG. 13A is the same as that of the image sensor 10 in FIG. 8A. The microlens 1181, the filter 1182, the isolation layer 1183, the optical isolation interlayer 1185, and the photoelectric conversion element 117 (the substrate 1171 and the n-potential well layer 1172) in FIG. 9A to FIG. 13C are no longer described herein.

As illustrated in FIG. 9A to FIG. 13C, the panchromatic pixel and the color pixel include each a condenser lens 1186, which is arranged in the isolation layer 1183 of the corresponding pixel. The condenser lens 1186 can converge light, allowing more light transmitting through the filter 1182 to enter into the photoelectric conversion element 117. When the condenser lens 1186 is provided in each pixel, the condenser lens 1186 can be designed with different curvature radiuses according to the needs of different pixels. For example, the condenser lens 1186 of the color pixel has a greater curvature radius than the condenser lens 1186 of the panchromatic pixel, so that the light-converging capability of the condenser lens 1186 of the color pixel is higher than that of the condenser lens 1186 of the panchromatic pixel.

In other embodiments, only some pixels can include the condenser lens 1186. For example, the condenser lens 1186 may not be provided in the panchromatic pixel, and the condenser lens 1186 can be provided in the color pixel. For example, in the embodiments illustrated in FIG. 11A and FIG. 12A, along the light-receiving direction, the cross-sections of the n-potential well layer 1172 of the panchromatic pixel are gradually enlarged, and the cross-sections of the n-potential well layer of the color pixel are gradually reduced, so that a great portion of light passing through the filter 1182 of the panchromatic pixel can enter the photoelectric conversion element 117 of the panchromatic pixel, while a small portion of light passing through the filter 1182 of the color pixel can enter the photoelectric conversion element 117 of the color pixel. In this case, the condenser lens 1186 can be arranged only in the isolation layer 1183 of the color pixel, such that the light-converging effect of the condenser lens 1186 can be utilized to allow more light to enter the photoelectric conversion element 117 of the color pixel. By providing the condenser lens 1186 only in some pixels can reduce the production cost of the image sensor 10.

When the condenser lens 1186 is arranged in the pixel, an anti-reflective film can be arranged on a side of each condenser lens 1186 opposite to the photoelectric conversion element 117, and the anti-reflective film can be used to reduce the optical interference and to avoid the influence of the optical interference on the imaging effect of the image sensor 10.

Figure 14:
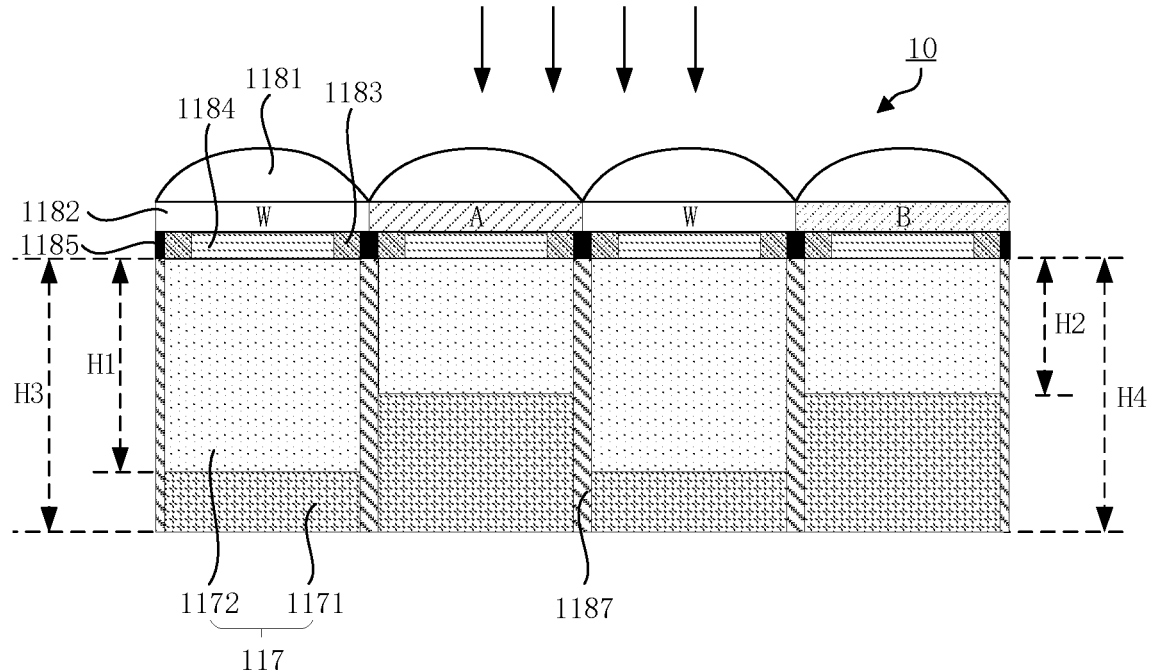
FIG. 14 is a partial sectional view of a pixel array according to yet another embodiment of the present disclosure.
Figure 15:
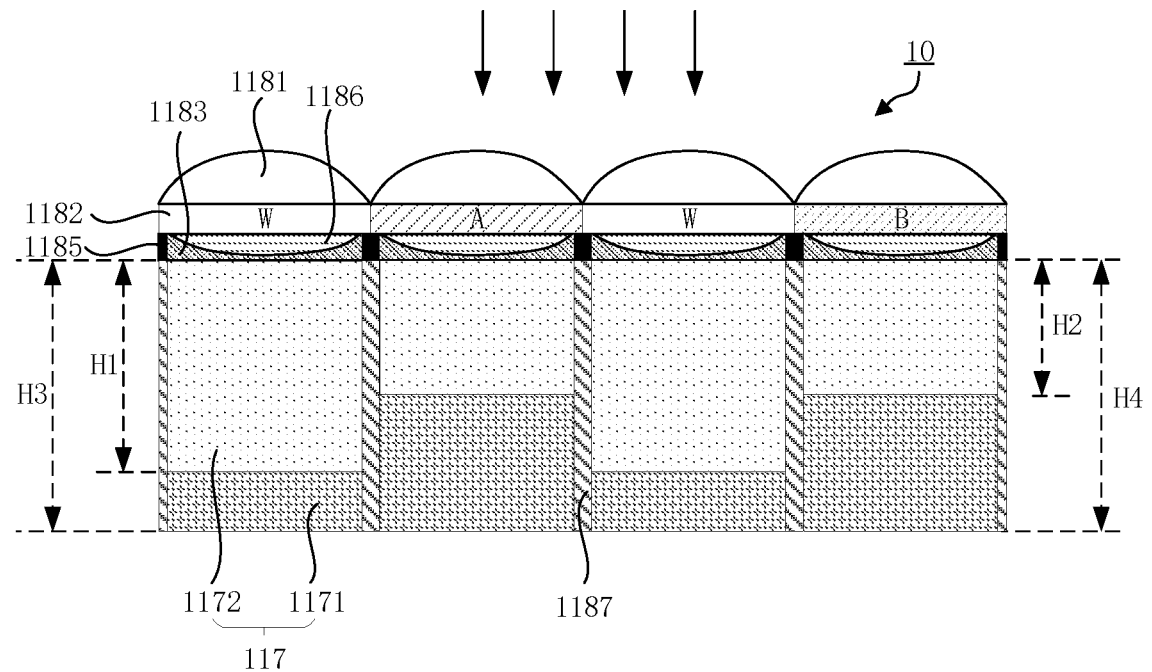
FIG. 15 is a partial sectional view of a pixel array according to yet another embodiment of the present disclosure.

Referring to FIG. 14 and FIG. 15, the image sensor 10 further includes a barrier layer 1187. The barrier layer 1187 can be arranged between the photoelectric conversion elements 117 of two adjacent pixels. For example, a barrier layer 1187 is arranged between the photoelectric conversion element 117 of the panchromatic pixel W and the photoelectric conversion element 117 of the color pixel A, and another barrier layer 1187 is arranged between the photoelectric conversion element 117 of the panchromatic pixel W and the photoelectric conversion element 117 of the color pixel B, etc. The barrier layer 1187 can be a deep trench isolation (DTI). The barrier layer 1187 prevents light in the photoelectric conversion element 117 of one pixel from entering the photoelectric conversion element 117 adjacent to the one pixel, avoiding the light causing noise for the photoelectric conversion elements 117 of other pixels.

In addition to that the conversion gain of the color pixel is set to be greater than the conversion gain of the panchromatic pixel as described above, in the embodiments of the present disclosure, the color pixels with different colors may be designed with different conversion gains. Specifically, the conversion gain corresponding to the sensitivity of the color pixel can be set based on the sensitivity of the color pixel (the shorter the time that the pixel needs to reach the saturation exposure amount, the higher the sensitivity). For example, as illustrated in FIG. 1, the sensitivity of the green pixel>the sensitivity of the red pixel>the sensitivity of the blue pixel, the conversion gains of the color pixels can be set to be: the conversion gain of the green pixel<the conversion gain of the red pixel<the conversion gain of the blue pixel. In order to change the conversion gain of the color pixel, the additional capacitor 119 may be added.

In addition to that the full-well capacity of the panchromatic pixel is set to be greater than the full-well capacity of the color pixel as described above, the color pixels with different colors may be designed with different full-well capacities in the embodiments of the present disclosure. Specifically, the full-well capacity of the color pixel may be set in accordance with the sensitivity of the color pixel. For example, as illustrated in FIG. 1, the sensitivity of the green pixel>the sensitivity of the red pixel>the sensitivity of the blue pixel, and thus the full-well capacity of the color pixels can be set to be: the full-well capacity of the green pixel>the full-well capacity of the red pixel>the full-well capacity of the blue pixel. The full-well capacity of the color pixel can be increased in the similar manner as the panchromatic pixel. For example, when the cross-sections of the n-potential well layers 1172 of the respective pixels have the same area, that is, $S_W=S_G=S_R=S_B$, the depths of the n-potential well layers 1172 of respective pixels may satisfy a relation of $H_W>H_G>H_R>H_B$. For example, when the depths of the n-potential well layers 1172 of the respective pixels are the same, i.e., $H_W=H_G=H_R=H_B$, the areas of the cross-sections of the n-potential well layers 1172 of respective pixels may satisfy a relation of $S_W>S_G>S_R>S_B$, and other cases are not described in detail herein. In this way, different full-well capacities can be set based on different sensitivities, so as to balance the exposures of pixels with respective colors and improve the quality of the captured image.

In addition to that the conversion gain of the color pixel is set to be greater than that of the panchromatic pixel, the exposure time of the panchromatic pixel and the exposure time of color pixel may be controlled independently to balance the exposures of the panchromatic pixel and the color pixel. Alternatively, in addition to that the conversion gain of the color pixel is set to be greater than that of the panchromatic pixel and the full-well capacity of the panchromatic pixel is set to be greater than the full-well capacity of the color pixel, the exposure time of the panchromatic pixel and the exposure time of color pixel can be controlled independently to balance the exposures of the panchromatic pixel and the color pixel.

Figure 16:
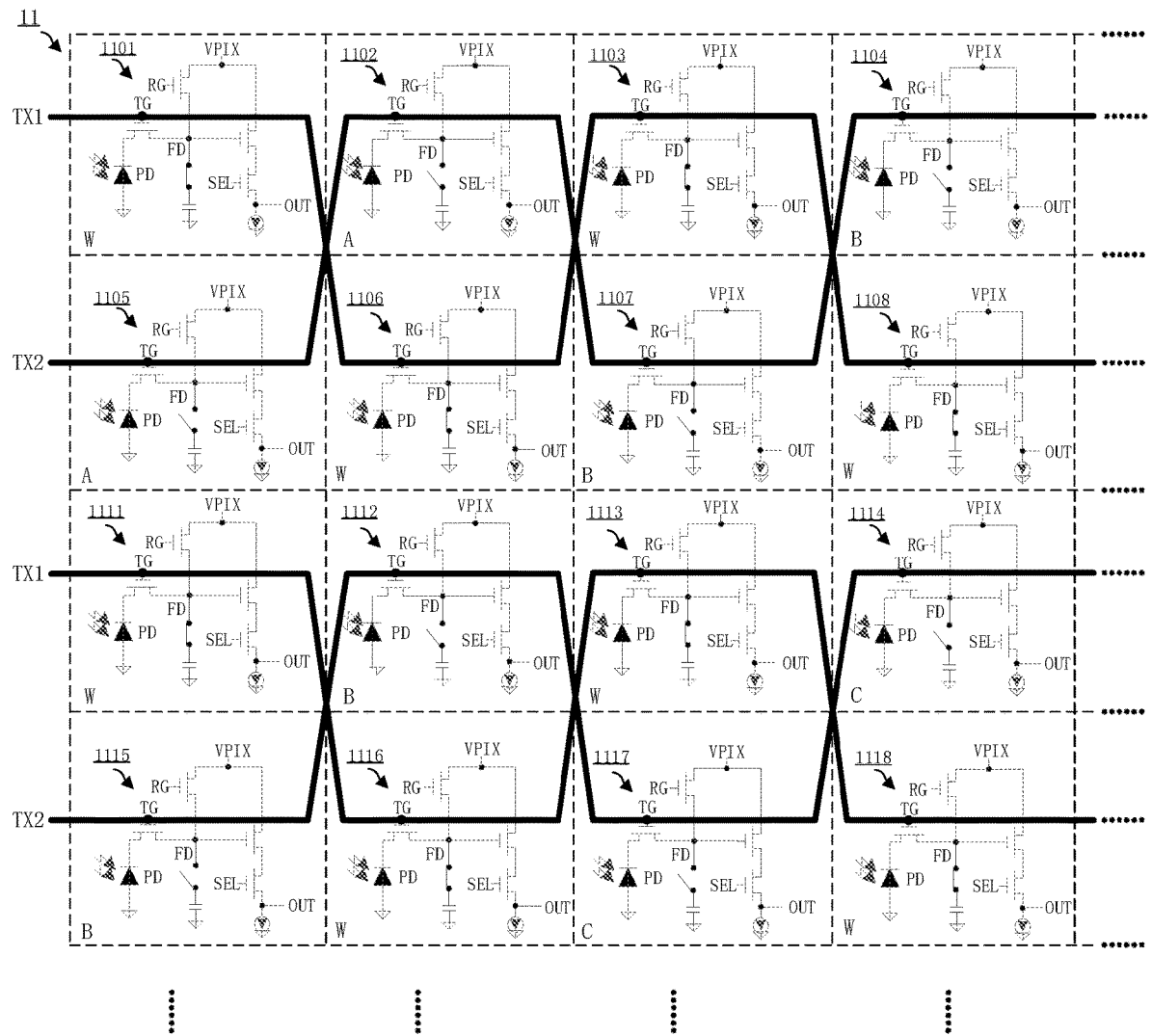
FIG. 16 is a schematic diagram illustrating connections of a pixel array and exposure control lines in an embodiment of the present disclosure.

FIG. 16 is a schematic diagram illustrating a connection of a pixel array and exposure control lines according to an embodiment of the present disclosure. The pixel array 11 is a two-dimensional pixel array. The two-dimensional pixel array includes a plurality of panchromatic pixels and a plurality of color pixels. Each color pixel has a narrower spectral response than each panchromatic pixel. The pixels in the pixel array 11 are arranged in such a manner:

W A W B
A W B W
W B W C
B W C W.

It should be noted that, for the purpose of illustration, FIG. 16 only illustrate some pixels in the pixel array 11, and other pixels and lines around these pixels are indicated by the ellipsis " . . . ".

As illustrated in FIG. 16, the pixels 1101, 1103, 1106, 1108, 1111, 1113, 1116, and 1118 are panchromatic pixels W, and the pixels 1102, 1105 are first color pixels A (e.g., red pixels R), the pixels 1104, 1107, 1112, 1115 are second color pixels B (e.g., green pixels G), and the pixels 1114, 1117 are third color pixels C (e.g., blue pixels Bu). In view of FIG. 16, the control terminals TG of the exposure control circuits in the panchromatic pixels W (pixels 1101, 1103, 1106 and 1108) are connected to a first exposure control line TX1, and the control terminals TG of the exposure control circuits in the panchromatic pixels W (pixels 1111, 1113, 1116, and 1118) are connected to another first exposure control line TX1; the control terminals TG of the exposure control circuits in the first color pixels A (pixels 1102, 1105) and the control terminals TG of the exposure control circuits in the second color pixels B (pixel 1104, 1107) are connected to a second exposure control line TX2; the control terminals TG of the exposure control circuits in the second color pixels B (pixels 1112, 1115) and the control terminals TG of the exposure control circuits in the third color pixels C (pixels 1114, 1117) are connected to another second exposure control line TX2. Each first exposure control lines TX1 controls the exposure time of the panchromatic pixels through a first exposure control signal, and each second exposure control line TX2 controls the exposure time of the color pixels (e.g., the first color pixels A and the second color pixels B, the second color pixels B and the third color pixels C) through a second exposure control signal. In this way, the exposure time of the panchromatic pixels and the color pixels can be independently controlled. For example, at the end of the exposure of the panchromatic pixels, the color pixels can continue to be exposed to achieve the desired imaging effect.

Referring to FIG. 2 and FIG. 16, the first exposure control line TX1 and the second exposure control line TX2 are connected to the vertical drive unit 12 in FIG. 2, and a corresponding exposure control signal in the vertical drive unit 12 can be transmitted to the control terminals TG of the exposure control circuits in the pixels in the pixel array 11.

It can be appreciated that, due to the presence of a plurality of rows of pixels in the pixel array 11, the vertical drive unit 12 is connected to a plurality of first exposure control lines TX1 and a plurality of second exposure control lines TX2. The plurality of first exposure control lines TX1 and the plurality of second exposure control lines TX2 correspond to the plurality of rows of pixels.

For example, a first one of the first exposure control lines TX1 corresponds to the panchromatic pixels in the first and second rows, a second one of the first exposure control lines TX1 corresponds to the panchromatic pixels in the third and fourth rows, a third one of the first exposure control lines TX1 corresponds the panchromatic pixels in the fifth and sixth rows, and a fourth one of the first exposure control lines TX1 corresponds to the panchromatic pixels in the seventh and eighth rows. The correspondence between the first exposure control lines TX1 and the panchromatic pixels in the following rows will not be further described and repeated. The signal timings transmitted by different first exposure control lines TX1 may be different and configured by the vertical drive unit 12.

For example, a first one of the second exposure control lines TX2 corresponds to the color pixels in the first and second rows, a second one of the second exposure control lines TX2 corresponds to the color pixels in the third and fourth rows, a third one of the second exposure control lines TX2 corresponds to the color pixels in the fifth and sixth rows, and a fourth one of the second exposure control lines TX2 corresponds to the color pixels in the seventh and eighth rows. The correspondence between the second exposure control lines TX2 and the color pixels in the following rows will not be further described and repeated. The signal timings transmitted by different second exposure control lines TX2 may be different and configured by the vertical drive unit 12.

FIG. 17 to FIG. 32 illustrate various examples of arrangements of pixels in an image sensor 10 (as illustrated in FIG. 2). Referring to FIG. 2 and FIG. 17 to FIG. 32, the image sensor 10 includes a two-dimensional pixel array (i.e., the pixel array 11 as illustrated in FIG. 16) consisting a plurality of color pixels (e.g., first color pixels A, second color pixels B, and third color pixels C) and a plurality of panchromatic pixels W. The color pixels have a narrower spectral response than the panchromatic pixels. The response spectrum of the color pixel is, for example, part of response spectrum of the panchromatic pixel W. The two-dimensional pixel array includes minimum repeating units. FIG. 17 to FIG. 32 illustrates various examples of the minimum repeating units of pixels in the image sensor. The two-dimensional pixel array consists of the minimum repeating units, which are repeatedly arranged in rows and columns. In the minimum repeating unit, the panchromatic pixels W are arranged in a first diagonal direction D1, the color pixels are arranged in a second diagonal direction D2, and the first diagonal direction D1 is different from the second diagonal direction D2. The first exposure time of at least two adjacent panchromatic pixels in the first diagonal direction D1 is controlled by the first exposure signal, and the second exposure time of at least two adjacent color pixels in the second diagonal direction D2 is controlled by the second exposure signal, thereby independently control the exposure time of the panchromatic pixels and the exposure time of the color pixels. Each minimum repeating unit includes a plurality of sub-units, each of which includes a plurality of monochromatic pixels (such as first color pixels A, second color pixels B, or third color pixels C) and a plurality of panchromatic pixels W. For example, in conjunction with FIG. 3A and FIG. 16, pixels 1101 to 1108 and pixels 1111 to 1118 form a minimum repeating unit, in which the pixels 1101, 1103, 1106, 1108, 1111, 1113, 1116, and 1118 are panchromatic pixels, and the pixels 1102, 1104, 1105, 1107, 1112, 1114, 1115, and 1117 are color pixels. The pixels 1101, 1102, 1105, and 1106 form a sub-unit, in which the pixels 1101, 1106 are panchromatic pixels and the pixels 1102, 1105 are monochromatic pixels (e.g., the first color pixels A). The pixels 1103, 1104, 1107, and 1108 form a sub-unit, in which the pixels 1103, 1108 are panchromatic pixels and the pixels 1104, 1107 are monochromatic pixels (e.g., the second color pixels B). The pixels 1111, 1112, 1115, and 1116 form a sub-unit, in which the pixels 1111, 1116 are panchromatic pixels and the pixels 1112, 1115 are monochromatic pixels (e.g., the second color pixels B). The pixels 1113, 1114, 1117, and 1118 form a sub-unit, in which the pixels 1113, 1118 are panchromatic pixels and the pixels 1114, 1117 are monochromatic pixels (e.g., the third color pixels C).

For example, within one minimum repeating unit, the number of rows is equal to the number of columns. As an example, the minimum repeating unit may be, but not limited to, a minimum repeating unit of 4 rows and 4 columns, a minimum repeating unit of 6 rows and 6 columns, a minimum repeating unit of 8 rows and 8 columns, or a minimum repeating unit of 10 rows and 10 columns. For example, in the sub-unit of the minimum repeating unit, the number of rows is equal to the number of columns. As an example, the sub-unit may be, but not limited to, a sub-unit of 2 rows and 2 columns, a sub-unit of 3 rows and 3 columns, a sub-unit of 4 rows and 4 columns, or a sub-unit of 5 rows and 5 columns. Such an arrangement is conducive to balancing the resolution of images and color appearance both in a row direction and a column direction, thereby improving the display effect.

Figure 17:
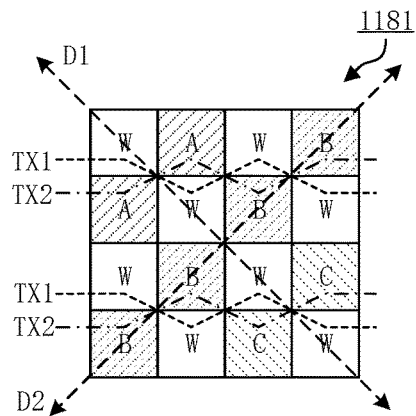
FIG. 17 is a schematic diagram illustrating a pixel arrangement of a minimum repeating unit in an embodiment of the present disclosure.

For example, FIG. 17 is a schematic diagram illustrating a pixel arrangement of a minimum repeating unit 1181 according to an embodiment of the present disclosure. In this embodiment, the minimum repeating unit includes 16 pixels arranged in 4 rows and 4 columns, and the sub-unit includes 4 pixels arranged in 2 rows and 2 columns, as the following arrangement:

W A W B
A W B W
W B W C
B W C W, where W represents the panchromatic pixel, A represents the first color pixel of the plurality of color pixels, B represents the second color pixel of the plurality of color pixels, and C represents the third color pixel of the plurality of color pixels.

For example, as illustrated in FIG. 17, the panchromatic pixels W are arranged in the first diagonal direction D1 (i.e., the direction of connecting the upper left corner and the lower right corner in FIG. 17), the color pixels are arranged in the second diagonal direction D2 (e.g., the direction of connecting the lower left corner and the upper right corner in FIG. 17), and the first diagonal direction D1 is different from the second diagonal direction D2. For example, the first diagonal is perpendicular to the second diagonal. The first exposure time of the two adjacent panchromatic pixels W in the first diagonal direction D1 (for example, the panchromatic pixel in the first row and the first column and the panchromatic pixel in the second row and the second column, counting from the top left) is controlled by the first exposure signal, and the second exposure time of at least two adjacent color pixels in the second diagonal direction D2 (for example, the color pixel B in the fourth row and the first column and the color pixel in the third row and the second column, counting from the top left) is controlled by the second exposure signal.

It should be noted that the first diagonal direction D1 and the second diagonal direction D2 are not limited to diagonals, and may include directions parallel to the diagonals. For example, in FIG. 16, the panchromatic pixels 1101, 1106, 1113, and 1118 are arranged in the first diagonal direction D1, the panchromatic pixels 1103 and 1108 are arranged in the first diagonal direction D1, the panchromatic pixels 1111 and 1116 are arranged in the first diagonal direction D1; and the second color pixels 1104, 1107, 1112, and 1115 are arranged in the second diagonal direction D2, the first color pixels 1102 and 1105 are arranged in the second diagonal direction D2, and the third color pixels 1114 and 1117 are arranged in the second diagonal direction D2. The explanations of the first diagonal direction D1 and the second diagonal direction D2 are also applicable to the embodiments illustrated in FIG. 18 to FIG. 32 below. The term "direction" is not a single pointing orientation, and it can be understood as a concept of a "straight line" for indicating an arrangement, which may have two pointing orientations at both ends of the straight line.

It can be appreciated that orientations or positional relations indicated by the terms "up," "down," "left," "right" here and below are based on the orientations or positional relations illustrated in the drawings, which are only intended to facilitate and simplify the description of the present disclosure, instead of indicating or implying that the involved devices or elements must take a specific orientation or must be constructed and operated in a specific orientation. Therefore, these terms shall not be construed as limitations of the present disclosure.

For example, as illustrated in FIG. 17, the panchromatic pixels in the first and second rows are connected through the first exposure control line TX1 having a "W"-shape, thereby independently controlling the exposure time of the panchromatic pixels. The color pixels (pixels A and B) in the first and second rows are connected through the second exposure control line TX2 having a "W"-shape, thereby independently controlling the exposure time of the color pixels. The panchromatic pixels in the third and fourth rows are connected through the first exposure control line TX1 having a "W"-shape, thereby independently controlling the exposure time of the panchromatic pixels. The color pixels (pixels B and C) in the third and fourth rows are connected through the second exposure control line TX2 having a "W"-shape, thereby independently controlling the exposure time of the color pixels. For example, the first exposure signal is transmitted via the first exposure control line TX1, and the second exposure signal is transmitted via the second exposure control line TX2. For example, the first exposure control line TX1 having the "W"-shape is electrically connected to the control terminals of the exposure control circuits in the panchromatic pixels in the two adjacent rows, and the second exposure control line TX2 having the "W"-shape is electrically connected to the control terminals of the exposure control circuits in the color pixels in the two adjacent rows. The specific connection manners can refer to the above description regarding the connection and the pixel circuit with reference to FIG. 3A and FIG. 16.

It should be noted that both the first exposure control line TX1 and the second exposure control line TX2 having a "W"-shape does not mean that the physical wire must be strictly arranged in the "W"-shape, as long as the connection corresponds to the arrangement of the panchromatic pixels and the color pixels. For example, the exposure control line having the "W"-shape corresponds to the pixel arrangement having the "W"-shape. In this way, the wire arrangement is simple, and the image resolution and the color of the pixel arrangement are relatively good, so as to independently control the exposure time of the panchromatic pixels and the exposure time of the color pixels with low-cost.

Figure 18:
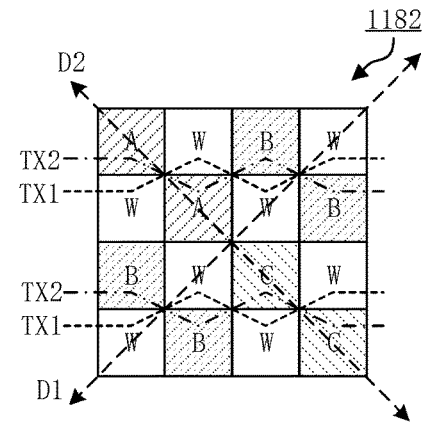
FIG. 18 is a schematic diagram illustrating a pixel arrangement of a minimum repeating unit according to another embodiment of the present disclosure.

For example, FIG. 18 is a schematic diagram illustrating a pixel arrangement of another minimum repeating unit 1182 according to an embodiment of the present disclosure. The minimum repeating unit includes 16 pixels arranged in 4 rows and 4 columns, and the sub-unit includes 4 pixels arranged in 2 rows and 2 columns, as the following arrangement:

A W B W
W A W B
B W C W
W B W C, where W represents the panchromatic pixel, A represents the first color pixel of the plurality of color pixels, B represents the second color pixel of the plurality of color pixels, and C represents the third color pixel of the plurality of color pixels.

For example, as illustrated in FIG. 18, the panchromatic pixels W are arranged in the first diagonal direction D1 (i.e., the direction of connecting the upper right corner and the lower left corner in FIG. 18), and the color pixels are arranged in the second diagonal direction D2 (for example, the direction of connecting the upper left corner and the lower right corner in FIG. 18). For example, the first diagonal is perpendicular to the second diagonal. The first exposure time of the two adjacent panchromatic pixels W in the first diagonal direction D1 (for example, the panchromatic pixel in the first row and the second column and the panchromatic pixel in the second row and the first column, counting from the top left) is controlled by the first exposure signal, and the second exposure time of at least two adjacent color pixels in the second diagonal direction D2 (for example, the color pixel A in the second row and the first row and the second column and the color pixel A in the second row and the second column, counting from the top left) is controlled by the second exposure signal.

For example, as illustrated in FIG. 18, the panchromatic pixels in the first and second rows are connected through the first exposure control line TX1 having a "W"-shape, so as to independently control the exposure time of the panchromatic pixels. The color pixels (pixels A and B) in the first and second rows are connected through the second exposure control line TX2 having a "W"-shape, so as to independently control the exposure time of the color pixels. The panchromatic pixels in the third and fourth rows are connected through the first exposure control line TX1 having a "W"-shape, so as to independently control the exposure time of the panchromatic pixels. The color pixels (pixels B and C) in the third and fourth rows are connected through the second exposure control line TX2 having a "W"-shape, so as to independently control the exposure time of the color pixels.

Figure 19:
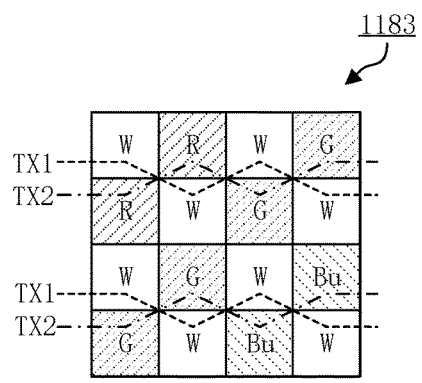
FIG. 19 is a schematic diagram illustrating a pixel arrangement of a minimum repeating unit according to yet another embodiment of the present disclosure.
Figure 20:
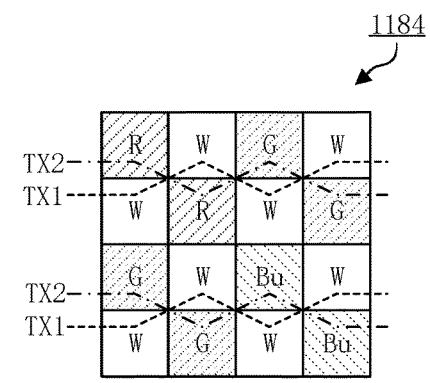
FIG. 20 is a schematic diagram illustrating a pixel arrangement of a minimum repeating unit according to yet another embodiment of the present disclosure.

For example, FIG. 19 is a schematic diagram illustrating a pixel arrangement of a minimum repeating unit 1183 according to yet another embodiment of the present disclosure. FIG. 20 is a schematic diagram illustrating a pixel arrangement of another minimum repeating unit 1184 in the embodiments of the present disclosure. The embodiments of FIG. 19 and FIG. 20 correspond to the arrangements of FIG. 17 and FIG. 18, respectively, where the first color pixel A is a red pixel R, the second color pixel B is a green pixel G, and the third color pixel C is a blue pixel Bu.

It should be noted that in some embodiments, a response band of the panchromatic pixel W is a visible light band (for example, ranging from 400 nm to 760 nm). As an example, the panchromatic pixel W is provided with an infrared filter for filtering infrared light. In some embodiments, the response band of the panchromatic pixel W is a visible light band and a near-infrared band (e.g., ranging from 400 nm to 1000 nm), which match a response band of the photoelectric conversion element 117 (e.g., the photodiode PD) in the image sensor 10. As another example, the panchromatic pixel W may not be provided with a filter, and the response band of the panchromatic pixel W is determined by the response band of the photodiode, i.e., their response bands match with each other. The embodiments of the present disclosure include, but are not limited to, the above band ranges.

Figure 21:
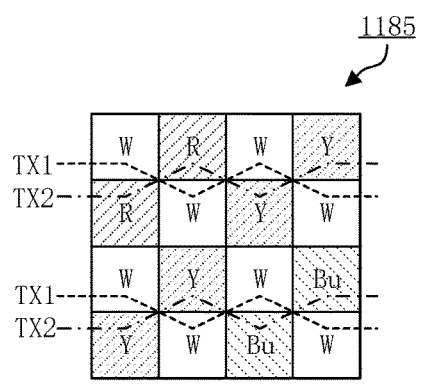
FIG. 21 is a schematic diagram illustrating a pixel arrangement of a minimum repeating unit according to yet another embodiment of the present disclosure.
Figure 22:
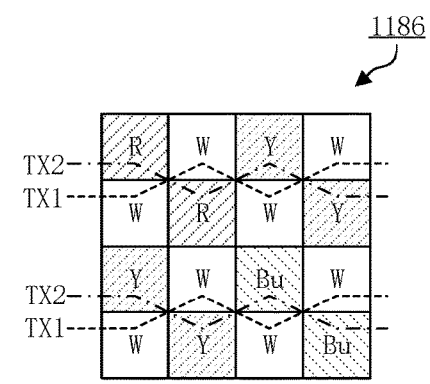
FIG. 22 is a schematic diagram illustrating a pixel arrangement of a minimum repeating unit according to yet another embodiment of the present disclosure.

For example, FIG. 21 is a schematic diagram illustrating a pixel arrangement of another minimum repeating unit 1185 according to an embodiment of the present disclosure. FIG. 22 is a schematic diagram illustrating a pixel arrangement of another minimum repeating unit 1186 according to an embodiment of the present disclosure. The embodiments of FIG. 21 and FIG. 22 correspond to the arrangements illustrated in FIG. 17 and FIG. 18, respectively, where the first color pixel A is a red pixel R, the second color pixel B is a yellow pixel Y, and the third color pixel C is a blue pixel Bu.

Figure 23:
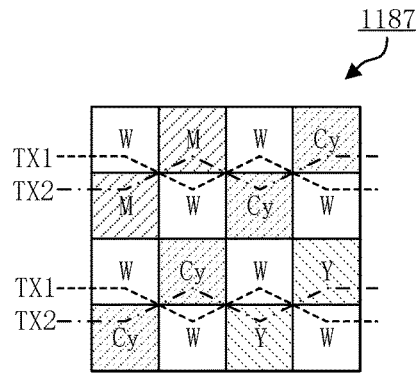
FIG. 23 is a schematic diagram illustrating a pixel arrangement of a minimum repeating unit according to yet another embodiment of the present disclosure.
Figure 24:
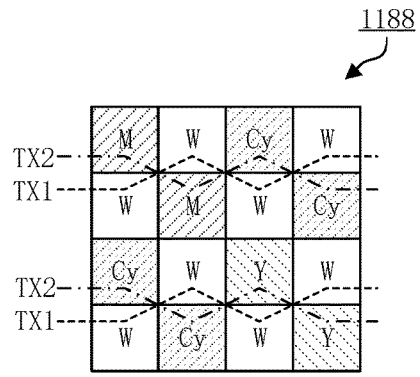
FIG. 24 is a schematic diagram illustrating a pixel arrangement of a minimum repeating unit according to yet another embodiment of the present disclosure.

For example, FIG. 23 is a schematic diagram illustrating a pixel arrangement of another minimum repeating unit 1187 according to an embodiment of the present disclosure. FIG. 24 is a schematic diagram illustrating a pixel arrangement of another minimum repeating unit 1188 according to an embodiment of the present disclosure. The embodiments of FIG. 23 and FIG. 24 correspond to the arrangements illustrated in FIG. 17 and FIG. 18, respectively, where the first color pixel A is a magenta pixel M, the second color pixel B is a cyan pixel Cy, and the third color pixel C is a yellow pixel Y.

Figure 25:
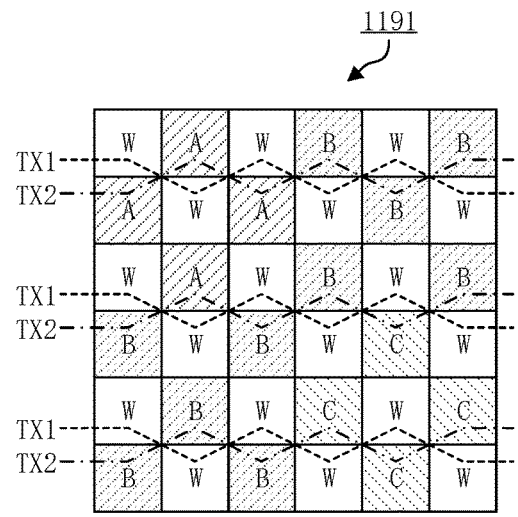
FIG. 25 is a schematic diagram illustrating a pixel arrangement of a minimum repeating unit according to yet another embodiment of the present disclosure.

For example, FIG. 25 is a schematic diagram illustrating a pixel arrangement of yet another minimum repeating unit 1191 according to an embodiment of the present disclosure. The minimum repeating unit includes 36 pixels arranged in 6 rows and 6 columns, and the sub-unit includes 9 pixels arranged in 3 rows and 3 columns, as the following arrangement:

W A W B W B
A W A W B W
W A W B W B
B W B W C W
W B W C W C
B W B W C W, where W represents the panchromatic pixel, A represents the first color pixel of the plurality of color pixels, B represents the second color pixel of the plurality of color pixels, and C represents the third color pixel of the plurality of color pixels.

For example, as illustrated in FIG. 25, the panchromatic pixels in the first and second rows are connected through the first exposure control line TX1 having a "W"-shape, so as to independently control the exposure time of the panchromatic pixels. The color pixels (pixels A and B) in the first and second rows are connected through the second exposure control line TX2 having a "W"-shape, so as to independently control the exposure time of the color pixels. The panchromatic pixels in the third and fourth rows are connected through the first exposure control line TX1 having a "W"-shape, so as to independently control the exposure time of the panchromatic pixels. The color pixels (pixels A, B and C) in the third and fourth rows are connected through the second exposure control line TX2 having a "W"-shape, so as to independently control the exposure time of the color pixels. The panchromatic pixels in the fifth and sixth rows are connected through the first exposure control line TX1 having a "W"-shape, so as to independently control the exposure time of the panchromatic pixels. The color pixels (pixels B and C) in the fifth and sixth rows are connected through the second exposure control line TX2 having a "W"-shape, so as to independently control the exposure time of the color pixels.

Figure 26:
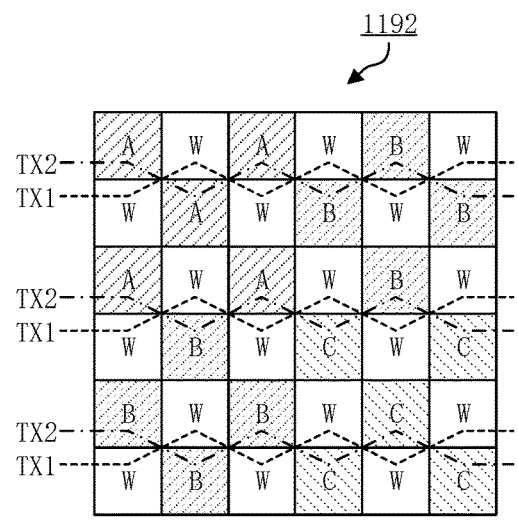
FIG. 26 is a schematic diagram illustrating a pixel arrangement of a minimum repeating unit according to yet another embodiment of the present disclosure.

For example, FIG. 26 is a schematic diagram illustrating a pixel arrangement of another minimum repeating unit 1192 according to an embodiment of the present disclosure. The minimum repeating unit includes 36 pixels arranged in 6 rows and 6 columns, and the sub-unit includes 9 pixels arranged in 3 rows and 3 columns, as the following arrangement:

A W A W B W
W A W B W B
A W A W B W
W B W C W C
B W B W C W
W B W C W C, where W represents the panchromatic pixel, A represents the first color pixel of the plurality of color pixels, B represents the second color pixel of the plurality of color pixels, and C represents the third color pixel of the plurality of color pixels.

For example, as illustrated in FIG. 26, the panchromatic pixels in the first and second rows are connected through the first exposure control line TX1 having a "W"-shape, so as to independently control the exposure time of the panchromatic pixels. The color pixels (pixels A and B) in the first and second rows are connected through the second exposure control line TX2 having a "W"-shape, so as to independently control the exposure time of the color pixels. The panchromatic pixels in the third and fourth rows are connected through the first exposure control line TX1 having a "W"-shape, so as to independently control the exposure time of the panchromatic pixels. The color pixels (pixels A, B and C) in the third and fourth rows are connected through the second exposure control line TX2 having a "W"-shape, so as to independently control the exposure time of the color pixels. The panchromatic pixels in the fifth and sixth rows are connected through the first exposure control line TX1 having a "W"-shape, so as to independently control the exposure time of the panchromatic pixels. The color pixels (pixels B and C) in the fifth and sixth rows are connected through the second exposure control line TX2 having a "W"-shape, so as to independently control the exposure time of the color pixels.

Figure 27:
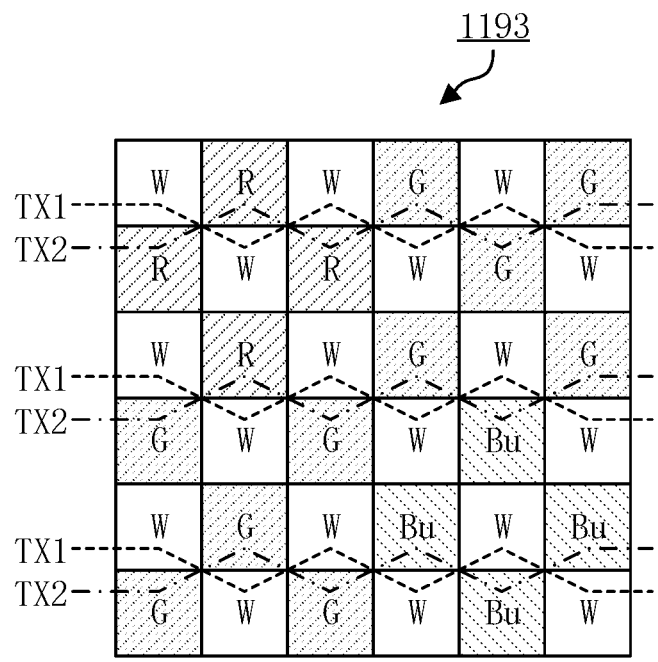
FIG. 27 is a schematic diagram illustrating a pixel arrangement of a minimum repeating unit according to yet another embodiment of the present disclosure.
Figure 28:
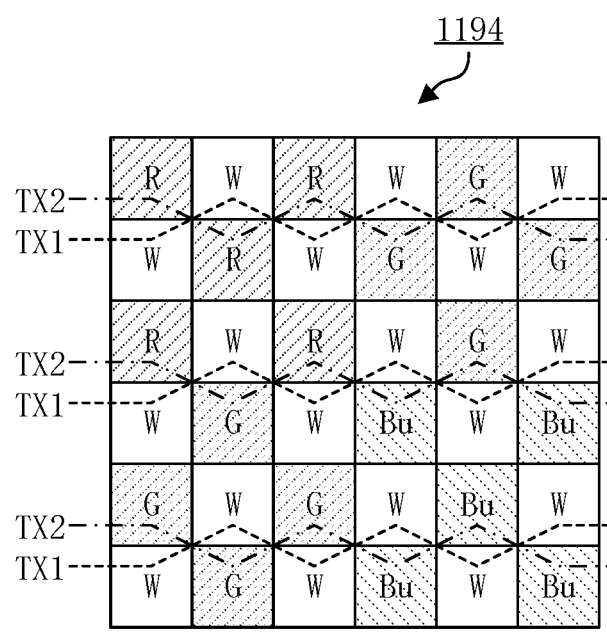
FIG. 28 is a schematic diagram illustrating a pixel arrangement of a minimum repeating unit according to yet another embodiment of the present disclosure.

For example, FIG. 27 is a schematic diagram illustrating a pixel arrangement of another minimum repeating unit 1193 according to an embodiment of the present disclosure. FIG. 28 is a schematic diagram illustrating a pixel arrangement of another minimum repeating unit 1194 according to an embodiment of the present disclosure. The embodiments of FIG. 27 and FIG. 28 correspond to the arrangements illustrated FIG. 25 and FIG. 26, respectively, where the first color pixel A is a red pixel R, the second color pixel B is a green pixel G, and the third color pixel C is a blue pixel Bu.

For example, in other embodiments, the first color pixel A is a red pixel R, the second color pixel B is a yellow pixel Y, and the third color pixel C is a blue pixel Bu. For example, in other embodiments, the first color pixel A is a magenta pixel M, the second color pixel B is a cyan pixel Cy, and the third color pixel C is a yellow pixel Y. The embodiments of the present disclosure are not limited to these examples. The specific connection of the circuits may refer to the above description and will not be repeated herein.

Figure 29:
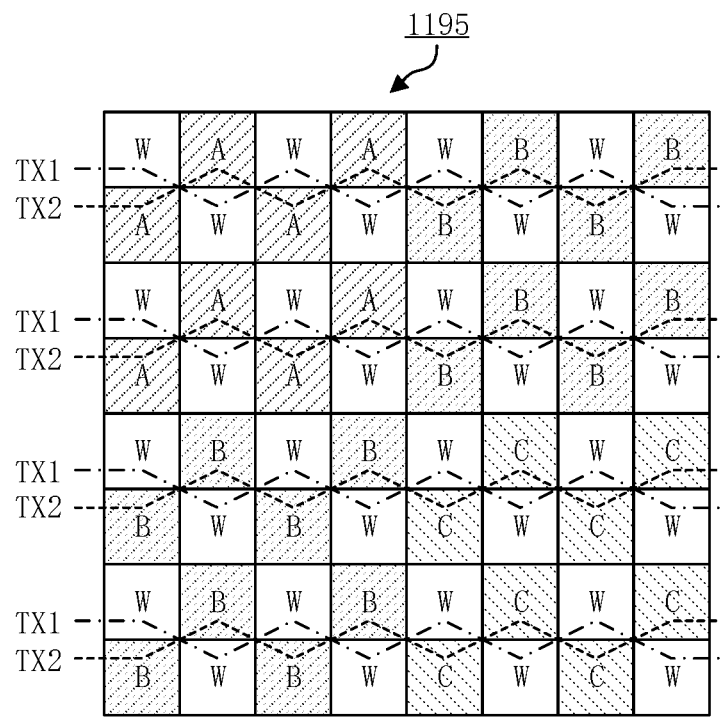
FIG. 29 is a schematic diagram illustrating a pixel arrangement of a minimum repeating unit according to yet another embodiment of the present disclosure.

For example, FIG. 29 is a schematic diagram illustrating a pixel arrangement of a minimum repeating unit 1195 according to an embodiment of the present disclosure. The minimum repeating unit includes 64 pixels arranged in 8 rows and 8 columns, and the sub-unit includes 16 pixels arranged in 4 rows and 4 columns, as the following arrangement:

W A W A W B W B
A W A W B W B W
W A W A W B W B
A W A W B W B W
W B W B W C W C
B W B W C W C W
W B W B W C W C
B W B W C W C W, where W represents the panchromatic pixel, A represents the first color pixel of the plurality of color pixels, B represents the second color pixel of the plurality of color pixels, and C represents the third color pixel of the plurality of color pixels.

For example, as illustrated in FIG. 29, the panchromatic pixels in the first and second rows are connected through the first exposure control line TX1 having a "W"-shape, so as to independently control the exposure time of the panchromatic pixels. The color pixels (pixels A and B) in the first and second rows are connected through the second exposure control line TX2 having a "W"-shape, so as to independently control the exposure time of the color pixels. The panchromatic pixels in the third and fourth rows are connected through the first exposure control line TX1 having a "W"-shape, so as to independently control the exposure time of the panchromatic pixels. The color pixels (pixels A and B) in the third and fourth rows are connected through the second exposure control line TX2 having a "W"-shape, so as to independently control the exposure time of the color pixels. The panchromatic pixels in the fifth and sixth rows are connected through the first exposure control line TX1 having a "W"-shape, so as to independently control the exposure time of the panchromatic pixels. The color pixels (pixels B and C) in the fifth and sixth rows are connected through the second exposure control line TX2 having a "W"-shape, so as to independently control the exposure time of the color pixels. The panchromatic pixels in the seventh and eighth rows are connected through the first exposure control line TX1 having a "W"-shape, so as to independently control the exposure time of the panchromatic pixels. The color pixels (pixels B and C) in the seventh and eighth rows are connected through the second exposure control line TX2 having a "W"-shape, so as to independently control the exposure time of the color pixels.

Figure 30:
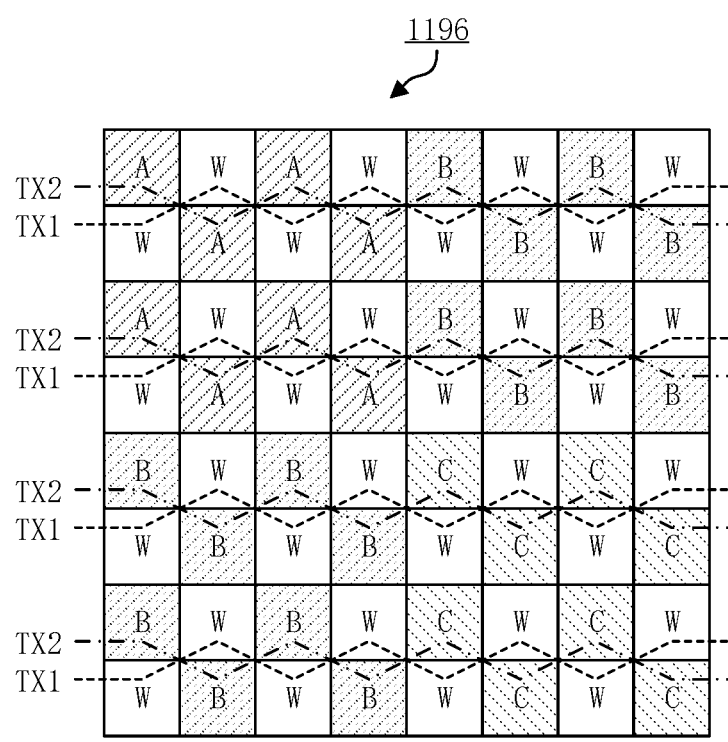
FIG. 30 is a schematic diagram illustrating a pixel arrangement of a minimum repeating unit according to yet another embodiment of the present disclosure.

For example, FIG. 30 is a schematic diagram illustrating a pixel arrangement of another minimum repeating unit 1196 according to an embodiment of the present disclosure. The minimum repeating unit includes 64 pixels arranged in 8 rows and 8 columns, and the sub-unit includes 16 pixels arranged in 4 rows and 4 columns, as the following arrangement:

A W A W B W B W
W A W A W B W B
A W A W B W B W

W A W A W B W B
B W B W C W C W
W B W B W C W C
B W B W C W C W
W B W B W C W C, where W represents the panchromatic pixel, A represents the first color pixel of the plurality of color pixels, B represents the second color pixel of the plurality of color pixels, and C represents the third color pixel of the plurality of color pixels.

For example, as illustrated in FIG. 30, the panchromatic pixels in the first and second rows are connected through the first exposure control line TX1 having a "W"-shape, so as to independently control the exposure time of the panchromatic pixels. The color pixels (pixels A and B) in the first and second rows are connected through the second exposure control line TX2 having a "W"-shape, so as to independently control the exposure time of the color pixels. The panchromatic pixels in the third and fourth rows are connected through the first exposure control line TX1 having a "W"-shape, so as to independently control the exposure time of the panchromatic pixels. The color pixels (pixels A and B) in the third and fourth rows are connected through the second exposure control line TX2 having a "W"-shape, so as to independently control the exposure time of the color pixels. The panchromatic pixels in the fifth and sixth rows are connected through the first exposure control line TX1 having a "W"-shape, so as to independently control the exposure time of the panchromatic pixels. The color pixels (pixels B and C) in the fifth and sixth rows are connected through the second exposure control line TX2 having a "W"-shape, so as to independently control the exposure time of the color pixels. The panchromatic pixels in the seventh and eighth rows are connected through the first exposure control line TX1 having a "W"-shape, so as to independently control the exposure time of the panchromatic pixels. The color pixels (pixels B and C) in the seventh and eighth rows are connected through the second exposure control line TX2 having a "W"-shape, so as to independently control the exposure time of the color pixels.

Figure 31:
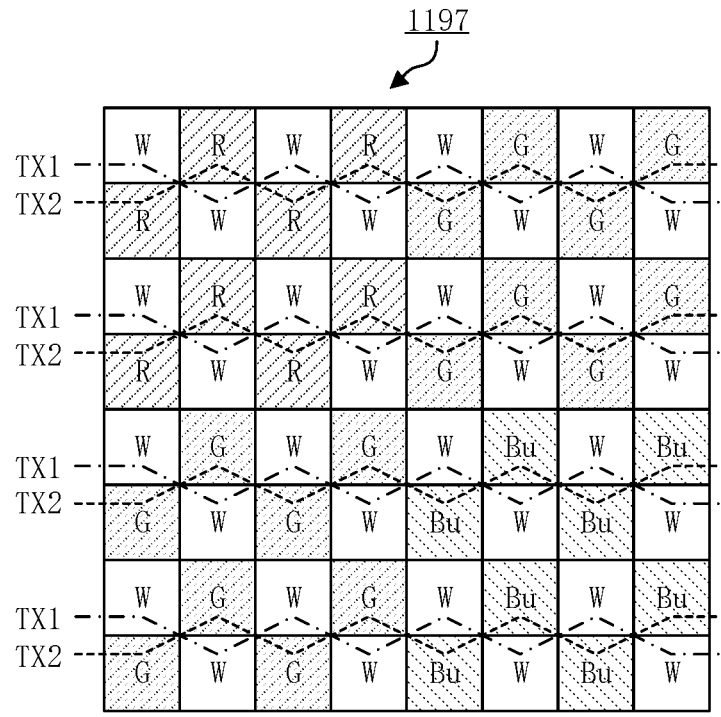
FIG. 31 is a schematic diagram illustrating a pixel arrangement of a minimum repeating unit according to yet another embodiment of the present disclosure.
Figure 32:
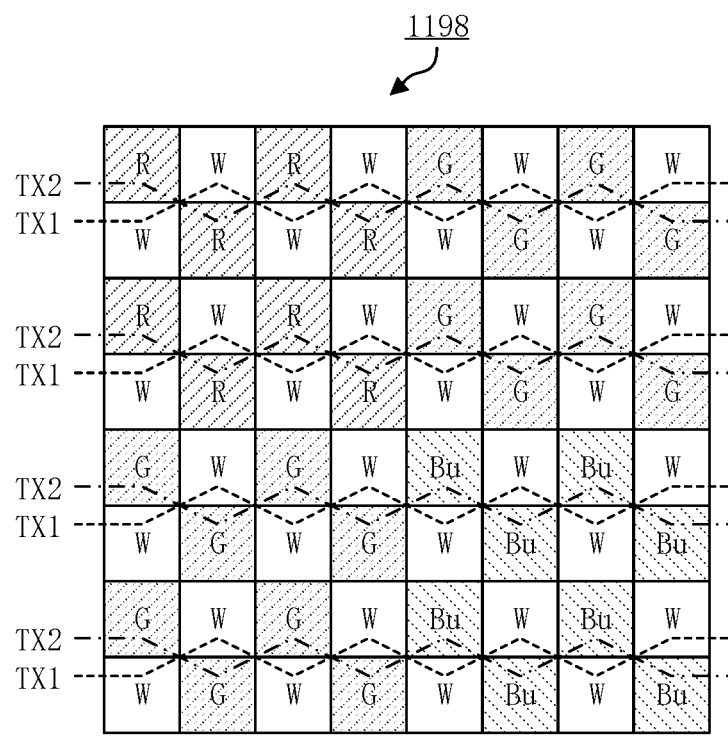
FIG. 32 is a schematic diagram illustrating a pixel arrangement of a minimum repeating unit according to yet another embodiment of the present disclosure.

For example, FIG. 31 is a schematic diagram illustrating a pixel arrangement of another minimum repeating unit 1197 according to an embodiment of the present disclosure. FIG. 32 is a schematic diagram illustrating a pixel arrangement of another minimum repeating unit 1198 according to an embodiment of the present disclosure. The embodiments of FIG. 31 and FIG. 32 correspond to the arrangements illustrated FIG. 29 and FIG. 30, respectively, where the first color pixel A is a red pixel R, the second color pixel B is a green pixel G, and the third color pixel C is a blue pixel Bu.

For example, in other embodiments, the first color pixel A is a red pixel R, the second color pixel B is a yellow pixel Y, and the third color pixel C is a blue pixel Bu. For example, in other embodiments, the first color pixel A is a magenta pixel M, the second color pixel B is a cyan pixel Cy, and the third color pixel C is a yellow pixel Y. The embodiments of the present disclosure are not limited to these examples. The specific connection of the circuits may refer to the above description and will not be repeated herein.

In view of the above embodiments, as illustrated in FIG. 17 to FIG. 32, the image sensor 10 (as illustrated in FIG. 2) includes the plurality of color pixels and the plurality of panchromatic pixels W arranged in the array, where the color pixels and the panchromatic pixels are arranged at intervals in the row and column direction.

For example, the panchromatic pixel, the color pixels, the panchromatic pixel, the color pixel, . . . are arranged sequentially and alternately in the row direction.

For example, the panchromatic pixel, the color pixels, the panchromatic pixel, the color pixel, . . . are arranged sequentially and alternately in the column direction.

With reference to FIG. 16, the first exposure control line TX1 is electrically connected to the control terminals TG of the exposure control circuits 116 (e.g., the gate of the transfer transistor 112) in the panchromatic pixels W in the (2n−1)-th and 2n-th rows; and the second exposure control line TX2 is electrically connected to the control terminals TG of the exposure control circuits 116 (e.g., the gate of the transfer transistor 112) in the color pixels in the (2n−1)-th and 2n-th rows, where n is a natural number greater than or equal to 1.

For example, when n is equal to 1, the first exposure control line TX1 is electrically connected to the control terminals TG of the exposure control circuits 116 in the panchromatic pixels W in the first and second rows, and the second exposure control line TX2 is electrically connected to the control terminals TG of the exposure control circuits 116 in the color pixels in the first and second rows. When n is equal to 2, the first exposure control line TX1 is electrically connected to the control terminals TG of the exposure control circuits 116 in the panchromatic pixels W in the third and fourth rows, and the second exposure control line TX2 is electrically connected to the control terminals TG of the exposure control circuits 116 in the color pixels in the third and fourth rows.

In some embodiments, the first exposure time is shorter than the second exposure time. The first exposure time is determined by the n-potential well layer 1172 of the panchromatic pixel (as illustrated in FIG. 4A), and the second exposure time can be determined by the n-potential well layer 1172 of the color pixel (as illustrated in FIG. 4A).

Referring to FIG. 33, the present disclosure provides a camera assembly 40. The camera assembly 40 includes the image sensor 10 according to any one of the above embodiments, a processing chip 20, and a lens 30. The image sensor 10 is electrically connected to the processing chip 20. The lens 30 is arranged on a light path of the image sensor 10. The processing chip 20 together with the image sensor 10 and the lens 30 can be encapsulated in the same housing of the camera assembly 40, or the image sensor 10 and the lens 30 can be encapsulated in the housing and the processing chip 20 is disposed outside the housing.

Figure 34:
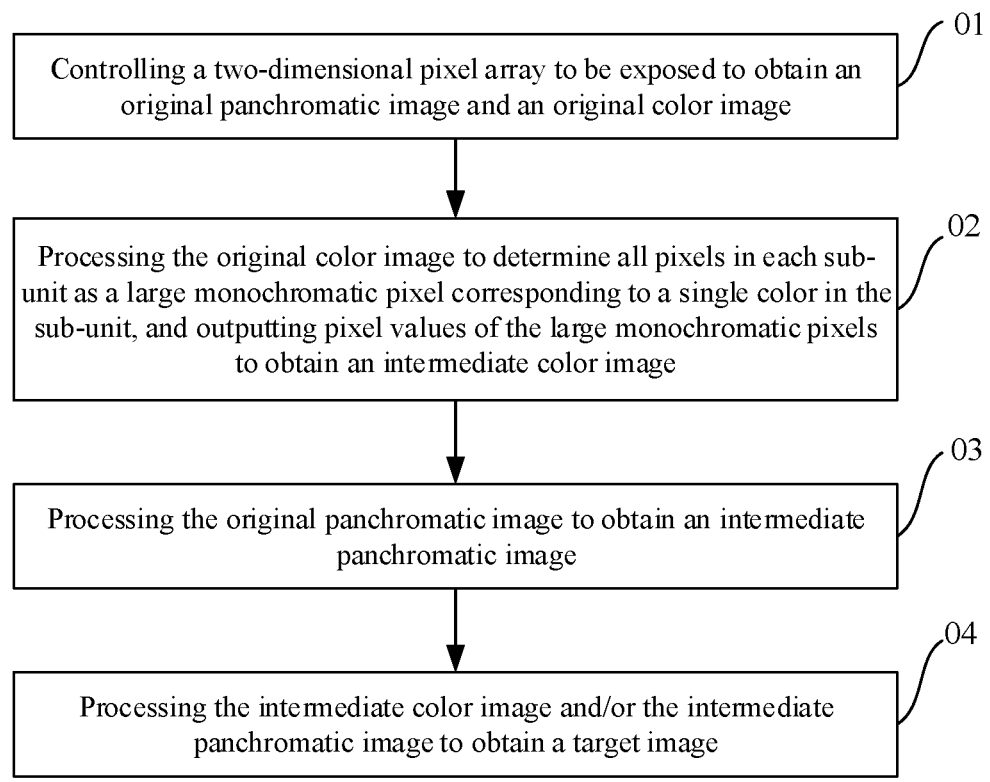
FIG. 34 is a schematic flowchart of an image capturing method in some embodiments of the present disclosure.

The present disclosure provides an image capturing method that can be applied in the camera assembly 40 of FIG. 33. As illustrated in FIG. 34, the image capturing method includes the following action blocks.

At block 01, a two-dimensional pixel array is controlled to be exposed to obtain an original panchromatic image and an original color image.

At block 02, the original color image is processed to determine the pixels in each sub-unit as a large monochromatic pixel corresponding to a single color in the sub-unit, and output a pixel value of the large monochromic pixel to obtain an intermediate color image.

At block 03, the original panchromatic image is processed to obtain an intermediate panchromatic image.

At block 04, the intermediate color image and/or the intermediate panchromatic image are processed to obtain a target image.

Referring to FIG. 2 and FIG. 33, the image capturing method of the present disclosure can be implemented by the camera assembly 40. Block 01 can be implemented by the image sensor 10. Blocks 02, 03 and 04 can be implemented by the processing chip 20. That is to say, the image sensor 10 can be exposed to obtain the original panchromatic image and the original color image. The processing chip 20 can be configured to process the original color image to determine the pixels in each sub-unit as the large monochromatic pixel corresponding to the single color in the sub-unit, and output the pixel value of the large monochromic pixel to obtain the intermediate color image. The processing chip 20 can be further configured to process the original panchromatic image to obtain the intermediate panchromatic image, and process the intermediate color image and/or the intermediate panchromatic image to obtain the target image.

Figure 35:
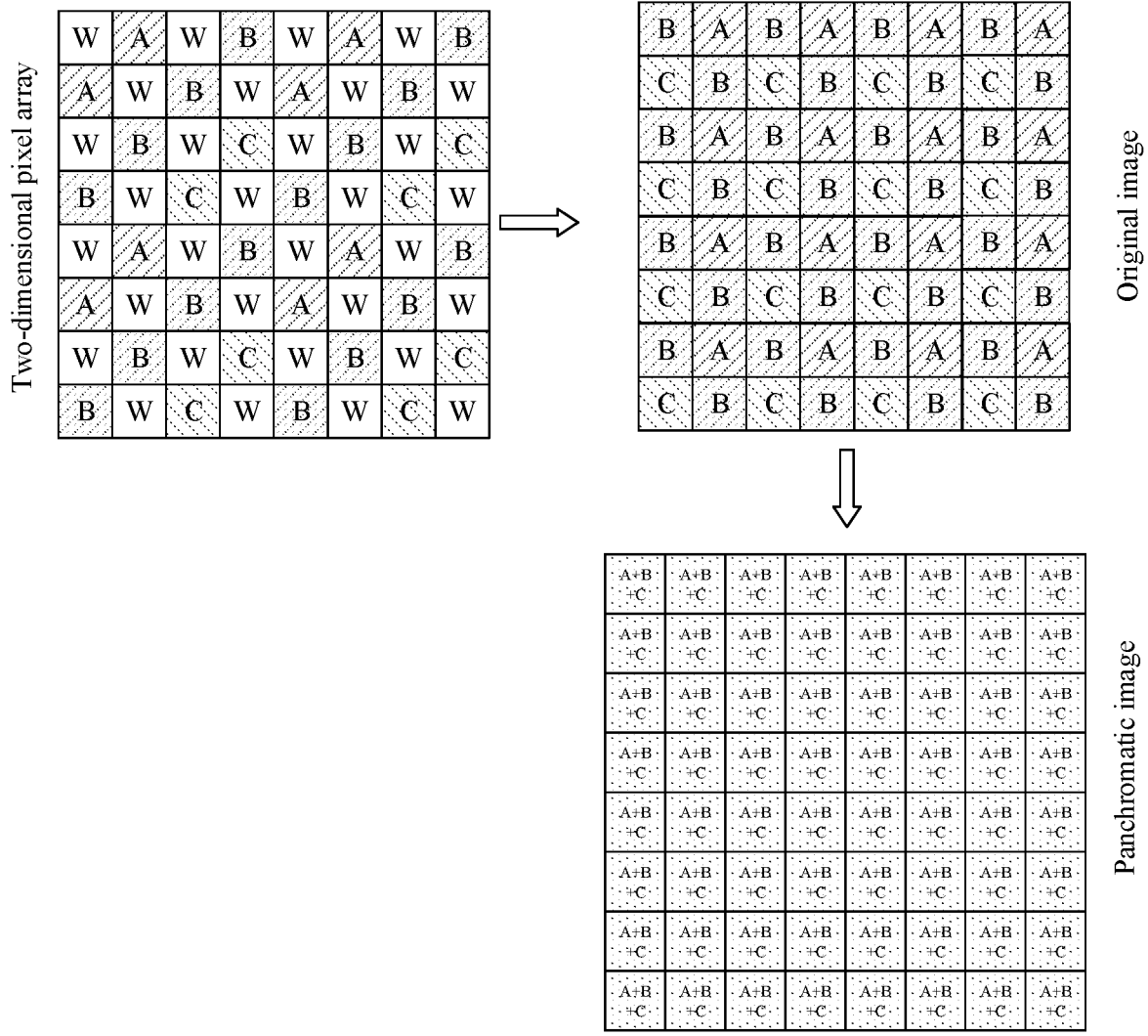
FIG. 35 is a schematic diagram illustrating a principle of an image capturing method in related art.

With reference to FIG. 35, in the related art, if the pixel array of the image sensor includes the panchromatic pixels and the color pixels at the same time, during the operation of the image sensor, the image sensor will fit a pixel value of each panchromatic pixel in the pixel array into pixel values of other color pixels, in order to output an original image only including the color pixels. Specifically, as an example, in which the pixel A is a red pixel R, the pixel B is a green pixel G and pixel C is a blue pixel Bu, the column processing unit in the image sensor reads pixel values of a plurality of red pixels R, pixel values of a plurality of green pixels G, pixel values of a plurality of blue pixels Bu, and pixel values of a plurality of panchromatic pixels W, and the image sensor will fit the pixel value of each panchromatic pixel W to the red pixel R, the green pixel G, and the blue pixel that are adjacent to the panchromatic pixel, and convert an image arranged in a non-Bayer array into an original image arranged in a Bayer array and output the original image arranged in the Bayer array for subsequent processing by the processing chip, for example, interpolating the original image to obtain a full-color image (the pixel value of each pixel in the full-color image are made up of three components: red, green, and blue). In this processing method, the image sensor needs to perform relatively complex algorithms and relatively large computation burden. In addition, since the Qualcomm platform does not support the processing of images in the non-Bayer array, additional hardware (e.g., additional processing chips) may be necessarily added in the image sensor to perform the processing of converting images arranged in the non-Bayer array into original images arranged in the Bayer array.

The image capturing method and the camera assembly 40 of the present disclosure can reduce the computation burden of the image sensor and omit additional hardware to be added in the image sensor.

Figure 36:
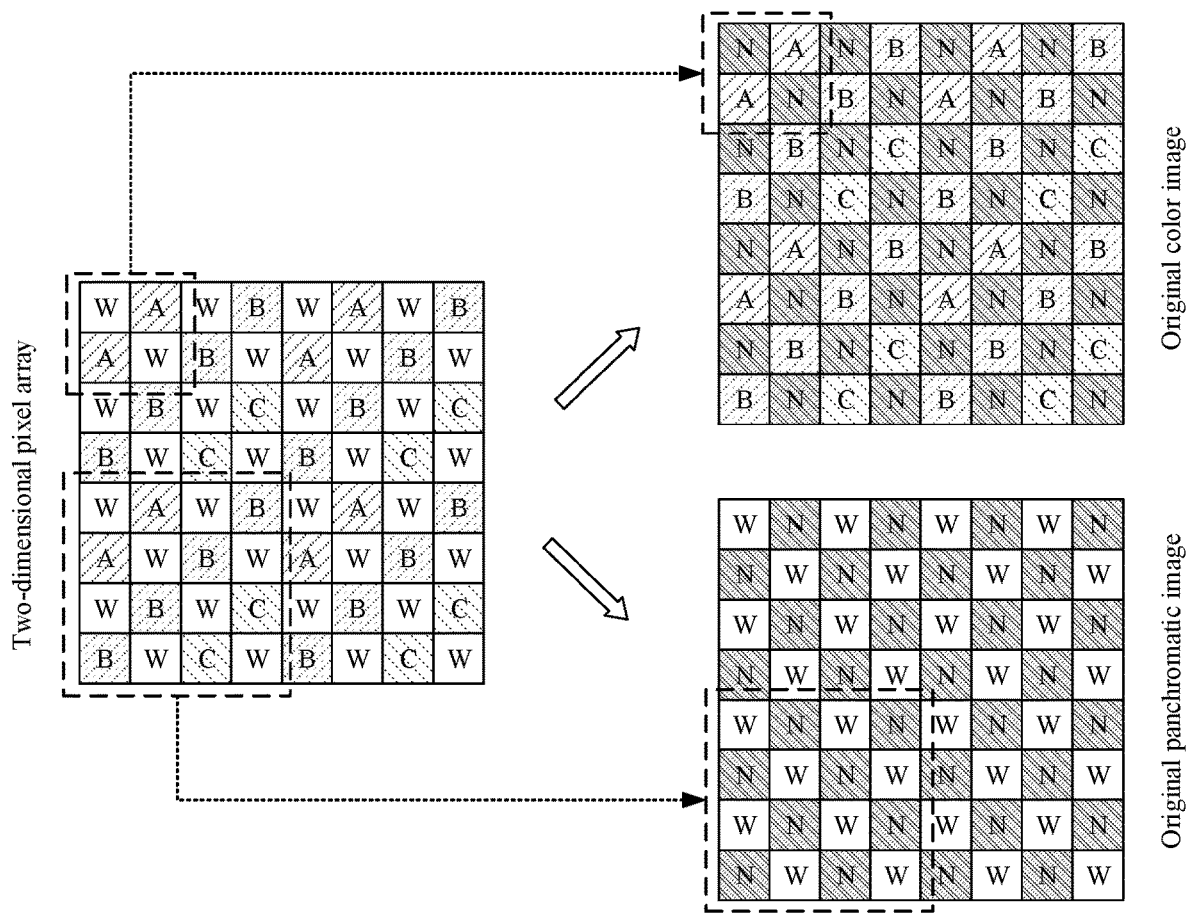
FIG. 36 is a schematic diagram illustrating a principle of an image capturing method in an embodiment of the present disclosure.

Specifically, in conjunction with FIG. 2 and FIG. 36, when the user requests to take a picture, the vertical drive unit 12 in the image sensor 10 controls the plurality of panchromatic pixels and the plurality of color pixels in the two-dimensional pixel array to be exposed, and the column processing unit 14 reads a pixel value of each panchromatic pixel and a pixel value of each color pixel. The image sensor 10 does not perform the operation of fitting the pixel value of the panchromatic pixel to the pixel value of the color pixel, but directly outputs an original panchromatic image in accordance with the pixel values of the plurality of panchromatic pixels and an original color image in accordance with the pixel values of the plurality of color pixels.

As illustrated in FIG. 36, the original panchromatic image includes a plurality of panchromatic pixels W and a plurality of null pixels N. The null pixel is neither a panchromatic pixel nor a color pixel, and the location of the null pixel N in the original panchromatic image can be considered as a position where no pixel is provided, or a pixel value of the null pixel can be considered to be zero. By comparing the two-dimensional pixel array with the original panchromatic image, for each sub-unit in the two-dimensional array, the sub-unit includes two panchromatic pixels W and two color pixels (color pixels A, color pixels B, or color pixels C). The original panchromatic image has sub-units corresponding to the respective sub-units in the two-dimensional pixel array, the sub-unit of the original panchromatic image includes two panchromatic pixels W and two null pixels N, and the locations of the two null pixels N correspond to the locations of the two color pixels in the sub-unit in the two-dimensional pixel array.

Similarly, the original color image includes a plurality of color pixels and a plurality of null pixels N. The null pixel is neither a panchromatic pixel nor a color pixel, and the location of the null pixel N in the original color image can be considered as a position where no pixel is provided, or the pixel value of the null pixel can be considered to be zero. By comparing the two-dimensional pixel array with the original color image, for each sub-unit in the two-dimensional array, the sub-unit includes two panchromatic pixels W and two color pixels. The original color image has sub-units corresponding to the respective sub-units in the two-dimensional pixel array, the sub-unit of the original color image includes two color pixels and two null pixels N, and the locations of the two null pixels N correspond to the locations of two panchromatic pixels W in the sub-unit in the two-dimensional pixel array.

Figure 37:
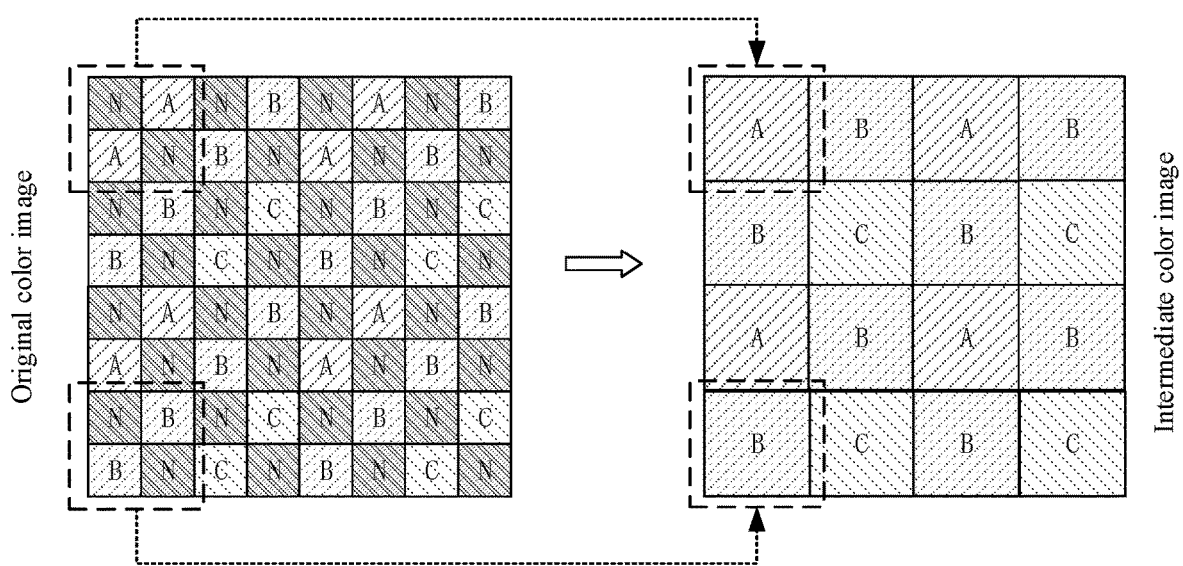
FIG. 37 is a schematic diagram illustrating another principle of an image capturing method in an embodiment of the present disclosure.

After the processing chip 20 receives the original panchromatic image and the original color image outputted from the image sensor 10, the processing chip 20 can further process the original panchromatic image to obtain the intermediate panchromatic image, and further process the original color image to obtain the intermediate color image. As an example, the original color image can be converted into the intermediate color image as illustrated in FIG. 37. As illustrated in FIG. 37, the original color image includes a plurality of sub-units, and each sub-unit includes a plurality of null pixels N and a plurality of single-color pixels (also known as monochromatic pixels). Specifically, some sub-units include two null pixels N and two monochromatic pixels A, some sub-units include two null pixels N and two monochromatic pixels B, and some sub-units include two null pixels N and two monochromatic pixels C. The processing chip 20 can determine: all the pixels in the sub-unit including the null pixels N and the monochromatic pixels A as a large monochromatic pixel A corresponding to the single color A in the sub-unit; all the pixels in the sub-unit including the null pixels N and the monochromatic pixels B as a large monochromatic pixel B corresponding to the single color B in the sub-unit; and all the pixels in the sub-unit including the null pixels N and the monochromatic pixels C as a large monochromatic pixel C corresponding to the single color C in the sub-unit. Thus, the processing chip 20 can form the intermediate color image based on a plurality large monochromatic pixels A, a plurality of large monochromatic pixels B, and a plurality of large monochromatic pixels C. If the original color image including the plurality of null pixels N is regarded as an image having a second resolution, the intermediate color image obtained in the manner as illustrated in FIG. 37 is an image having a first resolution, where the first resolution is smaller than the second resolution. After the processing chip 20 obtains the intermediate panchromatic image and the intermediate color image, the processing chip 20 can further process the intermediate panchromatic image and/or the intermediate color image to obtain the target image. Specifically, the processing chip 20 can process only the intermediate panchromatic image to obtain the target image; the processing chip 20 can process only the intermediate color image to obtain the target image; or the processing chip 20 can process both the intermediate panchromatic image and the intermediate color image to obtain the target image. The processing chip 20 can determine the processing manners of these two intermediate images according to the actual needs.

In the image capturing method according to the embodiments of the present disclosure, the image sensor 10 can directly output the original panchromatic image and the original color image, and the processing chip 20 performs the subsequent processing of the original panchromatic image and the original color image. In this way, the image sensor 10 is no longer required to perform the operation of fitting the pixel value of the panchromatic pixel W to the pixel value of the color pixel, so as to reduce the computation burden of the image sensor 10, and new hardware is no longer required to be added in the image sensor 10 to support the image processing of the image sensor 10, thereby resulting in a simplified design of the image sensor 10.

In some embodiments, block 01 of controlling the exposure of the two-dimensional pixel array to obtain the original panchromatic image and the original color image can be implemented in various manner.

Figure 38:
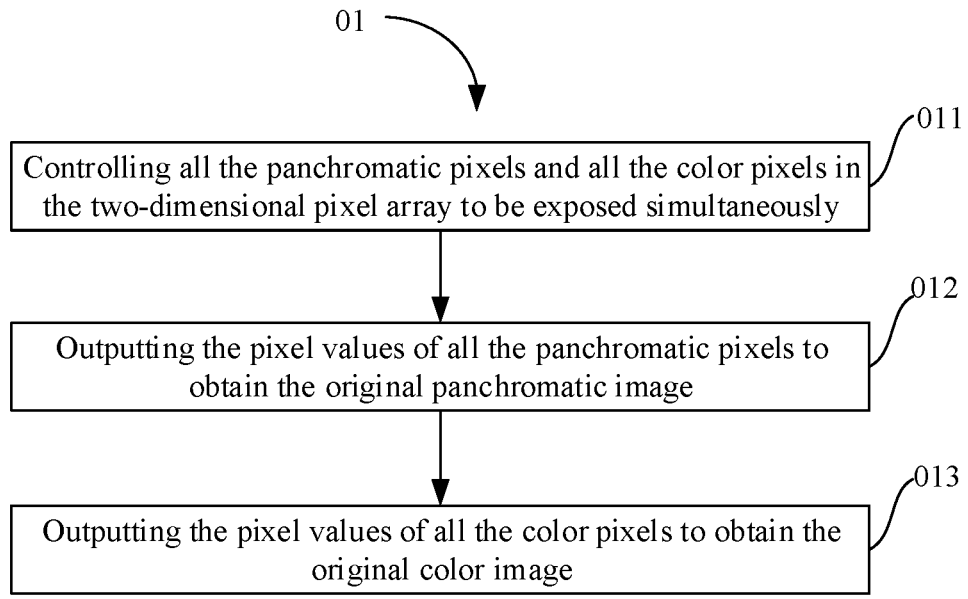
FIGS. 38 to 41 are schematic flowcharts of image capturing methods of some embodiments of the present disclosure.

Referring to FIG. 38, in an example, block 01 includes the following blocks 011 to 013.

At block 011, all the panchromatic pixels and all the color pixels in the two-dimensional pixel array are controlled to be exposed simultaneously.

At block 012, the pixel values of all the panchromatic pixels are outputted to obtain the original panchromatic image.

At block 013, the pixel values of all the color pixels are outputted to obtain the original color image.

Referring to FIG. 33, blocks 011, 012 and 013 can all be implemented by the image sensor 10. That is, all the panchromatic pixels and all the color pixels in image sensor 10 are exposed simultaneously. The image sensor 10 can output the pixel values of all the panchromatic pixels to obtain the original panchromatic image, and output the pixel values of all the color pixels to obtain the original color image.

In conjunction with FIG. 2 and FIG. 16, the panchromatic pixels and the color pixels can be exposed simultaneously, and the exposure time of the panchromatic pixels can be shorter than or equal to the exposure time of the color pixels. Specifically, when the first exposure time of the panchromatic pixels is equal to the second exposure time of the color pixels, the exposure of the panchromatic pixels can be started and ended at the same time as the exposure of the color pixels. When the first exposure time is shorter than the second exposure time, the exposure of the panchromatic pixels may be started later than or at the same time as the exposure of the color pixels, and the exposure of the panchromatic pixels may be ended earlier than the exposure of the color pixels. Alternatively, when the first exposure time is shorter than the second exposure time, the exposure of the panchromatic pixels may be started later than the exposure of the color pixels, and the exposure of the panchromatic pixels may be ended earlier than or at the same time as the exposure of the color pixels. When the exposure of the panchromatic pixels and the color pixels is finished, the image sensor 10 outputs the pixel values of all the panchromatic pixels to obtain the original panchromatic image, and outputs the pixel values of all color pixels to obtain the original color image. The original panchromatic image may be outputted earlier than the original color image, or the original color image may be outputted earlier than the original panchromatic image, or the original panchromatic image and the original color image may be outputted simultaneously. The sequential order of outputting the two is not limited herein. By simultaneously exposing the panchromatic pixels and the color pixels, the original panchromatic image and the original color image can be obtained in a shorter time period, and the process for obtaining the original panchromatic image and the original color image can be accelerated. In the mode requiring high image-output speed such as fast-shooting and continuous-shooting, it is of great advantage to expose the panchromatic pixels and the color pixels simultaneously.

Figure 39:
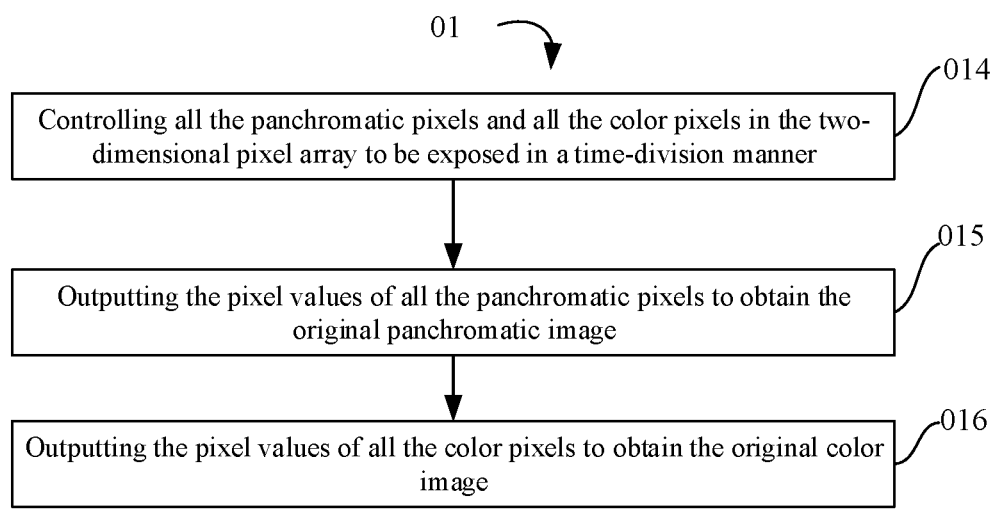

Referring to FIG. 39, in another example, block 01 includes the following blocks 014 to 016.

At block 014, all the panchromatic pixels and all the color pixels in the two-dimensional pixel array are controlled in a time-division manner.

At block 015, the pixel values of all the panchromatic pixels are outputted to obtain the original panchromatic image; and At block 016, the pixel values of all the color pixels are outputted to obtain the original color image.

Referring to FIG. 33, blocks 014, 015 and 016 can all be implemented by the image sensor 10. That is, all the panchromatic pixels and all color pixels in the image sensor 10 are exposed in a time-division manner. The image sensor 10 outputs the pixel values of all the panchromatic pixels to obtain the original panchromatic image, and outputs the pixel values of all the color pixels to obtain the original color image.

Specifically, the panchromatic pixels and the color pixels can be exposed in a time-division manner, where the exposure time of the panchromatic pixels can be shorter than or equal to the exposure time of color pixels. Specifically, regardless of whether the first exposure time is equal to the second exposure time, all the panchromatic pixels and all the color pixels can be exposed in the time-division manner. For example, (1) all the panchromatic pixels are exposed for the first exposure time, and subsequently, all the color pixels are exposed for the second exposure time; or (2) all the color pixels are exposed for the second exposure time, and subsequently, all the panchromatic pixels are exposed for the first exposure time. When the exposure of the panchromatic pixels and the exposure of the color pixels are finished, the image sensor 10 outputs the pixel values of all the panchromatic pixels to obtain the original panchromatic image, and outputs the pixel values of all color pixels to obtain the original color image. The original panchromatic image and the original color image can be outputted in the following manners: (1) when the panchromatic pixels are exposed prior to the color pixels, the image sensor 10 can output the original panchromatic image during the exposure of the color pixels or output the original panchromatic image and the original color image in sequence after the color pixels have been exposed; (2) when the color pixels are exposed prior to the panchromatic pixel, the image sensor 10 can output the original color image during the exposure of the panchromatic pixels or output the original color image and the original panchromatic image in sequence after the panchromatic pixels have been exposed; (3) regardless of whether the panchromatic pixels or color pixels are exposed first, the image sensor 10 can output the original panchromatic image and the original color image simultaneously after all pixels have been exposed. In this example, the control logic for the time-division exposure of the panchromatic pixels and the color pixels is relatively simple.

The image sensor 10 can have the functions of the simultaneous exposure of the panchromatic pixels and the color pixels as well as the time-division exposure of the panchromatic pixels and the color pixels, as illustrated in FIG. 38 and FIG. 39. The specific exposure manner of the image sensor 10 adopted during the process of capturing the image can be selected according to the actual needs. For example, in the fast-shooting, continuous-shooting and other modes, the simultaneous exposure can be adopted to meet the requirement of rapid image output; and in a normal photographing mode, the time-division exposure can be used to simplify the control logic.

In the two examples illustrated in FIG. 38 and FIG. 39, the exposure order of the panchromatic pixels and the color pixels can be controlled by the control unit 13 in the image sensor 10.

In the two examples illustrated in FIG. 38 and FIG. 39, the exposure time of the panchromatic pixels can be controlled by the first exposure signal, and the exposure time of the color pixels can be controlled by the second exposure signal.

Specifically, in conjunction with FIG. 16, as an example, the image sensor 10 can use the first exposure signal to control at least two adjacent panchromatic pixels in the first diagonal direction to be exposed for the first exposure time, and use the second exposure signal to control at least two adjacent color pixels in the second diagonal direction to be exposed for the second exposure time, where the first exposure time may be shorter than or equal to the second exposure time. Specifically, the vertical drive unit 12 in the image sensor 10 transmits the first exposure signal via the first exposure control line TX1, so as to control the at least two adjacent panchromatic pixels in the first diagonal direction to be exposed for the first exposure time, and the vertical drive unit 12 transmits the second exposure signal via the second exposure control line TX2, so as to control the at least two adjacent color pixels in the second diagonal direction to be exposed for the second exposure time. After all the panchromatic pixels and all the color pixels are exposed, as illustrated in FIG. 36, the image sensor 10 directly outputs the original panchromatic image and the original color image, instead of fitting the pixel values of the panchromatic pixels to the pixel values of the color pixels.

In conjunction with FIG. 2 and FIG. 17, as another example, the image sensor 10 can use the first exposure signal to control the panchromatic pixels in the (2n−1)-th and 2n-th rows to be exposed for the first exposure time, and use the second exposure signal to control the color pixels in the (2n−1)-th and 2n-th rows to be exposed for the second exposure time, where the first exposure time may be shorter than or equal to the second exposure time. Specifically, the first exposure control line TX1 in the image sensor 10 is connected to the control terminals TG of all the panchromatic pixels in the (2n−1)-th and 2n-th rows, and the second exposure control line TX2 is connected to the control terminals TG of all colored pixels in the (2n−1)-th and 2n-th rows. The vertical drive unit 12 transmits the first exposure signal via the first exposure control line TX1, so as to control the panchromatic pixels in the (2n−1)-th and 2n-th rows to be exposed for the first exposure time, and the vertical drive unit 12 transmits the second exposure signal via the second exposure control line TX2, so as to control the color pixels in the (2n−1)-th and 2n-th rows to be exposed for the second exposure time. After all the panchromatic pixels and all color pixels have been exposed, as illustrated in FIG. 36, the image sensor 10 directly outputs the original panchromatic image and the original color image, instead of fitting the pixel values of the panchromatic pixels to the pixel values of the color pixels.

In some embodiments, based on ambient brightness, the processing chip 20 can determine a relative relation between the first exposure time and the second exposure time. For example, the image sensor 10 can control the exposure of the panchromatic pixels and output the original panchromatic image, and the processing chip 20 analyzes the pixel values of the panchromatic pixels in the original panchromatic image to determine the ambient brightness. When the ambient brightness is smaller than or equal to a brightness threshold, the image sensor 10 controls the panchromatic pixels to be exposed for the first exposure time, which is equal to the second exposure time; and when the ambient brightness is greater than the brightness threshold, the image sensor 10 controls the panchromatic pixels to be exposed for the first exposure time, which is shorter than the second exposure time. When the ambient brightness is greater than the brightness threshold, the relative relation between the first exposure time and the second exposure time can be determined based on a brightness difference between the ambient brightness and the brightness threshold. For example, the greater the brightness difference, the smaller a ratio of the first exposure time to the second exposure time. For example, the ratio of the first exposure time to the second exposure time is V1:V2 when the brightness difference is within a first range [a, b); the ratio of the first exposure time to the second exposure time is V1:V3 when the brightness difference is within a second range [b, c); and the ratio of the first exposure time to the second exposure time is V1:V4 when the brightness difference is greater than or equal to c, where V1<V2<V3<V4.

Figure 40:
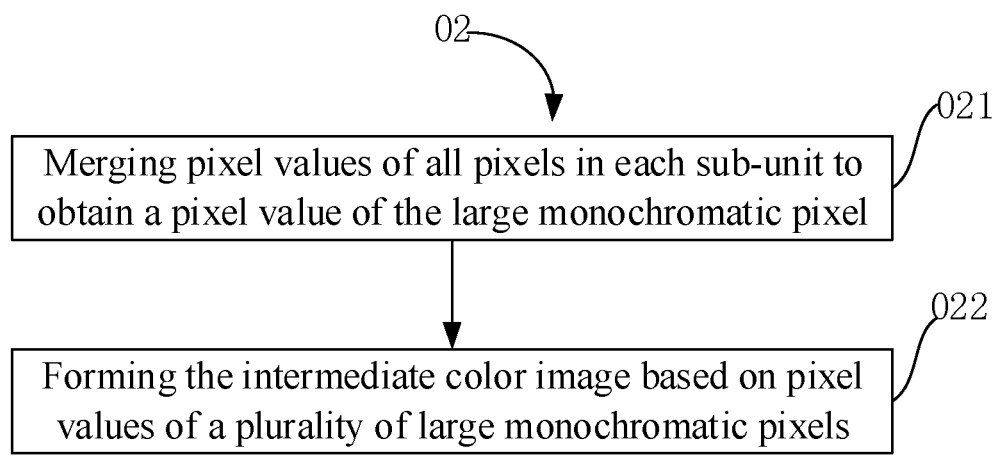

Referring to FIG. 40, in some embodiments, block 02 includes the following blocks 021 to 022.

At block 021, the pixel values of all the pixels in each sub-unit are merged to obtain a pixel value of the large monochromatic pixel.

At block 022, the intermediate color image is formed based on pixel values of a plurality of large monochromatic pixels, where the intermediate color image has a first resolution.

Referring to FIG. 33, in some embodiments, blocks 021 and 022 can be implemented by the processing chip 20. That is to say, the processing chip 20 may be configured to merge the pixel values of all the pixels in each sub-unit to obtain the pixel value of the large monochromatic pixel, and form the intermediate color image based on pixel values of a plurality of large monochromatic pixels, where the intermediate color image has a first resolution.

Specifically, as illustrated in FIG. 37, for the large monochromatic pixel A, the processing chip 20 can sum up the pixel values of all the pixels in the sub-unit including the null pixels N and the monochromatic pixels A, and determine the sum as the pixel value of the large monochromatic pixel A corresponding to the sub-unit. The pixel value of the null pixel N can be regarded as zero, which is the same below. The processing chip 20 can sum up the pixel values of all the pixels in the sub-unit including the null pixels N and the monochromatic pixels B, and determine the sum as the pixel value of the large monochromatic pixel B corresponding to the sub-unit. The processing chip 20 can sum up the pixel values of all pixels in the sub-unit including null pixels N and monochromatic pixels C, and determine the sum as the pixel value of the large monochromatic pixel C corresponding to the sub-unit. Thus, the processing chip 20 can obtain pixel values of a plurality of large monochromatic pixels A, pixel values of a plurality of large monochromatic pixels B, and pixel values of a plurality of large monochromatic pixels C. The processing chip 20 can form an intermediate color image based on the pixel values of the plurality of large monochromatic pixels A, the pixel values of the plurality of large monochromatic pixels B, and the pixel values of the plurality of large monochromatic pixels C. As illustrated in FIG. 37, when the single color A is red R, the single color B is green G, and the single color C is blue Bu, the intermediate color image is an image arranged in a Bayer array. The processing chip 20 may obtain the intermediate color image in other manners, which are not limited to the above examples.

Figure 41:
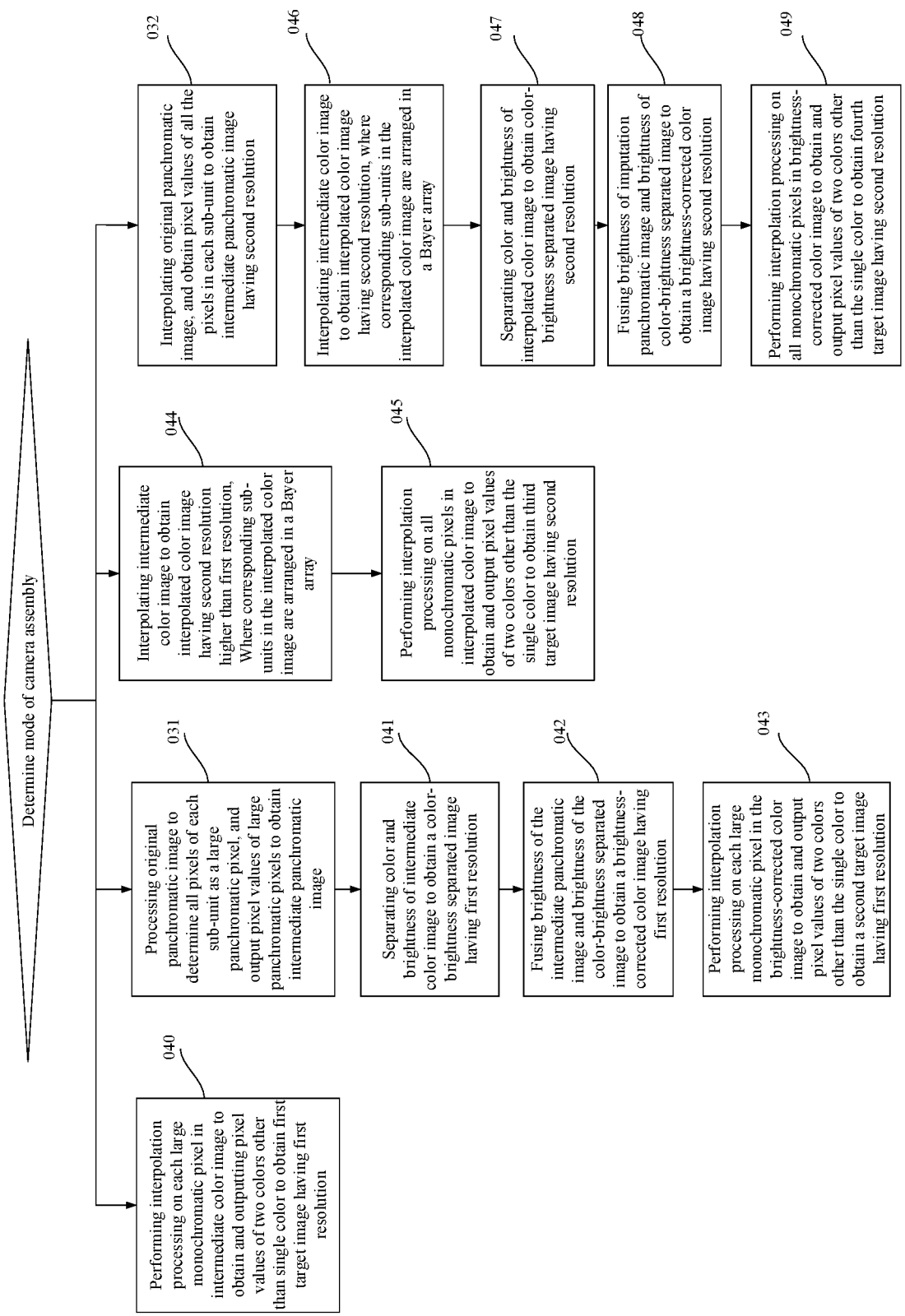

In some embodiments, in conjunction with FIG. 33 and FIG. 41, when the camera assembly 40 is in different modes, the different modes correspond to different target images. The processing chip 20 can determine the mode of the camera assembly 40, and based on the mode of the camera assembly 40, the processing chip 20 can correspondingly process the intermediate color image and/or intermediate panchromatic image to obtain the target image corresponding to the mode. The target image may be one of at least four types of target images, i.e., a first target image, a second target image, a third target image, and a fourth target image. The mode of the camera assembly 40 includes at least (1) a preview mode, in which the target image may be the first target image or the second target image; (2) an imaging mode, in which the target image may be the second target image, the third target image, or the fourth target image; (3) a preview mode plus a low power consumption mode, in which the target image is the first target image; (4) a preview mode plus a non-low power consumption mode, in which the target image is the second target image; (5) an imaging mode plus the low power consumption mode, in which the target image is the second target image or the third target image; and (6) an imaging and non-low power consumption mode, in which the target image is the fourth target image.

Referring to FIG. 41, in an example, when the target image is the first target image, block 04 includes the following block 040.

At block 040, an interpolation processing is performed on each large monochromatic pixel in the intermediate color image to obtain and output pixel values of the two colors other than the single color, so as to obtain a first target image having the first resolution.

Referring to FIG. 33, block 040 can be implemented by the processing chip 20. That is to say, the processing chip 20 may be configured to perform the interpolation processing on each large monochromatic pixel in the intermediate color image to obtain and output the pixel values of two colors other than the single color, so as to obtain the first target image having the first resolution.

Figure 42:
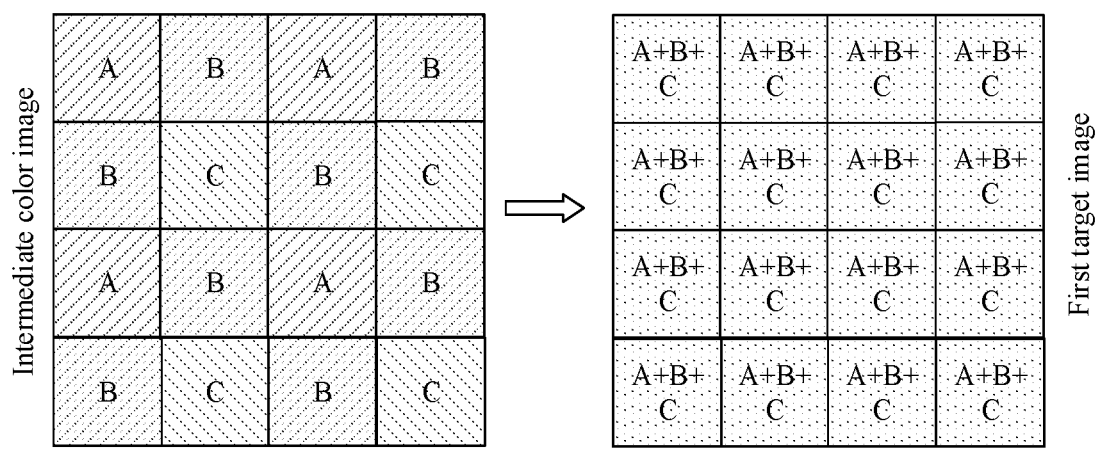
FIG. 42 is a schematic diagram illustrating yet another principle of an image capturing method in an embodiment of the present disclosure.

Specifically, in conjunction with FIG. 42, assuming that the large monochromatic pixel A is a red pixel R, the large monochromatic pixel B is a green pixel G and the large monochromatic pixel C is a blue pixel Bu, the intermediate color image is arranged in Bayer array, the processing chip 20 is required to perform a demosaicing processing (an interpolation processing) on the intermediate color image, so that a pixel value of each large monochromatic pixel has three components of R, G and B. For example, the pixel values of the pixels having the two colors other than the single color of the large monochromatic pixel can be calculated by using a linear interpolation. Take a large monochromatic pixel $C_{2,2}$ ("$C_{2,2}$" represents the pixel C in the second row and the second column from the top left) as an example, the large monochromatic pixel $C_{2,2}$ has only a pixel value $P(C_{2,2})$ of a component of a color C, such that a pixel value P ($A_{2,2}$) of a color A at the location of the large monochromatic pixel C and a pixel value P ($B_{2,2}$) of a color B at the location of the large monochromatic pixel C are required to be calculated in accordance with: $P(A_{2,2})=\alpha_1 \cdot P(A_{3,1})+\alpha_2 \cdot P(A_{3,3})+\alpha_3 \cdot P(A_{1,3})+\alpha_4 \cdot P(A_{1,1})$; and $P(B_{2,2})=\beta_1 \cdot P(B_{1,2})+\beta_2 \cdot P(B_{2,1})+\beta_3 \cdot P(B_{2,3})+\beta_4 \cdot P(B_{3,2})$, where $\alpha_1$ to $\alpha_4$ and $\beta_1$ to $\beta_4$ are interpolation coefficients, $\alpha_1+\alpha_2+\alpha_3+\alpha_4=1$, and $\beta_1+\beta_2+\beta_3+\beta_4=1$. The above calculation of P ($A_{2,2}$) and P ($B_{2,2}$) are exemplary, and P ($A_{2,2}$) and P ($B_{2,2}$) can be calculated through an interpolation other than the linear interpolation, which is not limited herein.

After the processing chip 20 calculates the pixel values of the three components of each large monochromatic pixel, a final pixel value of the corresponding large monochromatic pixel can be calculated based on the three pixel values, that is, A+B+C. It should be noted that the expression A+B+C does not mean that the three pixel values are summed up to directly obtain the final pixel value of the large monochromatic pixel, but means that the large monochromatic pixel include three color components A, B, and C. The processing chip 20 can form a first target image based on the final pixel values of the plurality of large monochromatic pixels. Since the intermediate color image has the first resolution, the first target image is obtained by performing the interpolation processing on the intermediate color image, the processing chip 20 does not interpolate the intermediate color image, and therefore, the resolution of the first target image is the first resolution. The processing chip 20 processes the intermediate color image with a relatively simple processing algorithm and with a relatively fast processing speed to obtain the first target image. The camera assembly 40 determines the first target image as the preview image when the camera assembly 40 is in the preview mode plus a low power consumption mode, which may not only satisfy the requirement of fast drawing in the preview mode, but also save the power consumption of the camera assembly 40.

Referring to FIG. 41 again, in another example, when the target image is the second target image, block 03 includes the following block 031.

At block 031, the original panchromatic image is processed to determine all the pixels of each sub-unit as a large panchromatic pixel, and a pixel value of the large panchromatic pixel is outputted to obtain an intermediate panchromatic image, where the intermediate panchromatic image has the first resolution.

Block 04 includes the following blocks 041 to 043.

At block 041, color and brightness of the intermediate color image are separated to obtain a color-light separated image having the first resolution.

At block 042, brightness of the intermediate panchromatic image and the brightness of the color-brightness separated image are fused to obtain a brightness-corrected color image having the first resolution.

At block 043, an interpolation processing is performed on each large monochromatic pixel in the brightness-corrected color image to obtain and output pixel values of two colors other than the single color to obtain a second target image having the first resolution.

Referring to FIG. 33, block 031, block 041, block 042 and block 043 can all be implemented by the processing chip 20. That is to say, the processing chip 20 can be configured to process the original panchromatic image to determine all the pixels of each sub-unit as the large panchromatic pixel, and output the pixel value of the large panchromatic pixel to obtain the intermediate panchromatic image, where the intermediate panchromatic image of has the first resolution.

The processing chip 20 can be further configured to separate the color and the brightness of the intermediate color image to obtain the color-light separated image having the first resolution, fuse the brightness of the intermediate panchromatic image and the brightness of the color-brightness separated image to obtain the brightness-corrected color image having the first resolution, and perform the interpolation processing on each large monochromatic pixel in the brightness-corrected color image to obtain and output pixel values of two colors other than the single color to obtain the second target image having the first resolution.

Figure 43:
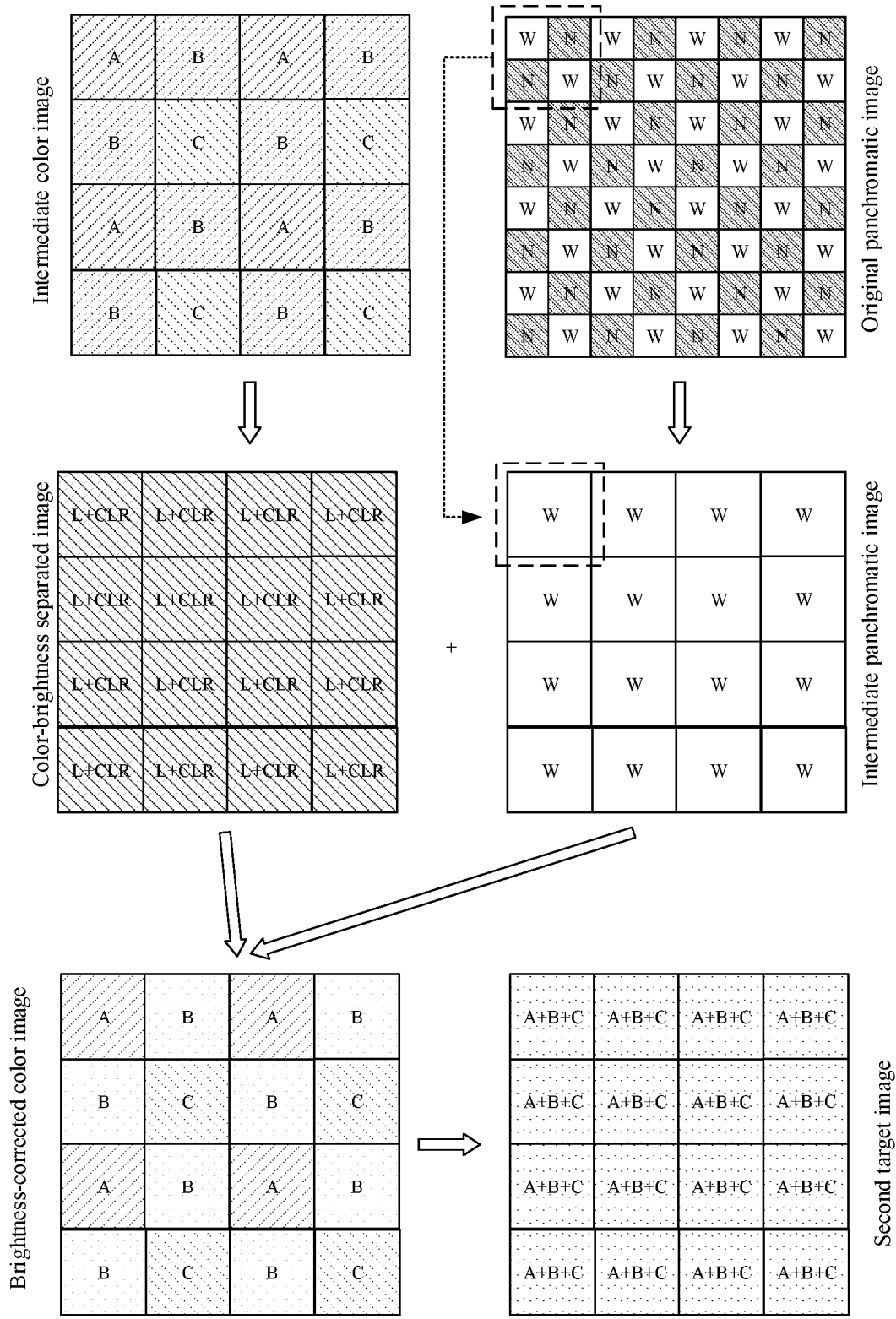
FIG. 43 is a schematic diagram illustrating yet another principle of an image capturing method in an embodiment of the present disclosure.

Specifically, the original panchromatic image can be converted into the intermediate panchromatic image as illustrated in FIG. 43. As illustrated in FIG. 43, the original panchromatic image includes a plurality of sub-units, and each sub-unit includes two null pixels N and two panchromatic pixels W. The processing chip 20 can determine all the pixels in each sub-unit including the null pixels N and the panchromatic pixels W as a large panchromatic pixel W corresponding to this sub-unit. Thus, the processing chip 20 can form the intermediate panchromatic image based on a plurality of large panchromatic pixels W. If an original panchromatic image including a plurality of null pixels N is regarded as an image having the second resolution, the intermediate panchromatic image obtained as illustrated in FIG. 43 is an image having the first resolution, where the first resolution is smaller than the second resolution.

As an example, the processing chip 20 can determine all the pixels of each sub-unit in the original panchromatic image as the large panchromatic pixel W corresponding to the sub-unit in such a manner that the processing chip 20 merges the pixel values of all the pixels in each sub-unit to obtain the pixel value of the large panchromatic pixel W, and then forms the intermediate panchromatic image based on the pixel values of the plurality of large panchromatic pixels W. Specifically, for each large panchromatic pixel, the processing chip 20 can sum up all the pixel values in the sub-unit including the null pixels N and the panchromatic pixels W, and determine the sum as the pixel value of the large panchromatic pixel W corresponding to the sub-unit, where the pixel value of the null pixel N can be regarded as zero. Thus, the processing chip 20 can obtain the pixel values of the plurality of large panchromatic pixels W.

After the processing chip 20 obtains the intermediate panchromatic image and the intermediate color image, the processing chip 20 fuse the intermediate panchromatic image and the intermediate color image to obtain the second target image.

In an example as illustrated in FIG. 43, the processing chip 20 separates the color and the brightness of the intermediate color image to obtain the color-bright separated image. Further, in the color-bright separated image illustrated in FIG. 43, L represents the brightness, and CLR represents the color. Specifically, assuming that the monochromatic pixel A is the red pixel R, the monochromatic pixel B is the green pixel G, the monochromatic pixel C is the blue pixel Bu, then: (1) the processing chip 20 can convert the intermediate color image in RGB space into the color-brightness separated image in YCrCb space, where Y in YCrCb represents the brightness L in the color-brightness separated image, Cr and Cb in YCrCb are the color CLR in the color-brightness separated image; (2) the processing chip 20 can convert the intermediate color image in RGB space into a color-brightness separated image in Lab space, where L in Lab represents the brightness L in the color-brightness separated image, and a and b in Lab represent the color CLR in the color-brightness separated image. It should be noted that L+CLR in the color-brightness separated image illustrated in FIG. 43 does not mean that the pixel value of each pixel is a sum of L and CLR, but means that the pixel value of each pixel is made up of L and CLR.

Further, the processing chip 20 fuses the brightness of the color-brightness separated image and the brightness of the intermediate panchromatic image. For example, the pixel value of each panchromatic pixel W in the intermediate panchromatic image is the brightness value for each panchromatic pixel, and the processing chip 20 can sum up L of each pixel in the color-brightness separated image and W of the panchromatic pixel at the corresponding location in the intermediate panchromatic image, to obtain the pixel value after the brightness correction. The processing chip 20 can form a color-brightness separated image obtained after the brightness correction based on the brightness-corrected pixel values and then convert the color-brightness separated image obtained after the brightness correction into the brightness-corrected color image by using a color space conversion.

When the large monochromatic pixel A is the red pixel R, the large monochromatic pixel B is the green pixel G, the large monochromatic pixel C is the blue pixel Bu, the brightness-corrected color image is an image arranged in a Bayer array, and the processing chip 20 is required to perform an interpolation processing on the brightness-corrected color image to enable a pixel value of each large monochromatic pixel after the brightness correction to have three components R, G and B. The processing chip 20 can perform the interpolation processing on the brightness-corrected color image to obtain the second target image, for example, the processing chip 20 can obtain the second target image by using the linear interpolation. The linear interpolation process here is similar to the interpolation process in block 040, which will not be repeatedly described herein.

The brightness-corrected color image has the first resolution, the second target image is obtained by performing the interpolation processing on the brightness-corrected color image, and the processing chip 20 does not interpolate the brightness-corrected color image, so that the resolution of the second target image is the first resolution. Since the second target image is obtained by fusing the brightness of the intermediate color image and the brightness of the intermediate panchromatic image, the second target image has a better imaging effect. The preview effect of the preview image can be improved by using the second target image as the preview image when the mode is the preview mode and the non-low power consumption mode. In the imaging mode plus the low power consumption mode, since the second target image is obtained without interpolating, by using the second target image as the image provided to the user, the power consumption of the camera assembly 40 can be lowered to a certain extent and the use requirements in the low power consumption mode can also be satisfied. In the meantime, as the second target image is relatively bright, the user's requirements on the brightness of the target image can be satisfied.

Referring to FIG. 41 again, in another example, when the target image is the third target image, block 04 includes the following blocks 044 to 045.

At block 044, the intermediate color image is interpolated to obtain an interpolated color image having a second resolution, where corresponding sub-units in the interpolated color image are arranged in a Bayer array, and the second resolution is higher than the first resolution.

At block 045, an interpolation processing is performed on all monochromatic pixels in the interpolated color image to obtain and output pixel values of two colors other than the single color to obtain a third target image having the second resolution.

Referring to FIG. 33, block 044 and block 045 can be implemented by the processing chip 20. That is to say, the processing chip 20 can be configured to interpolate the intermediate color image to obtain the interpolated color image having the second resolution, where the corresponding sub-units in the interpolated color image are arranged in the Bayer array, and the second resolution is higher than the first resolution. The processing chip 20 can be further configured to perform the interpolation processing on all the monochromatic pixels in the interpolated color image to obtain and output the pixel values of two colors other than the single color to obtain the third target image having the second resolution.

Figure 44:
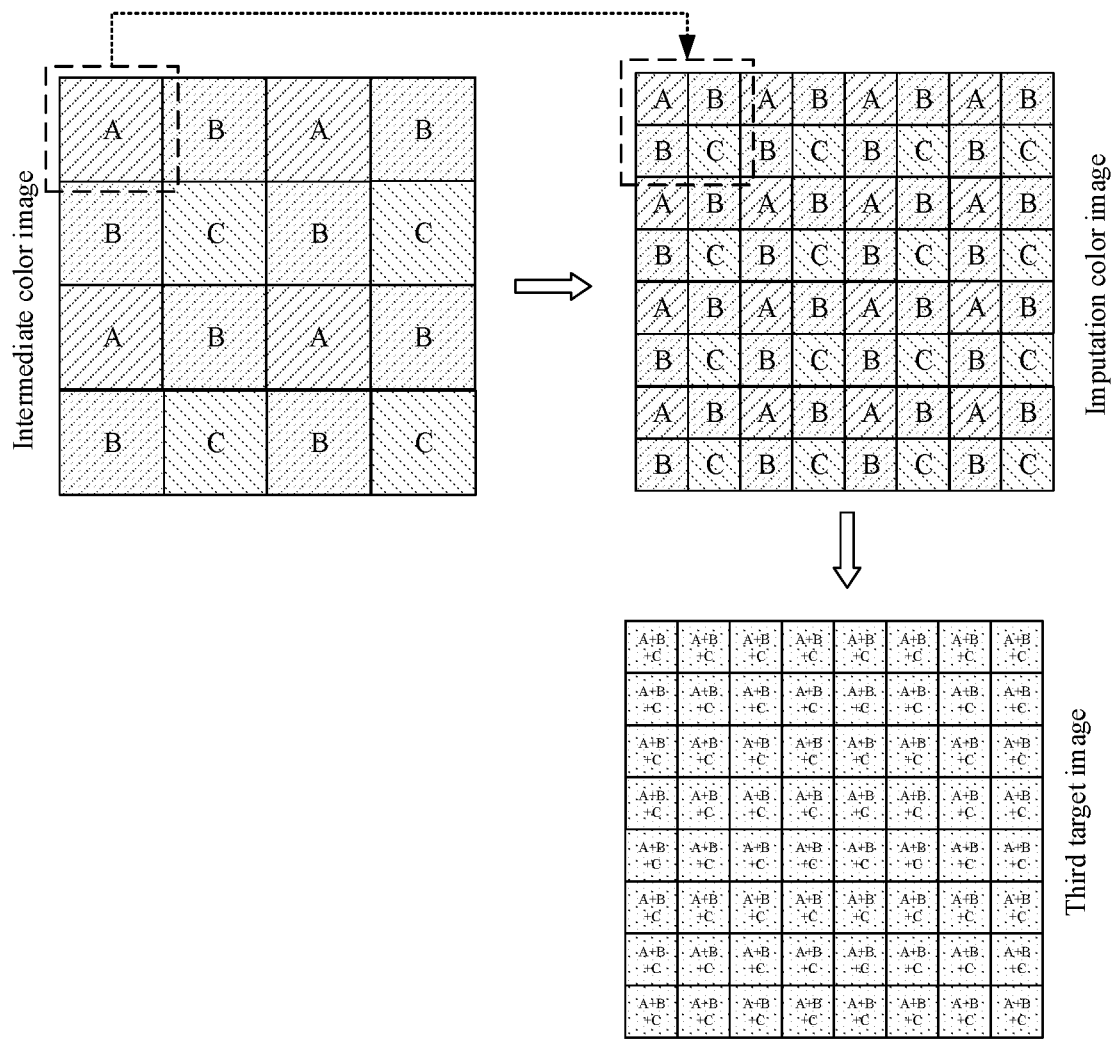
FIG. 44 is a schematic diagram illustrating yet another principle of an image capturing method in an embodiment of the present disclosure.

Specifically, in conjunction with FIG. 44, the processing chip 20 divides each large monochromatic pixel in the intermediate color image into four color pixels, and the four color pixels form a sub-unit in the interpolated color image. Each sub-unit includes color pixels with three colors which are one color pixel A, two color pixels B, and one color pixel C. When the color pixel A is the red pixel R, the color pixel B is the green pixel G, and the color pixel C is the blue pixel Bu, the color pixels in each sub-unit are arranged in a Bayer array. Thus, the interpolated color image including the sub-units is an image arranged in a Bayer array. The processing chip 20 can perform the interpolation processing on the interpolated color image to obtain the third target image. For example, the second target image can be obtained by using the linear interpolation. The linear interpolation process is similar to the interpolation process described in the above block 040, which is not repeatedly described herein. The third target image is obtained by interpolating, and the resolution of the third target image (i.e., the second resolution) is greater than the resolution of the intermediate color image (i.e., the first resolution). In the preview mode plus a non-low power consumption mode, a clearer preview image can be obtained by using the third target image as the preview image. In the imaging and low power mode, since the brightness fusing with the intermediate panchromatic image is not required in the process of generating the third target image, by using the third target image as the image provided to the user, the power consumption of the camera assembly 40 can be lowered to a certain extent, and the user's requirements on clarity of the captured images can also be satisfied.

Referring to FIG. 41 again, in another example, when the target image is the fourth target image, block 03 includes the following block 0332.

At block 032, the original panchromatic image is interpolated to obtain pixel values of all pixels in each sub-unit, so as to obtain an intermediate panchromatic image having a second resolution.

Block 04 includes blocks 046 to 049.

At block 046, the intermediate color image is interpolated to obtain an interpolated color image having the second resolution, where corresponding sub-units in the interpolated color image are arranged in a Bayer array, and the second resolution is higher than the first resolution.

At block 047, color and brightness of the interpolated color image are separated to obtain a color-brightness separated image having the second resolution.

At block 048, brightness of the interpolated panchromatic image and brightness of the color-brightness separated image are fused to obtain a brightness-corrected color image having the second resolution.

At block 049, an interpolation processing is performed on all monochromatic pixels in the brightness-corrected color image to obtain and output pixel values of two colors other than the single color to obtain a fourth target image having the second resolution.

Referring to FIG. 33, block 032, block 046, block 047, block 048 and block 049 can all be implemented by the processing chip 20. That is to say, the processing chip 20 can be configured to interpolate the original panchromatic image to obtain the pixel values of all the pixels in each sub-unit, so as to obtain the intermediate panchromatic image having the second resolution. The processing chip 20 can be further configured to interpolate the intermediate color image to obtain the interpolated color image having the second resolution, where the corresponding sub-units in the interpolated color image are arranged in a Bayer array, and the second resolution is higher than the first resolution. The processing chip 20 can be further configured to separate the color and the brightness of the interpolated color image to obtain the color-brightness separated image having the second resolution, fuse the brightness of the interpolated panchromatic image and the brightness of the color-brightness separated image to obtain the brightness-corrected color image having the second resolution, and perform the interpolation processing on all the monochromatic pixels in the brightness-corrected color image to obtain and output the pixel values of two colors other than the single color to obtain the fourth target image having the second resolution.

Figure 46:
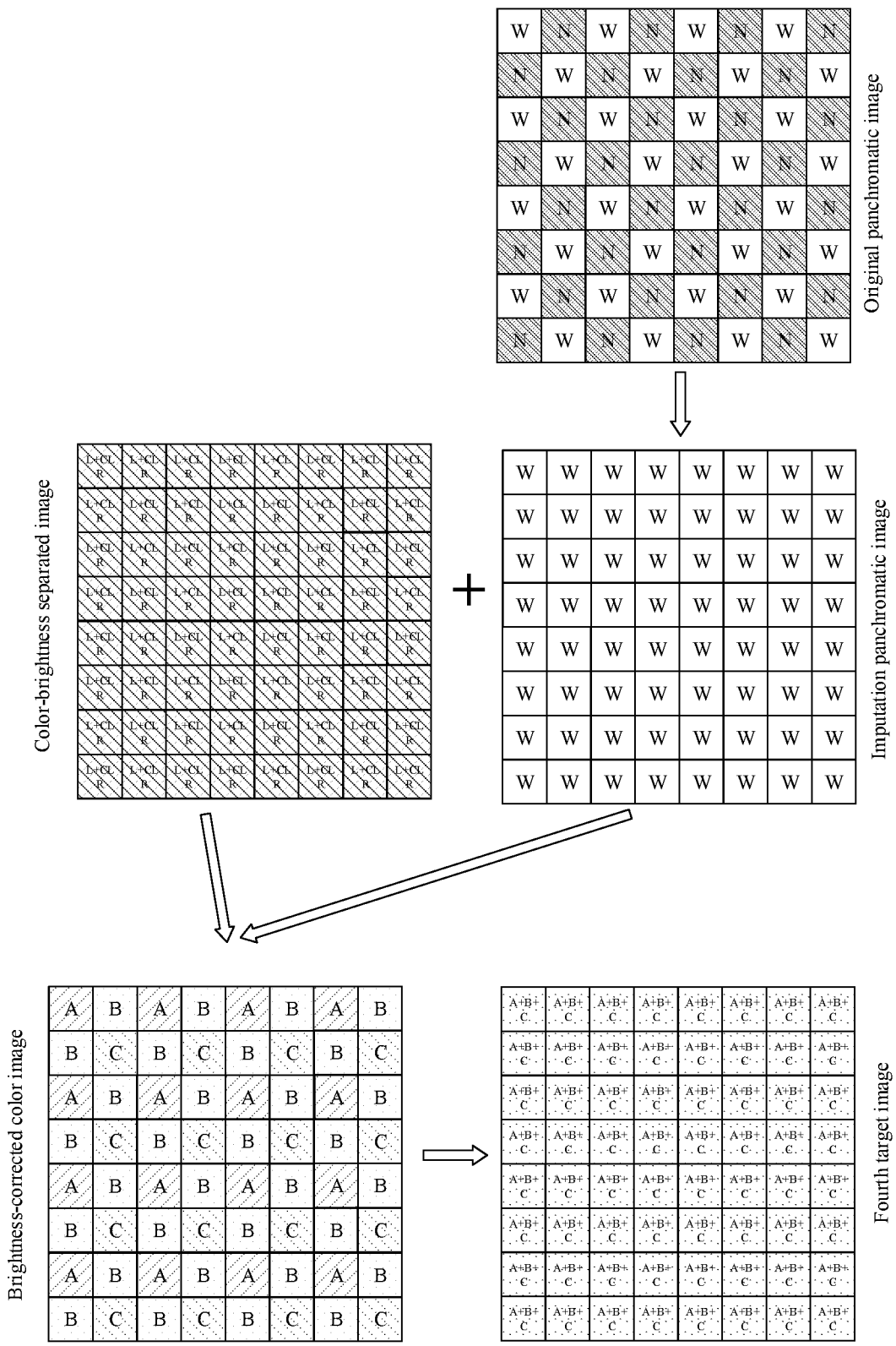
FIG. 46 is a schematic diagram illustrating yet another principle of an image capturing method in an embodiment of the present disclosure.

Specifically, the processing chip 20 interpolates the original panchromatic image having the first resolution to obtain the intermediate panchromatic image having the second resolution. In conjunction with FIG. 46, the original panchromatic image includes a plurality of sub-units, each sub-unit includes two null pixels N and two panchromatic pixels W. The processing chip 20 is required to replace each null pixel N in each sub-unit with a panchromatic pixel W, and calculates the pixel value of each replaced panchromatic pixel W at the position of the null pixel N. For each null pixel N, the processing chip 20 replaces the null pixel N with a panchromatic pixel W, and determines a pixel value of the replaced panchromatic pixel W based on pixel values of other panchromatic pixels W adjacent to the replaced panchromatic pixel W. Referring to FIG. 46, taking the null pixel $N_{1,8}$ in the original panchromatic image ("null pixel $N_{1,8}$" is the null pixel N in the first row and eighth column from the top left, the same applies below) as an example, the null pixel $N_{1,8}$ is replaced with the panchromatic pixel $W_{1,8}$, and the pixels adjacent to the panchromatic pixel $W_{1,8}$ are the panchromatic pixel $W_{1,7}$ and the panchromatic pixel $W_{2,8}$ in the original panchromatic image. As an example, an average of the pixel value of the panchromatic pixel $W_{1,7}$ and the pixel value of the panchromatic pixel $W_{2,8}$ can be determined as the pixel value of the panchromatic pixel $W_{1,8}$. As another example, the null pixel $N_{2,3}$ in the original panchromatic image as illustrated in FIG. 46 is replaced with the panchromatic pixel $W_{2,3}$, and the pixels adjacent to the panchromatic pixel $W_{2,3}$ are the panchromatic pixel $W_{1,3}$, the panchromatic pixel $W_{2,2}$, the panchromatic pixels $W_{2,4}$, and the panchromatic pixel $W_{3,3}$ in the original panchromatic image, and thus, for example, the processing chip 20 determines an average of the pixel value of the panchromatic pixel $W_{1,3}$, the pixel value of the panchromatic pixel $W_{2,2}$, the pixel value of the panchromatic pixel $W_{2,4}$, and the pixel value of the panchromatic pixel $W_{3,3}$ as the pixel value of the replaced panchromatic pixel $W_{2,3}$.

After the processing chip 20 obtains the intermediate panchromatic image and the intermediate color image, the processing chip 20 can fuse the intermediate panchromatic image and the intermediate color image to obtain the fourth target image.

Figure 45:
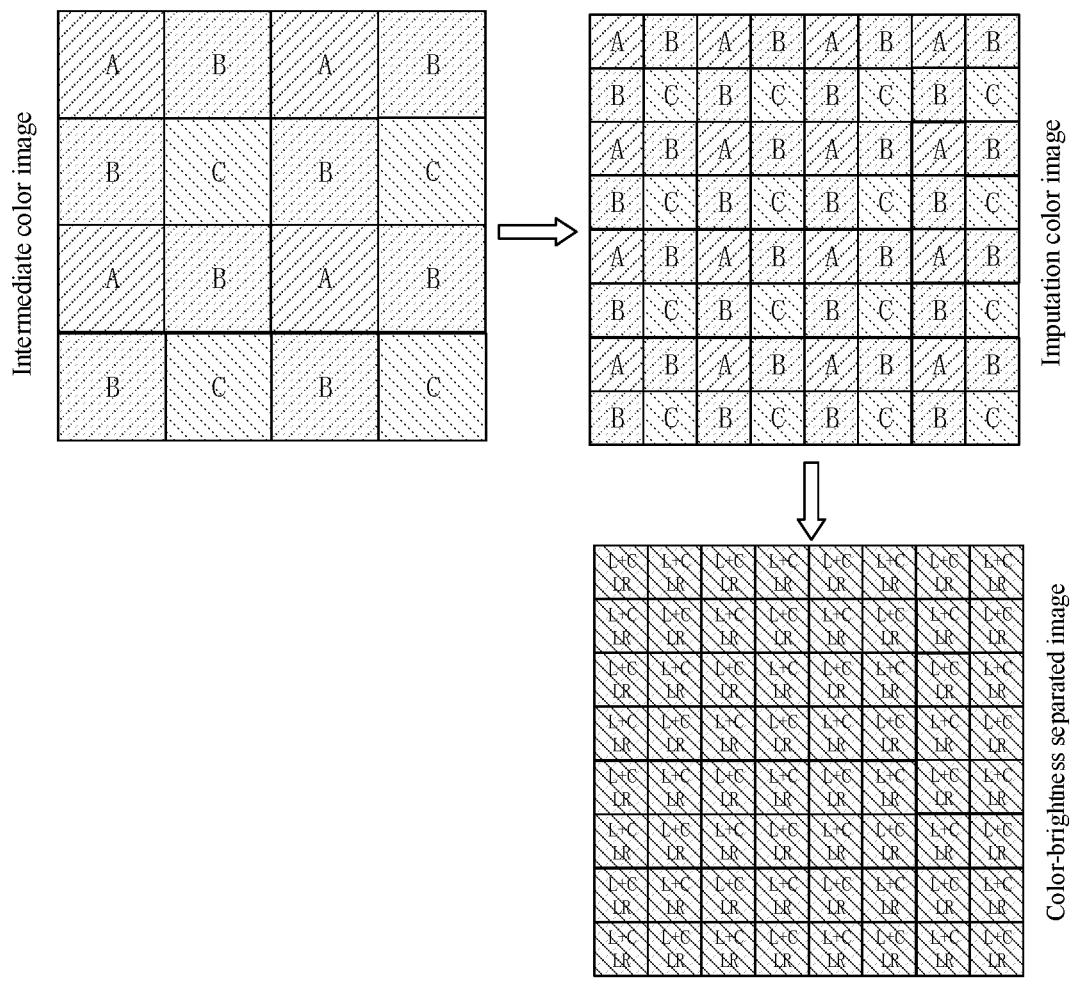
FIG. 45 is a schematic diagram illustrating yet another principle of an image capturing method in an embodiment of the present disclosure.

The processing chip 20 can interpolate the intermediate color image having the first resolution to obtain the interpolated color image having the second resolution, as illustrated in FIG. 45. The specific imputation method is similar to that described in block 045, which is not repeated herein.

Subsequently, as illustrated in FIG. 45, the processing chip 20 can separate the color and the brightness of the interpolated color image to obtain the color-brightness separated image. In the color-brightness separated image in FIG. 45, L represents the brightness, and CLR represents the color. Specifically, assuming that the monochromatic pixel A is the red pixel R, the monochromatic pixel B is the green pixel G, the monochromatic pixel C is the blue pixel Bu, then: (1) the processing chip 20 can convert the interpolated color image in RGB space into the color-brightness separated image in YCrCb space, where Y in YCrCb represents the brightness L in the color-brightness separated image, and Cr and Cb in CrCbCr represent the color CLR in the color-brightness separated images; or (2) the processing chip 20 can convert the interpolated color image in RGB space into the color-brightness separated image in Lab space, where L in Lab represents the brightness L in the color-brightness separated image, a and b in Lab represent the color CLR in the color-brightness separated image. It should be noted that L+CLR in the color-brightness separated image illustrated in FIG. 45 does not mean that the pixel value of each pixel is a sum of L and CLR, but means that the pixel value of each pixel is made up of L and CLR.

As illustrated in FIG. 46, the processing chip 20 can fuse the brightness of the color-brightness separated image and the brightness of the intermediate panchromatic image. For example, the pixel value of each panchromatic pixel W in the intermediate panchromatic image is the brightness value for each panchromatic pixel, and the processing chip 20 can sum up L of each pixel in the color-brightness separated image and W of the panchromatic pixel at the corresponding position in the intermediate panchromatic image to obtain the brightness-corrected pixel value. The processing chip 20 forms a color-brightness separated image obtained after the brightness correction based on the brightness-corrected pixel values, and then convert the color-brightness separated image obtained after the brightness correction into the brightness-corrected color image, where the brightness-corrected color image has the second resolution.

When the color pixel A is the red pixel R, the color pixel B is the green pixel G, the color pixel C is the blue pixel Bu, and the brightness-corrected color image is arranged in a Bayer array, the processing chip 20 is required to perform the interpolation processing on the brightness-corrected color image to enable the pixel value of each color pixel after the brightness correction to have three components R, G, B. The processing chip 20 can perform the interpolation processing on the brightness-corrected color image to obtain the fourth target image. For example, the fourth target image can be obtained by using the linear interpolation. The linear interpolation process here is similar to the interpolation process described in block 040, which will not be repeated herein.

The fourth target image is obtained by fusing the brightness of the intermediate color image and the brightness of the intermediate panchromatic image, and the fourth target image has a relatively great resolution, such that the fourth target image has higher brightness and clarity. In the imaging and non-low power consumption mode, the fourth target image is determined as the image provided to the user to meet the user's quality requirements on the captured images.

In some embodiments, the image capturing method may further include obtaining ambient brightness, which can be implemented by the processing chip 20. The specific implementation is as described above and will not be repeated herein. When the ambient brightness is greater than a brightness threshold, the first target image or the third target image is determined as the target image; and when the ambient brightness is smaller than or equal to the brightness threshold, the second target image or the fourth target image is determined as the target image. It can be understood, when the ambient brightness is relatively high, the brightness of the first target image and the second target image obtained based on the intermediate color image alone is sufficient to meet the user's requirements on the brightness of the target image, without requiring to fuse the brightness of the intermediate panchromatic image to increase the brightness of the target image. In this way, not only the computation burden of the processing chip 20 can be reduced, but also the power consumption of the camera assembly 40 can be reduced. When the ambient brightness is relatively low, the brightness of the first target image and the second target image obtained based on the intermediate color image alone may not meet the user's requirement on the brightness of the target image, and thus the second target image or the fourth target image obtained by fusing with the brightness of the intermediate panchromatic image can be used as the target image to increase the brightness of the target image.

Referring to FIG. 47, the present disclosure further provides a mobile terminal 90. The mobile terminal 90 can be a mobile phone, a tablet, a laptop, a smart wearable device (such as a smart watch, a smart bracelet, a pair of smart glasses, a smart helmet, etc.), a head display device, a virtual reality device, etc., which is not limited herein.

The mobile terminal 90 includes an image sensor 50, a processor 60, a memory 70, and a housing 80. The image sensor 50, the processor 60, and the memory 70 are installed in the housing 80. The image sensor 50 is connected to the processor 60. The image sensor 50 may be the image sensor 10 as described in any of the above embodiments (as illustrated in FIG. 33). The processor 60 can exert the same functions as the processing chip 20 in the camera assembly 40 (as illustrated in FIG. 33). In other words, the processor 60 can achieve the functions of the processing chip 20 described in any one of the above embodiments. The memory 70 is connected to the processor 60, and the memory 70 can store the data processed by the processor 60, such as the target images. The processor 60 and the image sensor 50 can be mounted on a same substrate, and in this case, the image sensor 50 and the processor 60 can be regarded as a camera assembly 40. The processor 60 may be mounted on a substrate different from that of the image sensor 50.

In the specification, the description of the reference terms "an embodiment," "some embodiments," "an exemplary embodiment," "an example," "a specific example," or "some examples" means that specific features, structures, materials, or characteristics described in conjunction with the embodiment or example are included in at least one embodiment or example of the present disclosure. In the specification, the exemplary description of the above terms does not necessarily refer to the same embodiment or example. Moreover, the specific features, structures, materials, or characteristics described can be combined in any one or more embodiments or examples in an appropriate manner. In addition, those skilled in the art can combine and integrate different embodiments or examples, or features thereof, as described in the present disclosure, unless they contradict each other.

Any process or method described in the flowchart or described otherwise herein can be understood as a module, segment or part of codes that include one or more executable instructions for implementing steps of specific logical functions or processes. It can be appreciated by those skilled in the art that the scope of the preferred embodiments of the present disclosure covers additional implementations where functions may not be performed in the same order as illustrated or discussed, including implementations where the involved functions are performed substantially in parallel or even in a reverse order.

It can be appreciated that the embodiments of the present disclosure illustrated and described above are exemplary only, and should not be construed as limiting the present disclosure. Those skilled in the art can make various changes, modifications, replacements and variants to the above embodiments without departing from the scope of the present disclosure.

What is claimed is:

1. An image sensor, comprising:
    panchromatic pixels; and
    color pixels each having a narrower spectral response and a greater conversion gain than the panchromatic pixels, the conversion gain of each of the panchromatic pixels and the color pixels being in negative correlation with a capacitance value of an additional capacitor of the pixel;
    wherein each of the panchromatic pixels comprises a first additional capacitor connected to a floating diffusion unit of the panchromatic pixel, and each of the color pixels comprises no additional capacitor;
    or,
    wherein each of the panchromatic pixels comprises a first additional capacitor connected to a floating diffusion unit of the panchromatic pixel, each of the color pixels comprises a second additional capacitor connected to a floating diffusion unit of the color pixel, the capacitance value of the first additional capacitor of each of the panchromatic pixels is larger than the capacitance value of the second additional capacitor of each of the color pixels.

2. The image sensor according to claim 1, wherein each of the panchromatic pixels and the color pixels further comprises:
    a photoelectric conversion element; and
    an exposure control circuit connected to the photoelectric conversion element and the floating diffusion unit.

3. The image sensor according to claim 2, wherein each of the panchromatic pixels further comprises a first switch circuit connected between the floating diffusion unit and the first additional capacitor of the panchromatic pixel, and each of the color pixels further comprises a second switch circuit connected between the floating diffusion unit and the second additional capacitor of the color pixel;
    wherein when it is detected that an ambient brightness is higher than a brightness threshold, each first switch circuit is configured to be switched on to connect the first additional capacitor with the floating diffusion unit of the respective panchromatic pixel; and
    wherein when it is detected that the ambient brightness is lower than the brightness threshold, each first switch circuit is configured to be switched off to disconnect the first additional capacitor from the floating diffusion unit of the respective panchromatic pixel, and each second switch circuit is configured to be switched off to disconnect the second additional capacitor from the floating diffusion unit of the respective color pixel.

4. The image sensor according to claim 1, wherein the panchromatic pixels have a greater full-well capacity than the color pixels,
    wherein each of the panchromatic pixels and the color pixels comprises a photoelectric conversion element, and the photoelectric conversion element comprises a substrate and an n-potential well layer formed within the substrate.

5. The image sensor according to claim 4, wherein a cross-section of the n-potential well layer of each of the panchromatic pixels has a same size as a cross-section of the n-potential well layer of each of the color pixels, and the n-potential well layer of each of the panchromatic pixels has a greater depth than the n-potential well layer of each of the color pixels; or
    wherein the cross-section of the n-potential well layer of each of the panchromatic pixels has a greater size than the cross-section of the n-potential well layer of each of the color pixels, and the n-potential well layer of each of the panchromatic pixels has a greater depth than or a same depth as the n-potential well layer of each of the color pixels.

6. The image sensor according to claim 5, wherein sizes of the cross-sections of the n-potential well layer of each of the panchromatic pixels and the color pixels are equal along a light-receiving direction of the image sensor.

7. The image sensor according to claim 5, wherein along a light-receiving direction of the image sensor, sizes of the cross-sections of the n-potential well layer of each of the panchromatic pixels gradually increase; sizes of the cross-sections of the n-potential well layer of each of the color pixels gradually decrease; and the smallest cross-section of the n-potential well layer of each of the panchromatic pixels has a greater size than or a same size as the largest cross-section of the n-potential well layer of each of the color pixels.

8. The image sensor according to claim 1, wherein each of the panchromatic pixels and the color pixels comprises a microlens, a filter, an isolation layer, and a photoelectric conversion element that are arranged in sequence along a light-receiving direction of the image sensor.

9. The image sensor according to claim 8, wherein each of the panchromatic pixels and the color pixels further comprises a light-guiding layer formed within the isolation layer and having a greater refractive index than the isolation layer.

10. The image sensor according to claim 8, wherein each of the panchromatic pixels and the color pixels further comprises a condenser lens arranged in the isolation layer.

11. The image sensor according to claim 1, further comprising a barrier layer arranged between photoelectric conversion elements of two adjacent pixels of the panchromatic pixels and the color pixels.

12. The image sensor according to claim 1, wherein the panchromatic pixels and the color pixels are arranged in a two-dimensional pixel array comprising minimum repeating units,
    wherein in each of the minimum repeating units, the panchromatic pixels are arranged in a first diagonal direction, and the color pixels are arranged in a second diagonal direction, the first diagonal direction being different from the second diagonal direction, and
    wherein first exposure time of at least two adjacent panchromatic pixels in the first diagonal direction is controlled by a first exposure signal, second exposure time of at least two adjacent color pixels in the second diagonal direction is controlled by a second exposure signal, and the first exposure time is shorter than the second exposure time.

13. The image sensor according to claim 12, further comprising:
a first exposure control line electrically connected to a control terminal of an exposure control circuit in each of the at least two adjacent panchromatic pixels in the first diagonal direction; and
a second exposure control line electrically connected to a control terminal of an exposure control circuit in each of the at least two adjacent color pixels in the second diagonal direction,
wherein the first exposure signal is transmitted via the first exposure control line, and the second exposure signal is transmitted via the second exposure control line.

14. The image sensor according to claim 13, wherein the first exposure control line has a "W" shape and is electrically connected to the control terminal of the exposure control circuit in each of the panchromatic pixels in two adjacent rows of the two-dimensional pixel array; and
wherein the second exposure control line has a "W" shape and is electrically connected to the control terminal of an exposure control circuit in each of the color pixels in two adjacent rows.

15. The image sensor according to claim 13, wherein the exposure control circuit is electrically connected to a photoelectric conversion element and configured to transfer an electric potential accumulated at the photoelectric conversion element after being irradiated, and
wherein the exposure control circuit is a transfer transistor, and the control terminal of the exposure control circuit is a gate of the transfer transistor.

16. The image sensor according to claim 12, wherein each of the minimum repeating units comprises 16 pixels arranged in 4 rows and 4 columns as follows:
WAWB
AWBW
WBWC
BWCW,
where W represents the panchromatic pixel;
A represents a first color pixel of the color pixels;
B represents a second color pixel of the color pixels; and
C represents a third color pixel of the color pixels.

17. The image sensor according to claim 12, wherein each of the minimum repeating units comprises 16 pixels arranged in 4 rows and 4 columns as follows:
AWB W
WAWB
BWCW
WBWC
where W represents the panchromatic pixel;
A represents a first color pixel of the color pixels;
B represents a second color pixel of the color pixels; and
C represents a third color pixel of the color pixels.

18. The image sensor according to claim 12, wherein a response band of the panchromatic pixels is a visible light band; or a response band of the panchromatic pixels is a visible light band and a near-infrared band that match a response band of a photoelectric conversion element in the image sensor.

19. A camera assembly, comprising an image sensor, the image sensor comprising:
panchromatic pixels; and
color pixels each having a narrower spectral response and a greater conversion gain than the panchromatic pixels, the conversion gain of each of the panchromatic pixels and the color pixels being in negative correlation with a capacitance value of an additional capacitor of the pixel;
wherein each of the panchromatic pixels comprises a first additional capacitor connected to a floating diffusion unit of the panchromatic pixel, and each of the color pixels comprises no additional capacitor;
or,
wherein each of the panchromatic pixels comprises a first additional capacitor connected to a floating diffusion unit of the panchromatic pixel, each of the color pixels comprises a second additional capacitor connected to a floating diffusion unit of the color pixel, the capacitance value of the first additional capacitor of each of the panchromatic pixels is larger than the capacitance value of the second additional capacitor of each of the color pixels.

20. A mobile terminal, comprising:
a housing; and
an image sensor mounted in the housing,
wherein the image sensor comprises:
panchromatic pixels; and
color pixels each having a narrower spectral response and a greater conversion gain than the panchromatic pixels, the conversion gain of each of the panchromatic pixels and the color pixels being in negative correlation with a capacitance value of an additional capacitor of the pixel;
wherein each of the panchromatic pixels comprises a first additional capacitor connected to a floating diffusion unit of the panchromatic pixel, and each of the color pixels comprises no additional capacitor;
or,
wherein each of the panchromatic pixels comprises a first additional capacitor connected to a floating diffusion unit of the panchromatic pixel, each of the color pixels comprises a second additional capacitor connected to a floating diffusion unit of the color pixel, the capacitance value of the first additional capacitor of each of the panchromatic pixels is larger than the capacitance value of the second additional capacitor of each of the color pixels.

* * * * *